United States Patent
Umezawa

(10) Patent No.: US 11,495,303 B2
(45) Date of Patent: Nov. 8, 2022

(54) SEMICONDUCTOR MEMORY DEVICE

(71) Applicant: Kioxia Corporation, Tokyo (JP)

(72) Inventor: Yusuke Umezawa, Yokohama (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/348,098

(22) Filed: Jun. 15, 2021

(65) Prior Publication Data

US 2022/0199168 A1  Jun. 23, 2022

(30) Foreign Application Priority Data

Dec. 17, 2020 (JP) .............................. JP2020-209393

(51) Int. Cl.
| | |
|---|---|
| *G11C 16/26* | (2006.01) |
| *G11C 16/04* | (2006.01) |
| *H01L 27/11582* | (2017.01) |
| *H01L 27/11556* | (2017.01) |

(52) U.S. Cl.
CPC .......... *G11C 16/26* (2013.01); *G11C 16/0483* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 8,054,683 B2 | 11/2011 | Tanaka et al. | |
| 8,395,922 B2 | 3/2013 | Noguchi et al. | |
| 10,269,828 B2 | 4/2019 | Futatsuyama et al. | |
| 2010/0020608 A1* | 1/2010 | Kamigaichi | G11C 5/063 365/185.05 |

FOREIGN PATENT DOCUMENTS

| | | |
|---|---|---|
| JP | 2011-216837 A | 10/2011 |
| JP | 5214393 B2 | 6/2013 |
| JP | 2018-164070 A | 10/2018 |

* cited by examiner

*Primary Examiner* — Tan T. Nguyen
(74) *Attorney, Agent, or Firm* — Oblon, McClelland, Maier & Neustadt, L.L.P.

(57) ABSTRACT

A semiconductor memory device includes a first conductive layer, a first and a second semiconductor layer opposed to the first conductive layer, a first and a second electric charge accumulating portion disposed between the first conductive layer and the first and the second semiconductor layer, and a first and a second bit line electrically connected to the first and the second semiconductor layer. A distance from a center position of the first conductive layer to the second semiconductor layer is smaller than a distance from the center position of the first conductive layer to the first semiconductor layer. When a read operation is executed on a first memory cell including the first electric charge accumulating portion and a second memory cell including the second electric charge accumulating portion, a voltage of the second bit line is larger than a voltage of the first bit line.

20 Claims, 36 Drawing Sheets

SEMICONDUCTOR MEMORY DEVICE

CROSS-REFERENCE TO RELATED APPLICATIONS

This application is based upon and claims the benefit of Japanese Patent Application No. 2020-209393, filed on Dec. 17, 2020, the entire contents of which are incorporated herein by reference.

BACKGROUND

Field

Embodiments described herein relate generally to a semiconductor memory device.

Description of the Related Art

There has been known a semiconductor memory device including a plurality of conductive layers arranged in a first direction, semiconductor layers extending in the first direction and opposed to the plurality of conductive layers, and electric charge accumulating layers disposed between the conductive layers and the semiconductor layers.

DETAILED DESCRIPTION

Figure 1:
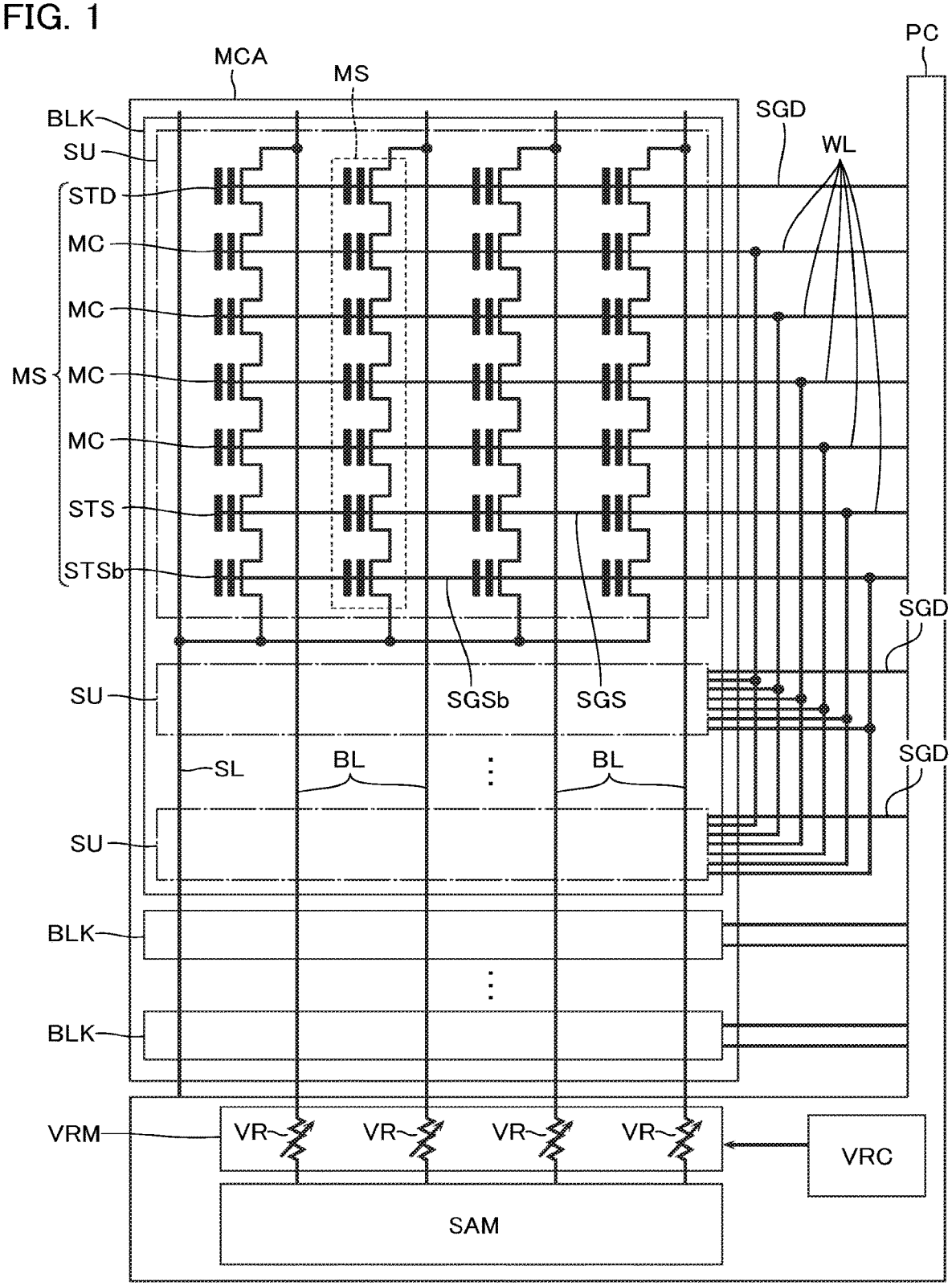
FIG. 1 is a schematic circuit diagram illustrating a configuration of a part of a semiconductor memory device according to a first embodiment.

A semiconductor memory device according to one embodiment comprises: a plurality of conductive layers that are arranged in a first direction and include a first conductive layer; a first semiconductor layer that extends in the first direction and is opposed to the plurality of conductive layers; a first electric charge accumulating portion disposed between the first conductive layer and the first semiconductor layer; a second semiconductor layer that extends in the first direction and is opposed to the plurality of conductive layers; a second electric charge accumulating portion disposed between the first conductive layer and the second semiconductor layer; a first bit line that extends in a second direction intersecting with the first direction and is electrically connected to the first semiconductor layer; and a second bit line that extends in the second direction and is electrically connected to the second semiconductor layer. A distance from a center position in the second direction of the first conductive layer to the first semiconductor layer is assumed to be a first distance, and a distance from the center position in the second direction of the first conductive layer to the second semiconductor layer is assumed to be a second distance, the second distance is smaller than the first distance. When a read operation is executed on a first memory cell including the first electric charge accumulating portion and a second memory cell including the second electric charge accumulating portion, a voltage of the first bit line is assumed to be a first voltage, and a voltage of the second bit line is assumed to be a second voltage, the second voltage is larger than the first voltage.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

FIG. 1 is a schematic circuit diagram illustrating a configuration of a part of a semiconductor memory device according to a first embodiment.

As illustrated in FIG. 1, the semiconductor memory device according to the first embodiment includes a memory cell array MCA and a peripheral circuit PC.

As illustrated in FIG. 1, the memory cell array MCA includes a plurality of memory blocks BLK. The plurality of memory blocks BLK each include a plurality of string units SU. The plurality of string units SU each include a plurality of memory strings MS. The plurality of memory strings MS have one ends each connected to the peripheral circuit PC via bit lines BL. The plurality of memory strings MS have the other ends each connected to the peripheral circuit PC via a common source line SL.

The memory string MS includes a drain-side select transistor STD, a plurality of memory cells MC (memory transistors), a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor. The memory cell MC includes a semiconductor layer, a gate insulating film, and a gate electrode. The semiconductor layer functions as a channel region. The gate insulating film includes an electric charge accumulating portion. The memory cell MC has a threshold voltage that changes according to an electric charge amount in the electric charge accumulating portion. The memory cell MC stores data of one bit or a plurality of bits. Word lines WL are connected to the respective gate electrodes of the plurality of memory cells MC corresponding to one memory string MS. These respective word lines WL are connected to all of the memory strings MS in one memory block BLK in common.

The select transistor (STD, STS, STSb) is a field-effect type transistor. The select transistor (STD, STS, STSb) includes a semiconductor layer, a gate insulating film, and a gate electrode. The semiconductor layer functions as a channel region. The select gate lines (SGD, SGS, SGSb) are connected to the respective gate electrodes of the select transistors (STD, STS, STSb). One drain-side select gate line SGD is connected to all of the memory strings MS in one string unit SU in common. One source-side select gate line SGS is connected to all of the memory strings MS in one memory block BLK in common. One source-side select gate line SGSb is connected to all of the memory strings MS in one memory block BLK in common.

The peripheral circuit PC includes a sense amplifier module SAM, a variable resistor module VRM, and a variable resistor control circuit VRC.

Figure 2:
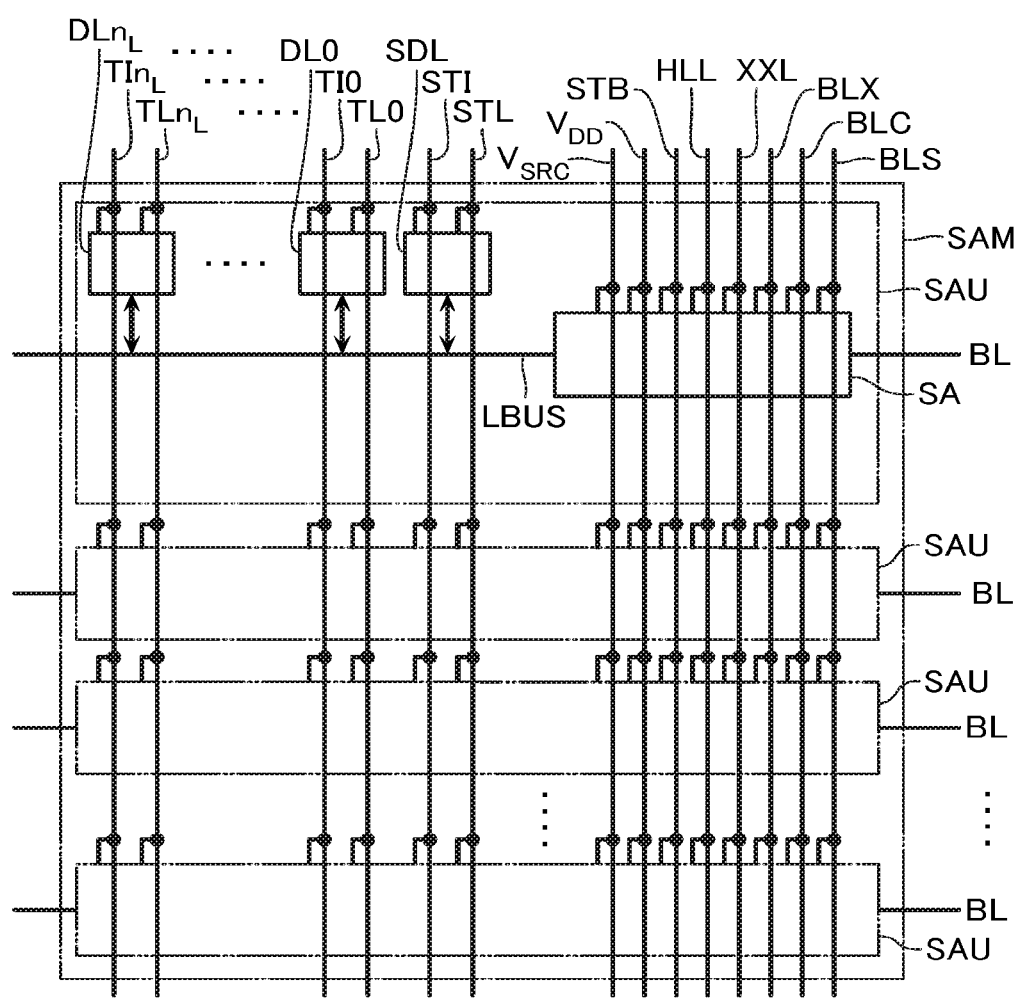
FIG. 2 is a schematic circuit diagram illustrating a configuration of a part of the semiconductor memory device.

The sense amplifier module SAM includes, for example, as illustrated in FIG. 2, a plurality of sense amplifier units SAU. The plurality of sense amplifier units SAU are each electrically connected to one bit line BL. The sense amplifier unit SAU includes a sense amplifier SA, a wiring LBUS, and latch circuits SDL, DL0 to $DLn_L$ ($n_L$ is a natural number).

Figure 3:
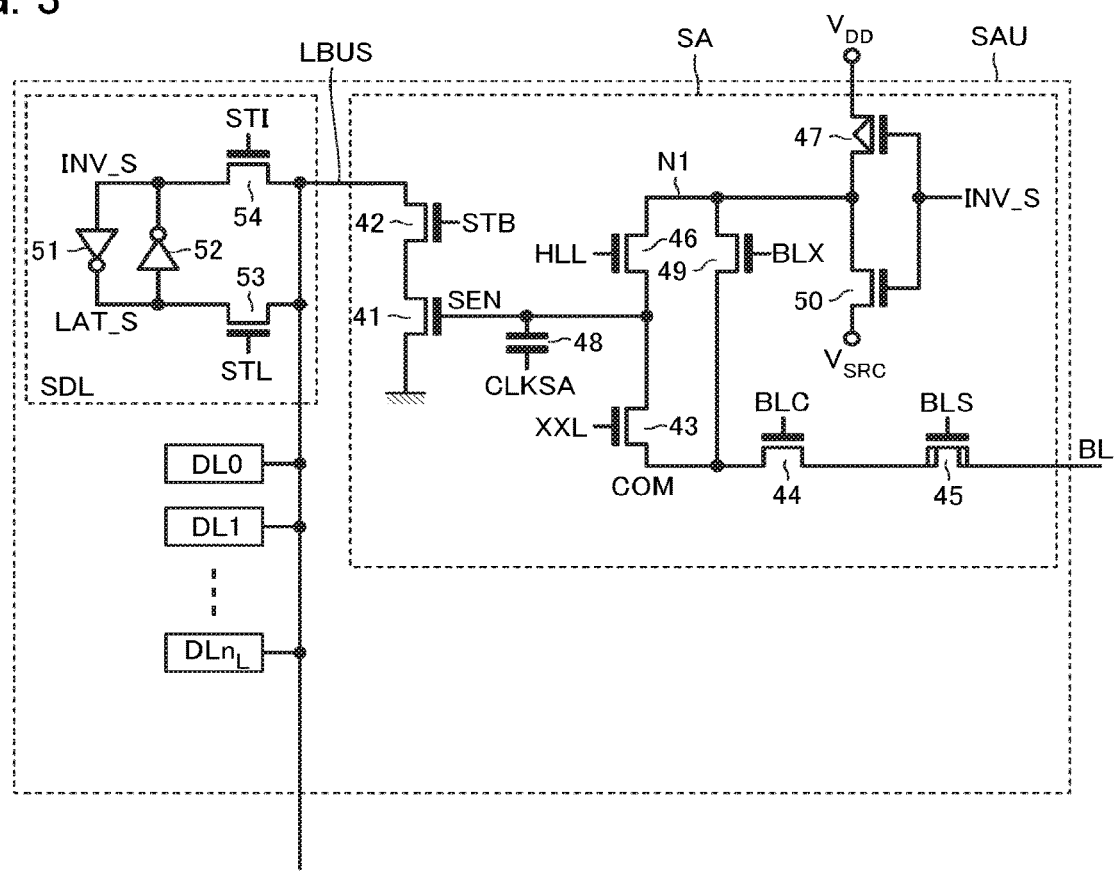
FIG. 3 is a schematic circuit diagram illustrating a configuration of a part of the semiconductor memory device.

The sense amplifier SA includes a sense transistor 41 as illustrated in FIG. 3. The sense transistor 41 discharges electric charge of the wiring LBUS in accordance with a current flown in the bit line BL. A source electrode of the sense transistor 41 is connected to the voltage supply line to which the ground voltage $V_{SS}$ is supplied. A drain electrode is connected to the wiring LBUS via a switch transistor 42. A gate electrode is connected to the bit line BL via a sense node SEN, a discharge transistor 43, a node COM, a clamp transistor 44, and a high voltage transistor 45. Note that the sense node SEN is connected an internal control signal line CLKSA via a capacitor 48.

The sense amplifier SA includes a voltage transfer circuit. The voltage transfer circuit selectively electrically conducts the node COM and the sense node SEN with a voltage supply line to which a voltage $V_{DD}$ is supplied or a voltage supply line to which a voltage $V_{SRC}$ is supplied in accordance with data latched by the latch circuit SDL. The voltage transfer circuit includes a node N1, a charge transistor 46, a charge transistor 49, a charge transistor 47, and a discharge transistor 50. The charge transistor 46 is disposed in a current path between the node N1 and the sense node SEN. The charge transistor 49 is disposed in a current path between the node N1 and the node COM. The charge transistor 47 is disposed in a current path between the node N1 and the voltage supply line to which the voltage $V_{DD}$ is supplied. The discharge transistor 50 is disposed in a current path between the node N1 and the voltage supply line to which the voltage $V_{SRC}$ is supplied. Note that gate electrodes of the charge transistor 47 and the discharge transistor 50 are connected to a node INV_S of the latch circuit SDL in common.

Note that the sense transistor 41, the switch transistor 42, the discharge transistor 43, the clamp transistor 44, the charge transistor 46, the charge transistor 49, and the discharge transistor 50 are, for example, enhancement type NMOS transistors. The high voltage transistor 45 is, for example, a depletion type NMOS transistor. The charge transistor 47 is, for example, a PMOS transistor.

A gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the high voltage transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, and BLX are connected to, for example, a sequencer (not illustrated).

The latch circuit SDL includes nodes LAT_S and INV_S, an inverter 51, an inverter 52, a switch transistor 53, and a switch transistor 54. The inverter 51 includes an output terminal connected to the node LAT_S and an input terminal connected to the node INV_S. The inverter 52 includes an input terminal connected to the node LAT_S and an output terminal connected to the node INV_S. The switch transistor 53 is disposed in a current path between the node LAT_S and the wiring LBUS. The switch transistor 54 is disposed in a current path between the node INV_S and the wiring LBUS. The switch transistors 53 and 54 are, for example, NMOS transistors. A gate electrode of the switch transistor 53 is, for example, connected to a sequencer (not illustrated) via a signal line STL. A gate electrode of the switch transistor 54 is, for example, connected to a sequencer (not illustrated) via a signal line STI.

The latch circuits DL0 to $DLn_L$ are configured approximately similarly to the latch circuit SDL. However, as described above, the node INV_S of the latch circuit SDL is electrically conducted with the gate electrodes of the charge transistor 47 and the discharge transistor 50 in the sense amplifier SA. The latch circuits DL0 to $DLn_L$ are different from the latch circuit SDL in this respect.

Note that, as illustrated in FIG. 2, the above-described signal lines STB, HLL, XXL, BLX, BLC, and BLS are each connected to the plurality of sense amplifier units SAU included in the sense amplifier module SAM in common. The voltage supply line to which the voltage $V_{DD}$ is supplied and the voltage supply line to which the voltage $V_{SRC}$ is supplied, described above, are also each connected to the plurality of sense amplifier units SAU included in the sense amplifier module SAM in common. The signal line STI and the signal line STL of the latch circuit SDL are also each connected to the plurality of sense amplifier units SAU included in the sense amplifier module SAM in common. Similarly, signal lines TI0 to $TIn_L$, TL0 to $TLn_L$ corresponding to the signal line STI and the signal line STL in the latch circuits DL0 to $DLn_L$ are each connected to the plurality of sense amplifier units SAU included in the sense amplifier module SAM in common.

The variable resistor module VRM (FIG. 1) includes a plurality of variable resistor circuits VR. The plurality of variable resistor circuits VR are electrically connected to the respective bit lines BL. Note that the plurality of variable resistor circuits VR may be, for example, disposed in a current path between the bit line BL and the sense amplifier module SAM, or may be disposed within the sense amplifier module SAM. The variable resistor circuit VR may include a part of the configuration of the sense amplifier SA (FIG. 3).

The variable resistor control circuit VRC (FIG. 1) outputs a signal for adjusting a resistance value to each of the variable resistor circuits VR in the variable resistor module VRM. The configuration in the variable resistor control circuit VRC is adjustable as necessary corresponding to the configuration in the variable resistor module VRM.

Figure 4:
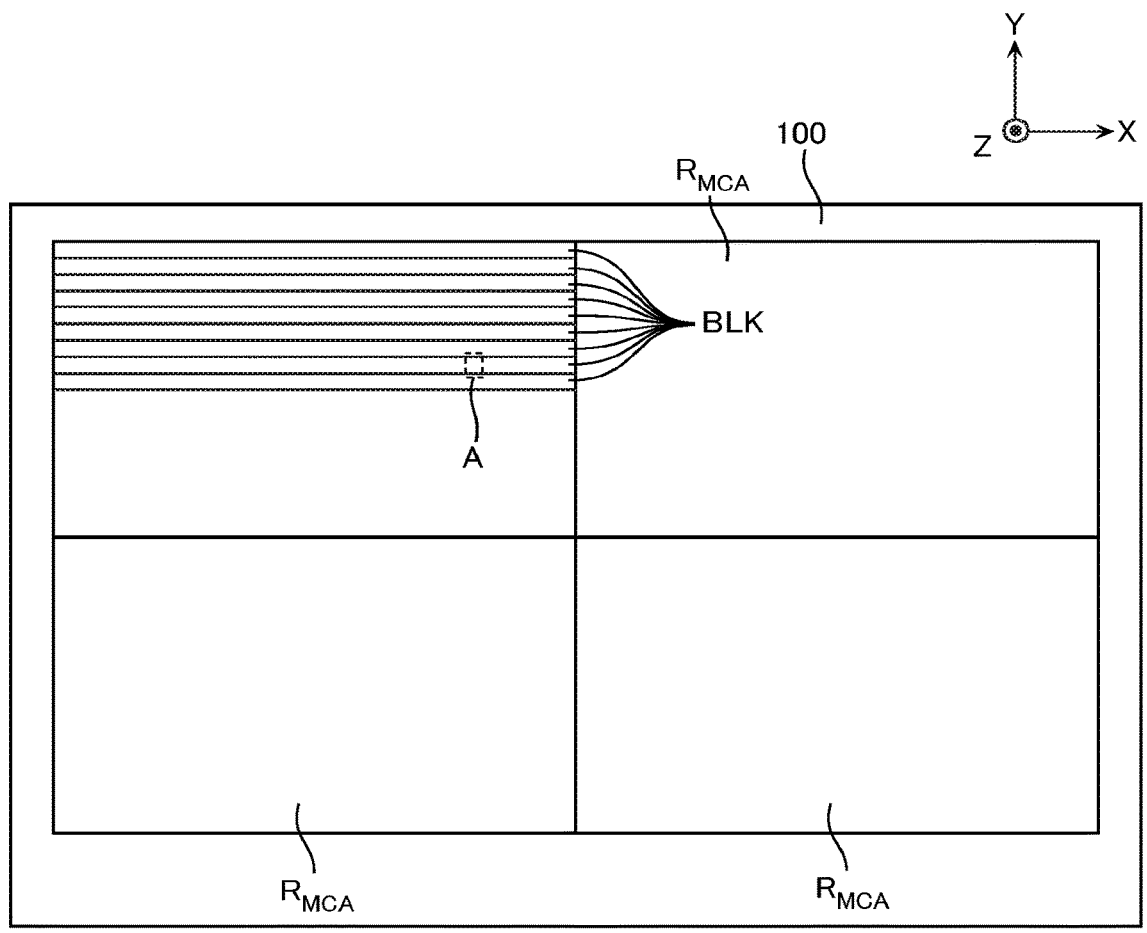
FIG. 4 is a schematic plan view illustrating a configuration of a part of the semiconductor memory device.
Figure 5:
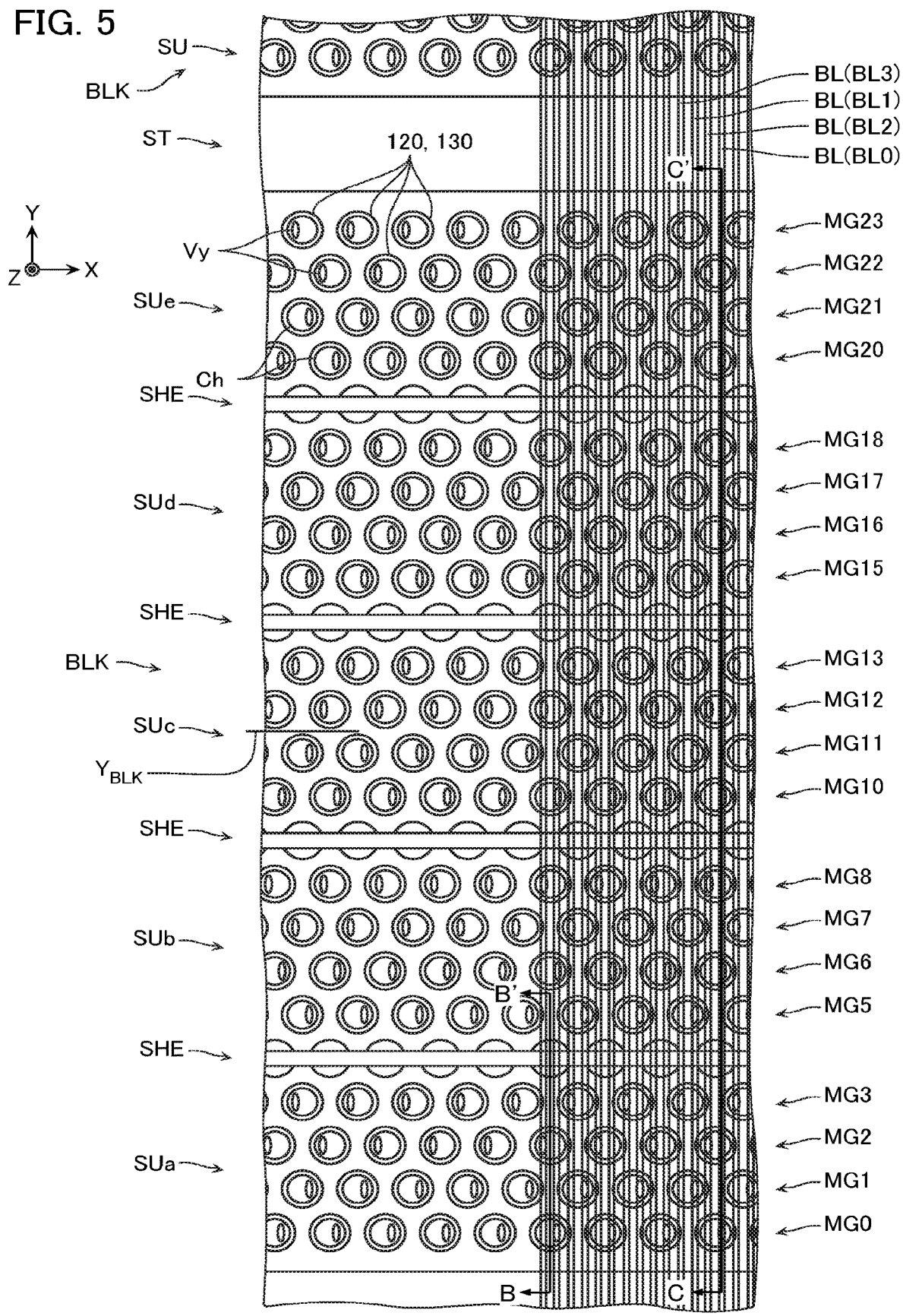
FIG. 5 is a schematic enlarged view of a part indicated by A in FIG. 4.
Figure 6:
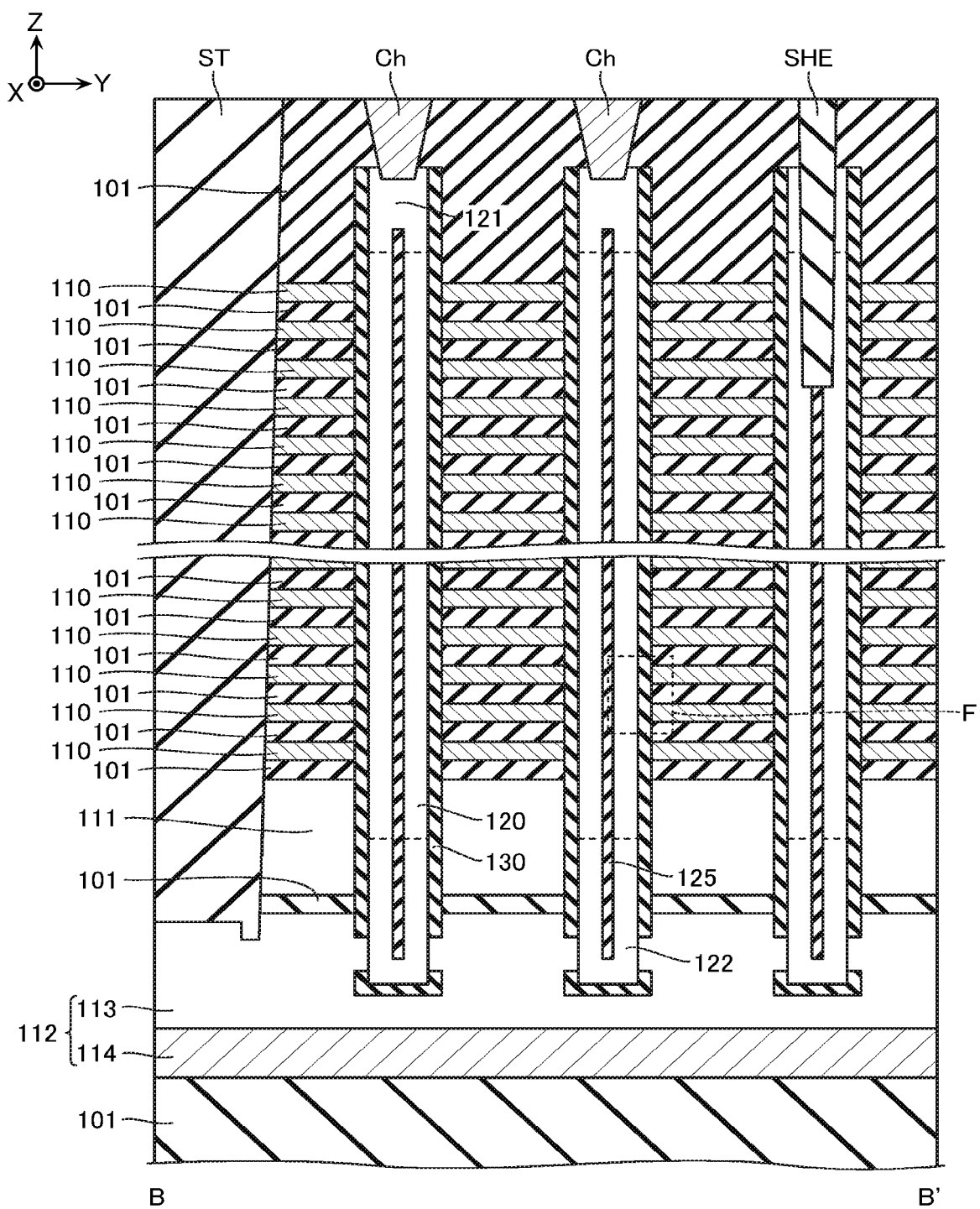
FIG. 6 is a schematic cross-sectional view of a structure illustrated in FIG. 5 taken along the line B-B' and viewed along the arrow direction.
Figure 7:
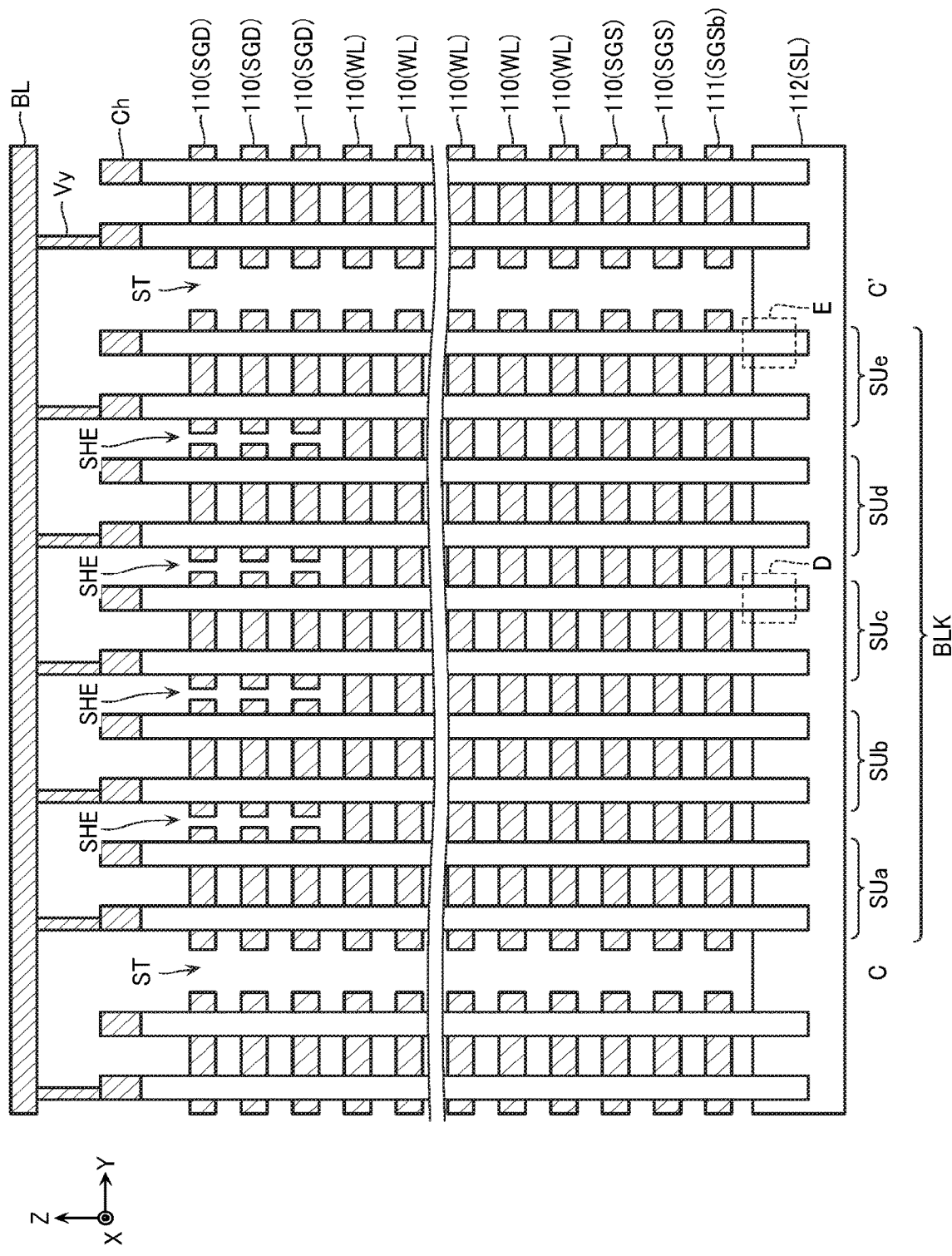
FIG. 7 is a schematic cross-sectional view of a structure illustrated in FIG. 5 taken along the line C-C' and viewed along the arrow direction.
Figure 8:
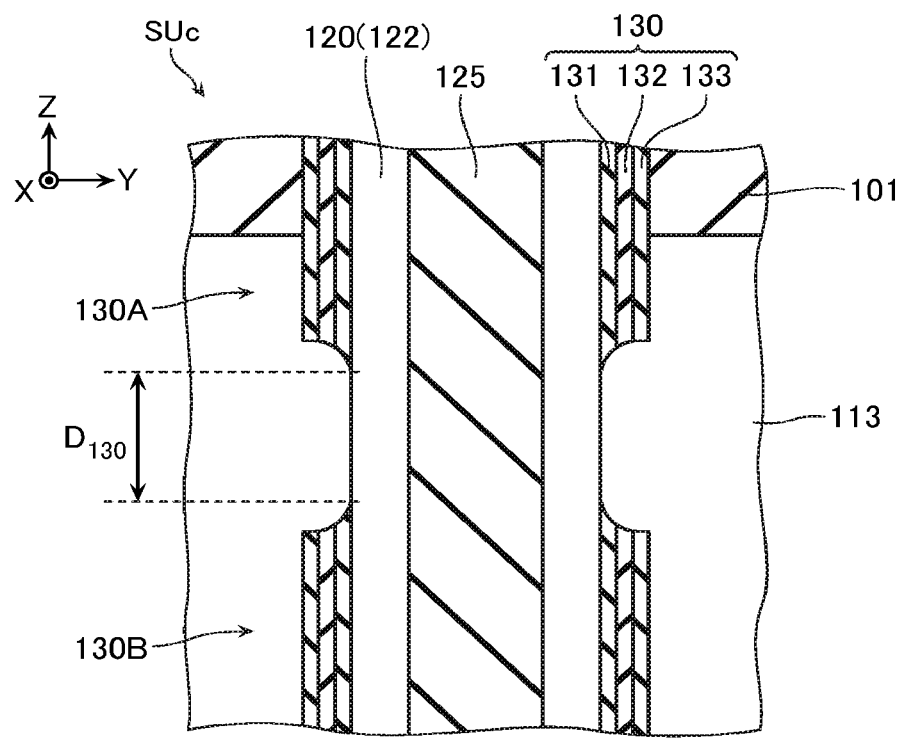
FIG. 8 is a schematic enlarged view of a part indicated by D in FIG. 7.
Figure 9:
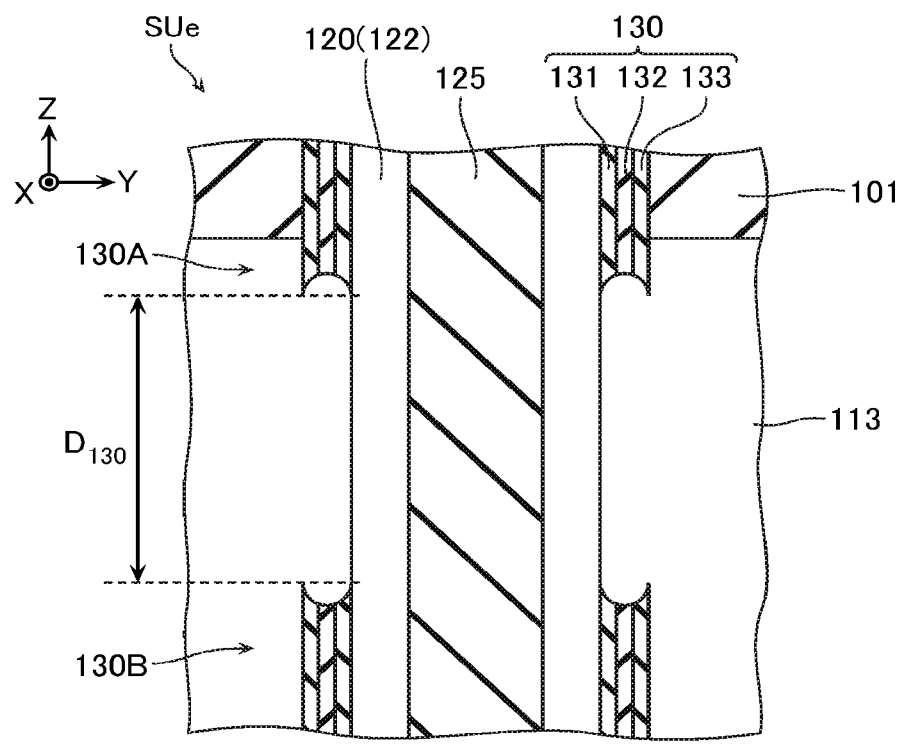
FIG. 9 is a schematic enlarged view of a part indicated by E in FIG. 7.
Figure 10:
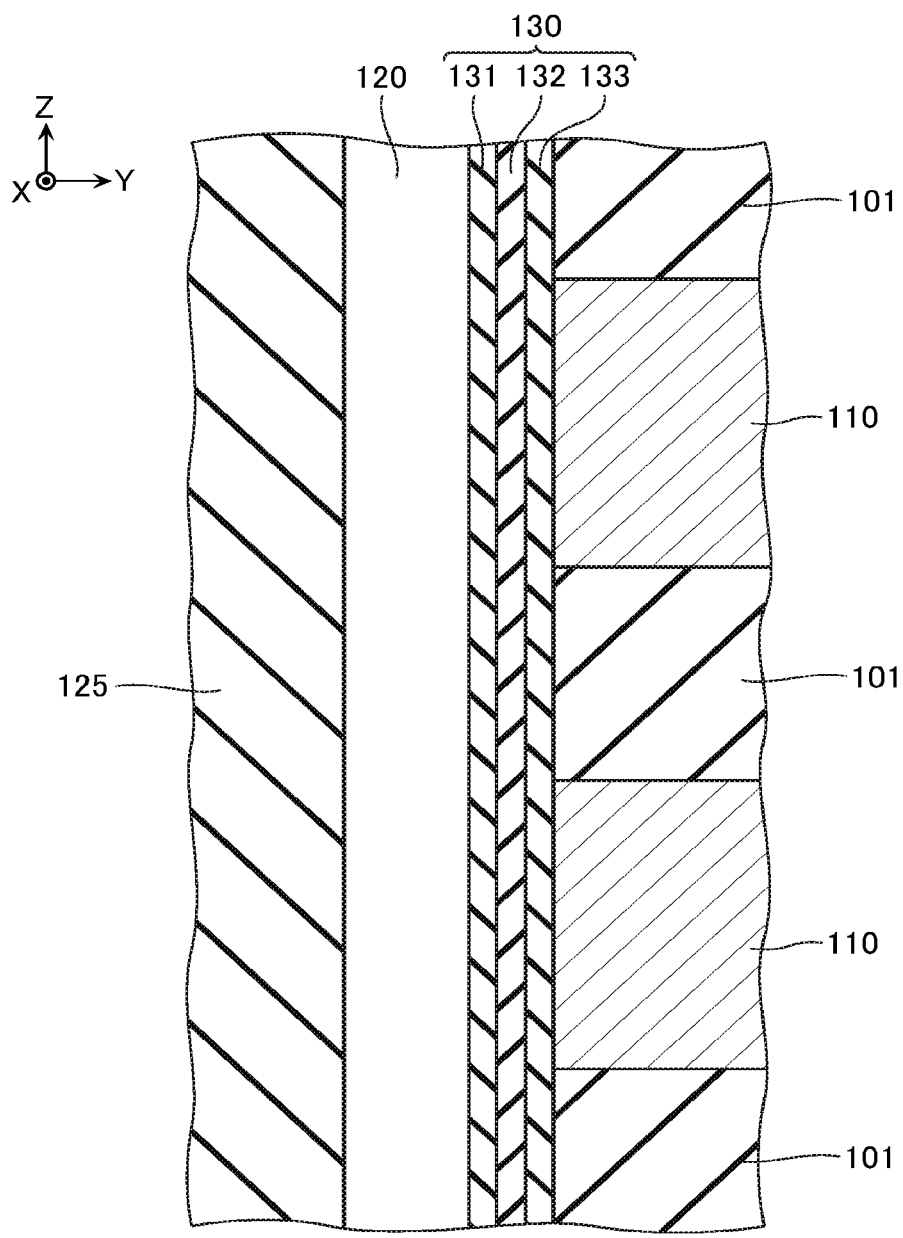
FIG. 10 is a schematic enlarged view of a part indicated by F in FIG. 6.

FIG. 4 is a schematic plan view illustrating a part of a configuration of the semiconductor memory device according to the embodiment. FIG. 5 is a schematic enlarged view of a part indicated by A in FIG. 4. Note that FIG. 5 illustrates only a part of the plurality of bit lines BL for sake of description convenience. FIG. 6 is a schematic cross-sectional view of the structure illustrated in FIG. 5 taken along the line B-B' and viewed along the direction of the arrow. FIG. 7 is a schematic cross-sectional view of the structure illustrated in FIG. 5 taken along the line C-C' and viewed along the direction of the arrow. Note that FIG. 7 omits configurations of, for example, a gate insulating film 130 for sake of description convenience. FIG. 8 is a schematic enlarged view of a part indicated by D in FIG. 7. FIG. 9 is a schematic enlarged view of a part indicated by E in FIG. 7. FIG. 10 is a schematic enlarged view of a part indicated by F in FIG. 6.

The semiconductor memory device according to the embodiment includes a semiconductor substrate 100, for example, as illustrated in FIG. 4. In the illustrated example, the semiconductor substrate 100 includes four memory cell array regions $R_{MCA}$ arranged in the X-direction and the Y-direction.

The semiconductor substrate 100 is, for example, a semiconductor substrate of P-type silicon (Si) containing P-type impurities, such as boron (B). For example, in the surface of the semiconductor substrate 100, an N-type well region containing N-type impurities, such as phosphorus (P), a P-type well region containing P-type impurities, such as boron (B), a semiconductor substrate region where the N-type well region or the P-type well region is not disposed, and insulating regions are disposed. In the N-type well region, the P-type well region, and the semiconductor substrate region of the semiconductor substrate 100, a plurality of the transistors, capacitors, resistors, and the like constituting the peripheral circuit PC are formed.

In the memory cell array region $R_{MCA}$, the plurality of memory blocks BLK arranged in the Y-direction are disposed. The memory block BLK includes five string units SU arranged in the Y-direction, for example, as illustrated in FIG. 5. Between two memory blocks BLK adjacent in the Y-direction, an inter-block insulating layer ST of, for example, silicon oxide ($SiO_2$) is disposed. Between two string units SU adjacent in the Y-direction, an inter-string unit insulating layer SHE of, for example, silicon oxide ($SiO_2$) is disposed.

Note that, in the following description, the five string units SU in the memory block BLK are each referred to as string units SUa, SUb, SUc, SUd, SUe in some cases, for example, as illustrated in FIG. 5.

For example, as illustrated in FIG. 6, the memory block BLK includes a plurality of conductive layers 110 arranged in the Z-direction, a plurality of semiconductor layers 120 extending in the Z-direction, and a plurality of the respective gate insulating films 130 disposed between the plurality of conductive layers 110 and the plurality of semiconductor layers 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed.

A conductive layer 111 is disposed below the conductive layers 110. The conductive layer 111 may include, for example, polycrystalline silicon including impurities, such as phosphorus (P), boron (B), or the like. Between the conductive layer 111 and the conductive layer 110, the insulating layer 101, such as silicon oxide ($SiO_2$), is disposed.

A conductive layer 112 is disposed below the conductive layer 111. The conductive layer 112 includes a semiconductor layer 113 connected to a lower end of the semiconductor layer 120 and a conductive layer 114 connected to a lower surface of the semiconductor layer 113. The semiconductor layer 113 may, for example, include polycrystalline silicon or the like including impurities, such as phosphorus (P) or boron (B). The conductive layer 114 may, for example, include metal, such as tungsten (W), a conductive layer of tungsten silicide or the like, or another conductive layer. Between the conductive layer 112 and the conductive layer 111, the insulating layer 101 of silicon oxide ($SiO_2$) or the like is disposed.

For example, as illustrated in FIG. 7, the conductive layer 112 functions as a source line SL (FIG. 1). The source line SL is, for example, disposed for all the memory blocks BLK included in the memory cell array region $R_{MCA}$ (FIG. 4) in common.

The conductive layer 111 functions as the source-side select gate line SGSb and gate electrodes of a plurality of the source-side select transistors STSb (FIG. 1) connected thereto. The conductive layers 111 are electrically independent in every memory block BLK.

One or a plurality of the conductive layers 110 positioned on the lowermost layer of the plurality of conductive layers 110 function as the source-side select gate line SGS and gate electrodes of the plurality of source-side select transistors STS (FIG. 1) connected to the source-side select gate line SGS. The one or the plurality of conductive layers 110 are electrically independent in every memory block BLK.

A plurality of the conductive layers 110 positioned upward of this layer function as the word lines WL and gate electrodes of the plurality of memory cells MC (FIG. 1) connected to the word lines WL. The plurality of conductive layers 110 are each electrically independent in every memory block BLK.

One or a plurality of the conductive layers 110 positioned upward of these conductive layers 110 function as the drain-side select gate line SGD and gate electrodes of the plurality of drain-side select transistors STD (FIG. 1) connected thereto. The one or the plurality of conductive layers 110 have a width in the Y-direction smaller than that of the other conductive layers 110. Between two conductive layers 110 adjacent in the Y-direction, the inter-string unit insulating layer SHE is disposed. The plurality of conductive layers 110 are each electrically independent in every string unit SU.

The semiconductor layers 120 are arranged in the X-direction and the Y-direction in a predetermined pattern, for example, as illustrated in FIG. 5. For example, the string units SUa to SUe each include four memory groups MG arranged in the Y-direction. The memory group MG includes a plurality of the semiconductor layers 120 arranged in the X-direction.

In the following description, the memory groups MG included in the string unit SUa are referred to as memory groups MG0 to MG3 from the negative side to the positive side in the Y-direction in some cases. The memory groups MG included in the string unit SUb are referred to as memory groups MG5 to MG8 from the negative side to the positive side in the Y-direction in some cases. Similarly in the following, the memory groups MG included in the string units SUc, SUd, and SUe are referred to as memory groups MG10 to MG13, MG15 to MG18, and MG20 to MG23 from the negative side to the positive side in the Y-direction in some cases.

Respective positions in the X-direction of the semiconductor layers 120 belonging to the respective memory groups MG are adjusted corresponding to the respective positions in the X-direction of the plurality of bit lines BL. For example, FIG. 5 illustrates the plurality of bit lines BL that extend in the Y-direction and are arranged in the X-direction.

Among the plurality of semiconductor layers 120 that belong to the memory group MG0, the $n_G+1$-th ($n_G$ is an integer of zero or more) semiconductor layer 120 counted from the negative side in the X-direction is disposed at a position overlapping with $4n_G+1$-th and $4n_G+2$-th bit lines BL counted from the negative side in the X-direction when viewed from the Z-direction. Similarly, among the plurality of semiconductor layers 120 belonging to the memory groups MG2, MG6, MG8, MG10, MG12, MG16, MG18, MG20, and MG22, the $n_G+1$-th semiconductor layers 120 counted from the negative side in the X-direction are disposed at positions overlapping with the $4n_G+1$-th and $4n_G+2$-th bit lines BL counted from the negative side in the X-direction when viewed from the Z-direction.

Among the plurality of semiconductor layers 120 belonging to the memory group MG1, the $n_G+1$-th semiconductor layers 120 counted from the negative side in the X-direction is disposed at a position overlapping with $4n_G+3$-th and $4n_G+4$-th bit lines BL counted from the negative side in the X-direction when viewed from the Z-direction. Similarly, among the plurality of semiconductor layers 120 belonging to the memory groups MG3, MG5, MG7, MG11, MG13, MG15, MG17, MG21, and MG23, the $n_G+1$-th semiconductor layers 120 counted from the negative side in the X-direction are disposed at positions overlapping with the $4n_G+3$-th and $4n_G+4$-th bit lines BL counted from the negative side in the X-direction when viewed from the Z-direction.

Note that, in the illustrated example, the $4n_G+1$-th bit lines BL counted from the negative side in the X-direction are connected to each of the semiconductor layers 120 belonging to the memory groups MG2, MG8, MG12, MG18, and MG22. Such bit lines BL are hereinafter referred to as bit lines BL2 in some cases. The $4n_G+2$-th bit lines BL counted from the negative side in the X-direction are connected to each of the semiconductor layers 120 belonging to the memory groups MG0, MG6, MG10, MG16, and MG20. Such bit lines BL are hereinafter referred to as bit lines BL0 in some cases. The $4n_G+3$-th bit lines BL counted from the negative side in the X-direction are connected to each of the semiconductor layers 120 belonging to the memory groups MG3, MG7, MG13, MG17, and MG23. Such bit lines BL are hereinafter referred to as bit lines BL3 in some cases. The $4n_G+4$-th bit lines BL counted from the negative side in the X-direction are connected to each of the semiconductor layers 120 belonging to the memory groups MG1, MG5, MG11, MG15, and MG21. Such bit lines BL are hereinafter referred to as bit lines BL1 in some cases.

The semiconductor layers 120 function as the channel regions of the plurality of memory cells MC and the select transistors (STD, STS, STSb) included in one memory string MS (FIG. 1). The semiconductor layer 120 is, for example, a semiconductor layer such as polycrystalline silicon (Si). The semiconductor layer 120 has, for example, as illustrated in FIG. 6, a substantially closed-bottomed cylindrical shape and includes an insulating layer 125 such as silicon oxide in the center portion. The outer peripheral surfaces of the semiconductor layers 120 are each surrounded by the conductive layers 110 and opposed to the conductive layers 110.

In the upper end portion of the semiconductor layer 120, an impurity region 121 containing the N-type impurities, such as phosphorus (P), is disposed. In the example in FIG. 6, a lower end portion of the impurity region 121 is indicated by the dashed line. The impurity region 121 is connected to the bit line BL via a contact Ch and a contact Vy (FIG. 5).

At the lower end portion of the semiconductor layer 120, an impurity region 122 containing the N-type impurities, such as phosphorus (P), is disposed. In the example in FIG. 6, the upper end portion of the impurity region 122 is indicated by the dashed line. The impurity regions 122 are connected to the semiconductor layer 113 of the conductive layer 112. In the semiconductor layer 120, a portion positioned immediately above the impurity region 122 functions as a channel region of the source-side select transistor STSb. An outer peripheral surface of a part of the impurity region 122 is surrounded by the conductive layer 111 and opposed to the conductive layer 111.

Note that, for example, as exemplarily illustrated in FIG. 8 and FIG. 9, the closer to a center position $Y_{DLK}$ (FIG. 5) in the Y-direction of the memory block BLK the memory groups MG are positioned, the smaller the contacted areas between the semiconductor layers 120 and the semiconductor layer 113 in the memory groups MG are, and the farther from the center position $Y_{DLK}$ (FIG. 5) in the Y-direction of the memory block BLK the memory groups MG are positioned, the larger the contacted areas in the memory groups MG are.

For example, in the example in FIG. 5, the memory group MG11 or the memory group MG12 are the closest to the above-described center position $Y_{BLK}$ among the plurality of memory groups MG. As illustrated in FIG. 8, the above-described contacted area corresponding to the memory group MG11 or the memory group MG12 is smaller than the above-described contacted areas corresponding to the other memory groups MG0 to MG3, MG5 to MG8, MG10, MG13, MG15 to MG18, and MG20 to MG23.

For example, in the example in FIG. 5, among the plurality of memory groups MG, the memory group MG0 or the memory group MG23 is the farthest from the above-described center position $Y_{BLK}$. As exemplarily illustrated in FIG. 9, the above-described contacted area corresponding to the memory group MG0 or the memory group MG23 is larger than the above-described contacted areas corresponding to the other memory groups MG1 to MG3, MG5 to MG8, MG10 to MG13, MG15 to MG18, and MG20 to MG22.

Note that the center position $Y_{BLK}$ (FIG. 5) in the Y-direction of the memory block BLK may, for example, correspond to a center position in the Y-direction of the conductive layer 110 that functions as the word line WL.

The gate insulating film 130 has a substantially closed-bottomed cylindrical shape that covers the outer peripheral surface of the semiconductor layer 120. The gate insulating film 130 includes, for example, as illustrated in FIG. 10, a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is a film that can accumulate electric charge. The electric charge accumulating film 132 is, for example, a film of silicon nitride ($Si_3N_4$) or the like. The tunnel insulating film 131, the electric charge accumulating film 132, and the block insulating film 133 have substantially cylindrical shapes and extend in the Z-direction along the outer peripheral surface of the semiconductor layer 120 excluding the contact portion between the semiconductor layer 120 and the semiconductor layer 113.

The gate insulating film 130 has, for example, as illustrated in FIG. 8 and FIG. 9, a portion 130A disposed above the contact portion between the semiconductor layer 120 and the semiconductor layer 113 and a portion 130B disposed below this contact portion. The closer to the center position $Y_{BLK}$ (FIG. 5) in the Y-direction of the memory block BLK the memory groups MG are positioned, the smaller the distances $D_{130}$ in the Z-direction between the portions 130A and 130B in the memory groups MG are, and the farther from the center position $Y_{BLK}$ (FIG. 5) in the Y-direction of the memory block BLK the memory groups MG are positioned, the larger the distances $D_{130}$ in the memory groups MG are.

Note that the example in which the gate insulating film 130 includes the electric charge accumulating film 132 of silicon nitride or the like is illustrated in FIG. 10. However, the gate insulating film 130 may, for example, include a floating gate of, polycrystalline silicon or the like including N-type or P-type impurities.

[Manufacturing Method]

Figure 17:
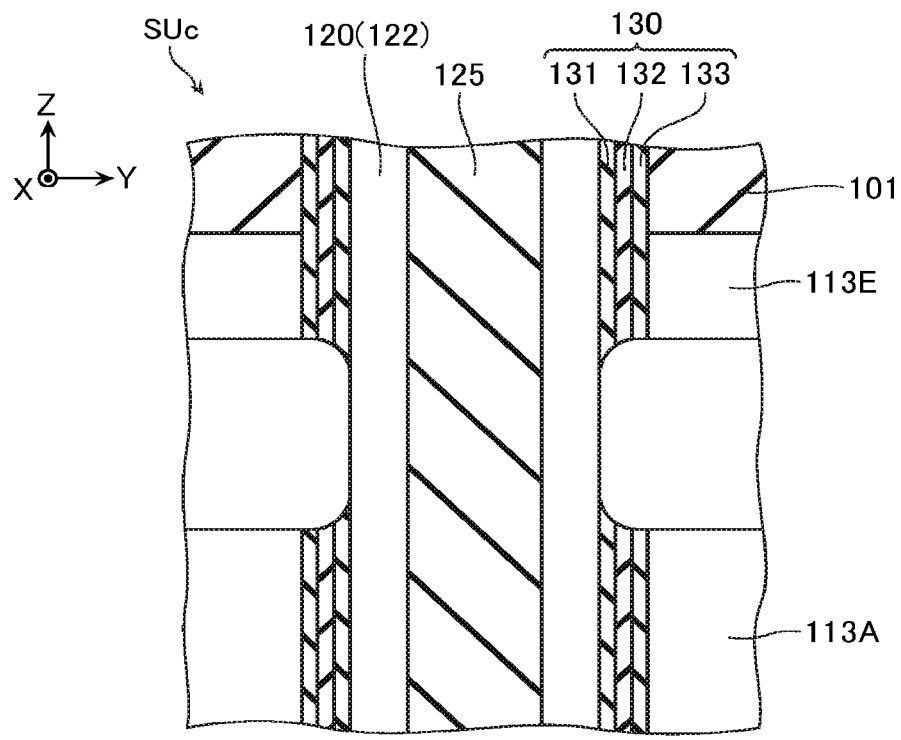
FIG. 17 is a schematic cross-sectional view for describing the manufacturing method.
Figure 18:
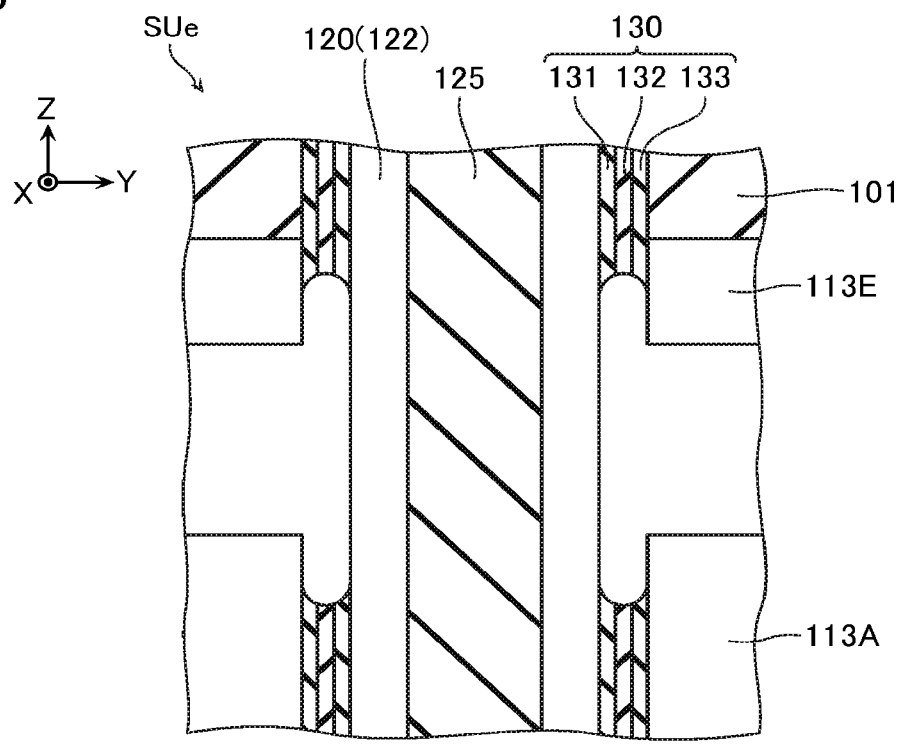
FIG. 18 is a schematic cross-sectional view for describing the manufacturing method.

Next, with reference to FIG. 11 to FIG. 20, a method for manufacturing the memory cell array MCA will be described. FIG. 11 to FIG. 16, FIG. 19, and FIG. 20 are schematic cross-sectional views for describing the manufacturing method and illustrate cross-sectional surfaces corresponding to FIG. 6. FIG. 17 is a schematic cross-sectional view for describing the manufacturing method and illustrates a cross-sectional surface corresponding to FIG. 8. FIG. 18 is a schematic cross-sectional view for describing the manufacturing method and illustrates a cross-sectional surface corresponding to FIG. 9.

Figure 11:
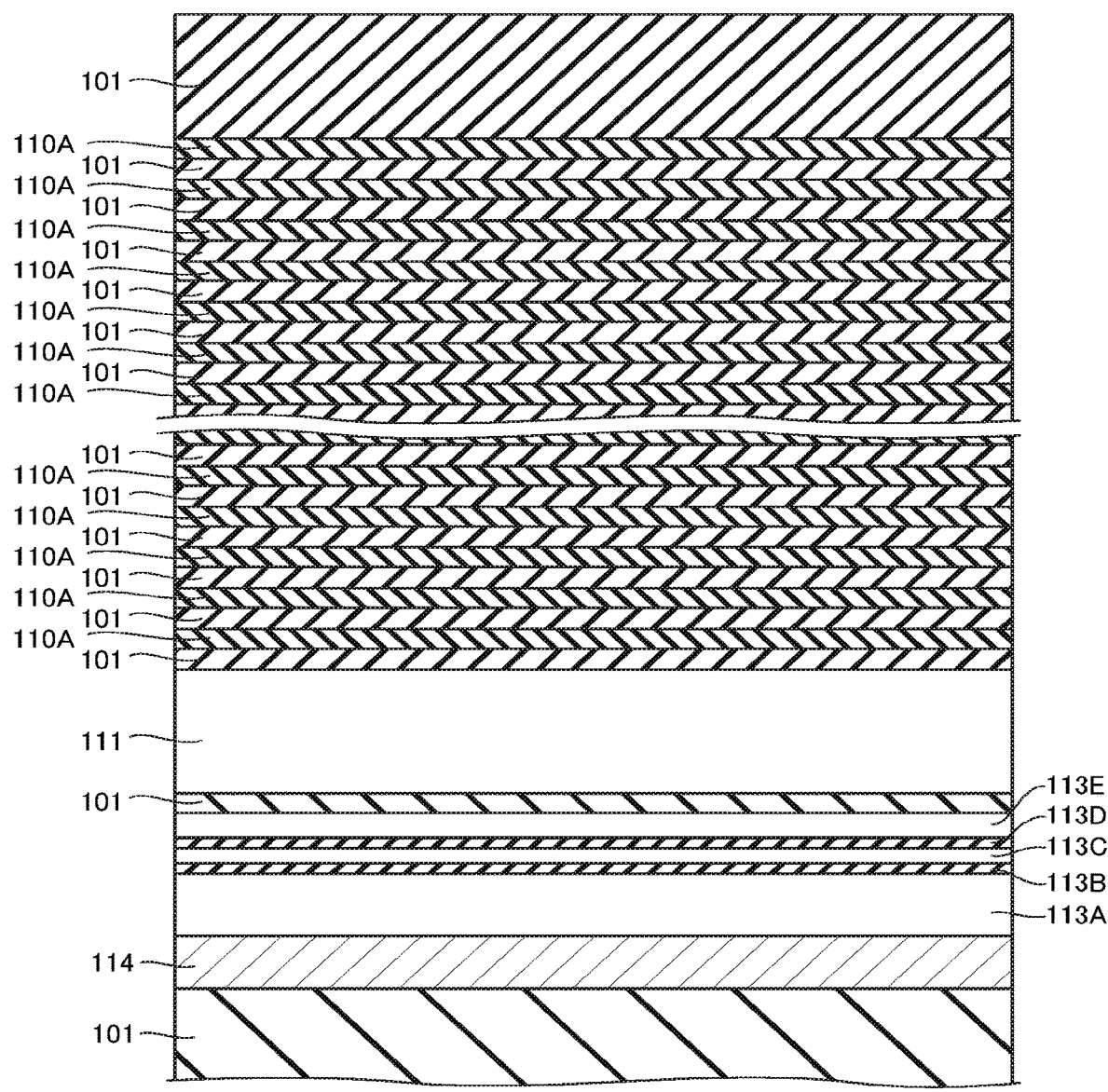
FIG. 11 is a schematic cross-sectional view for describing a method for manufacturing the semiconductor memory device.

In the manufacture of the semiconductor memory device according to the embodiment, first, for example, as illustrated in FIG. 11, the insulating layer 101, the conductive layer 114, a semiconductor layer 113A of silicon or the like, a sacrifice layer 113B of silicon oxide or the like, a sacrifice layer 113C of silicon or the like, a sacrifice layer 113D of silicon oxide or the like, a semiconductor layer 113E of silicon or the like, the insulating layer 101, and the conductive layer 111 are formed. The plurality of insulating layers 101 and a plurality of sacrifice layers 110A are alternately formed. This step is performed by a method, such as Chemical Vapor Deposition (CVD).

Figure 12:
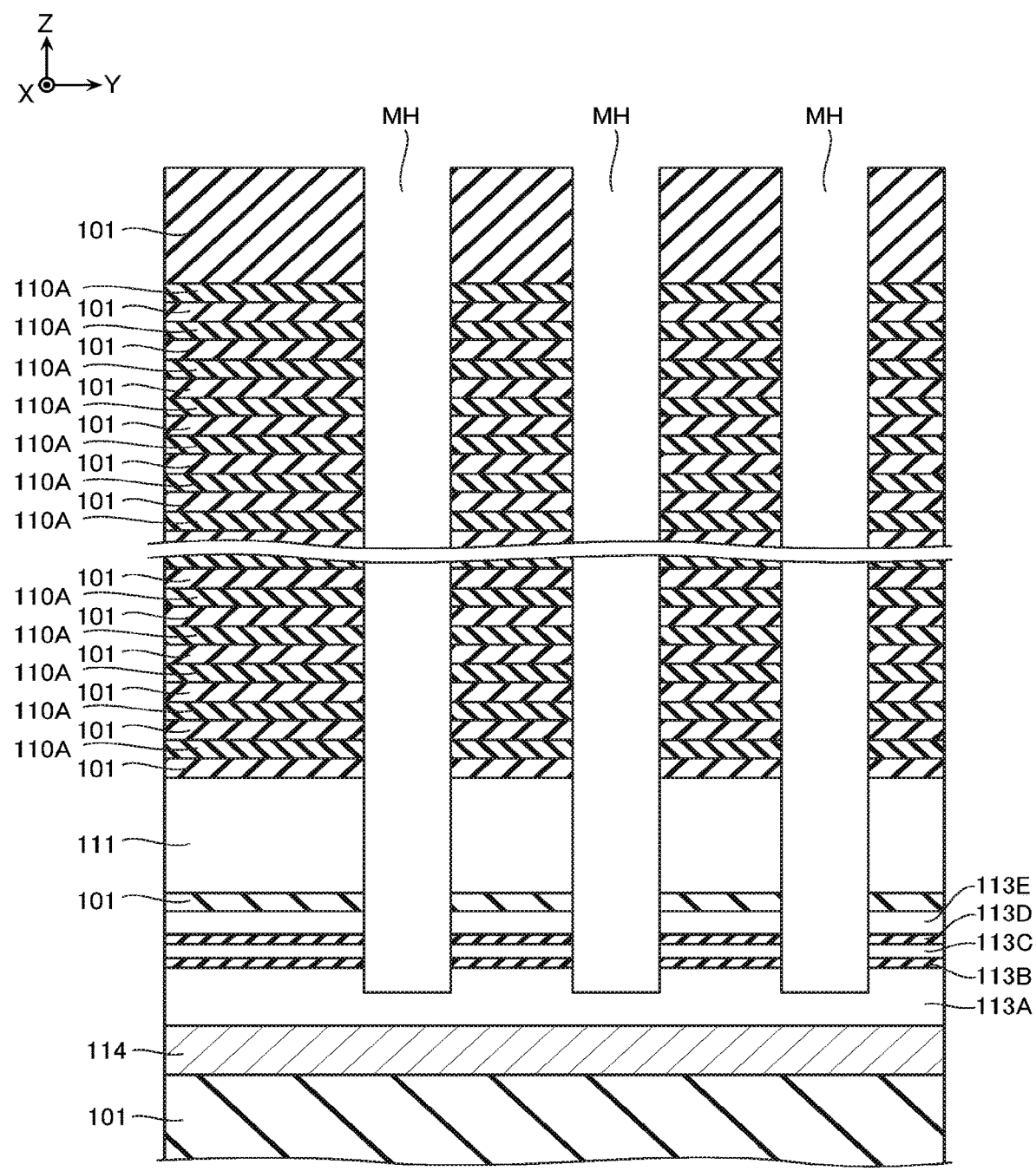
FIG. 12 is a schematic cross-sectional view for describing the manufacturing method.

Next, for example, as illustrated in FIG. 12, a plurality of memory holes MH are formed at positions corresponding to the plurality of semiconductor layers 120. The memory hole MH is a through-hole that extends in the Z-direction, penetrates the insulating layers 101 and the sacrifice layers 110A, the conductive layer 111, the semiconductor layer 113E, the sacrifice layer 113D, the sacrifice layer 113C, and the sacrifice layer 113B to expose the upper surface of the semiconductor layer 113A. For example, this step is performed by a method such as Reactive Ion Etching (RIE).

Figure 13:
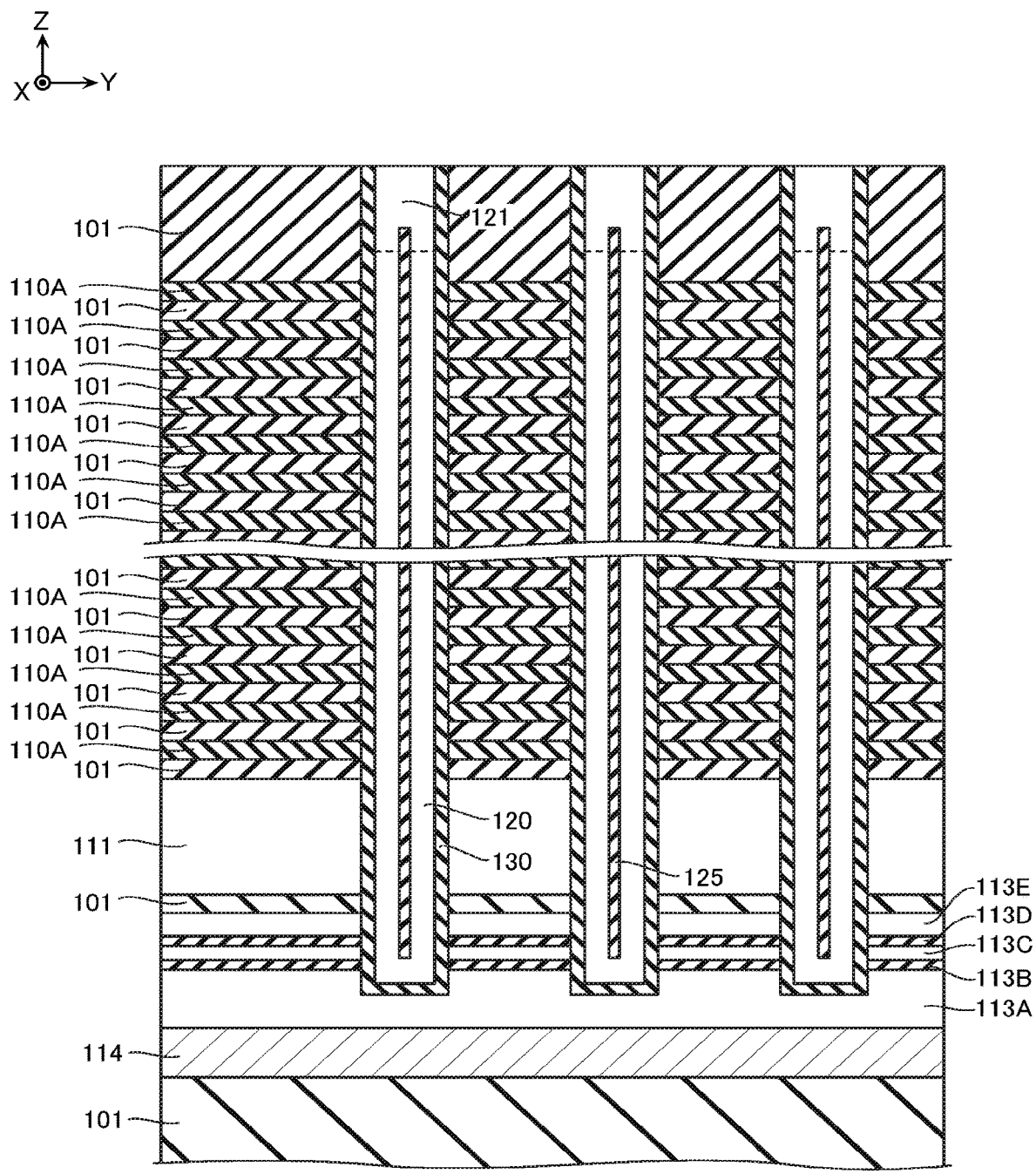
FIG. 13 is a schematic cross-sectional view for describing the manufacturing method.

Next, for example, as illustrated in FIG. 13, the gate insulating film 130, the semiconductor layer 120, and the insulating layer 125 are formed in the inner circumferential surface of the memory hole MH. In this step, for example, a film is formed by CVD or the like, and an amorphous silicon film is formed at the inside of the memory hole MH. For example, by an annealing process or the like, a crystalline structure of this amorphous silicon film is modified. In this step, the impurity region 121 is formed in the vicinity of an upper end of the memory hole MH.

Figure 14:
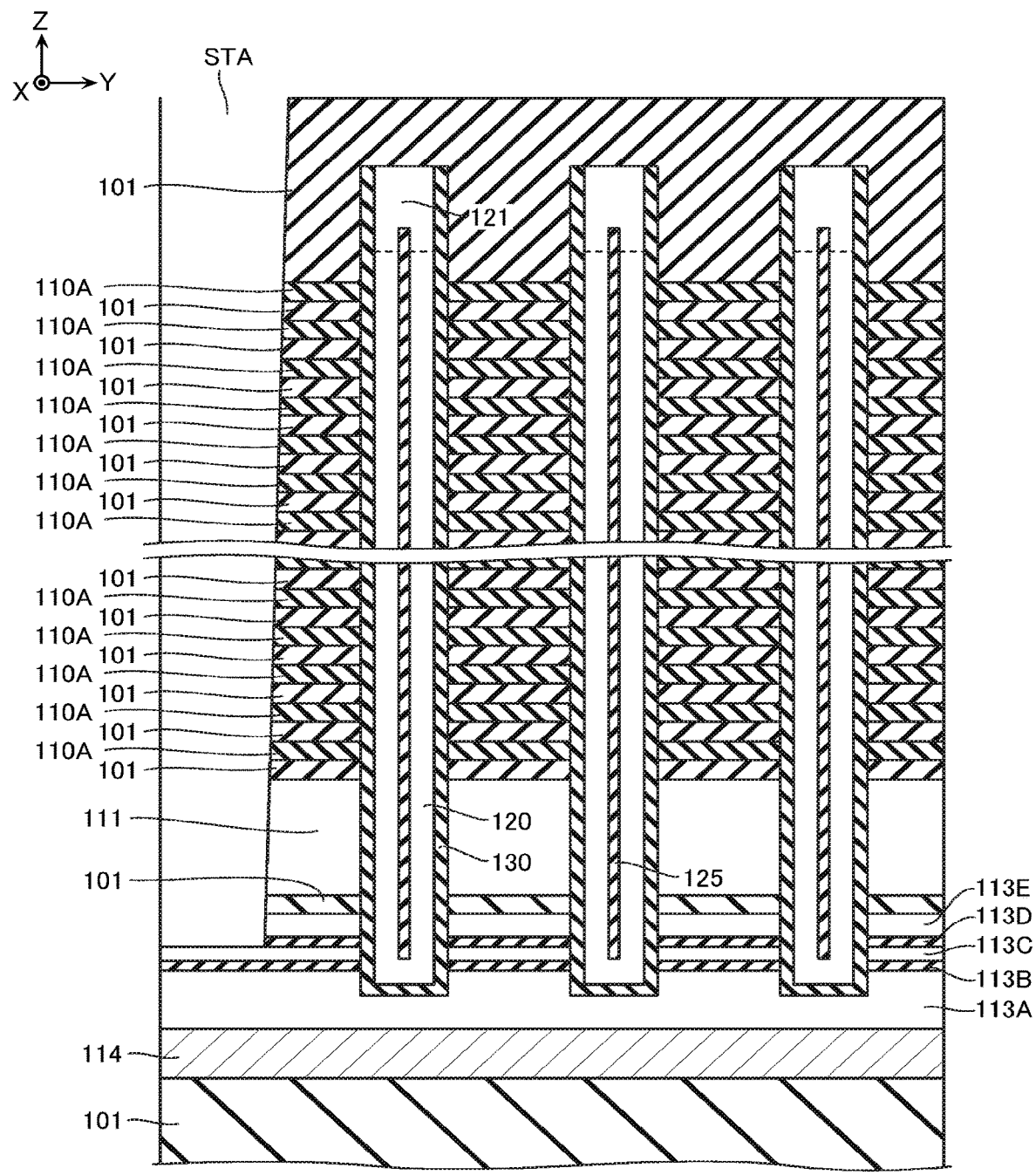
FIG. 14 is a schematic cross-sectional view for describing the manufacturing method.

Next, for example, as illustrated in FIG. 14, a trench STA is formed. The trench STA extends in the Z-direction and the X-direction, separates the insulating layers 101 and the sacrifice layers 110A, the conductive layer 111, the semiconductor layer 113E, and the sacrifice layer 113D in the Y-direction to expose the upper surface of the sacrifice layer 113C. For example, this step is performed by a method such as RIE.

Figure 15:
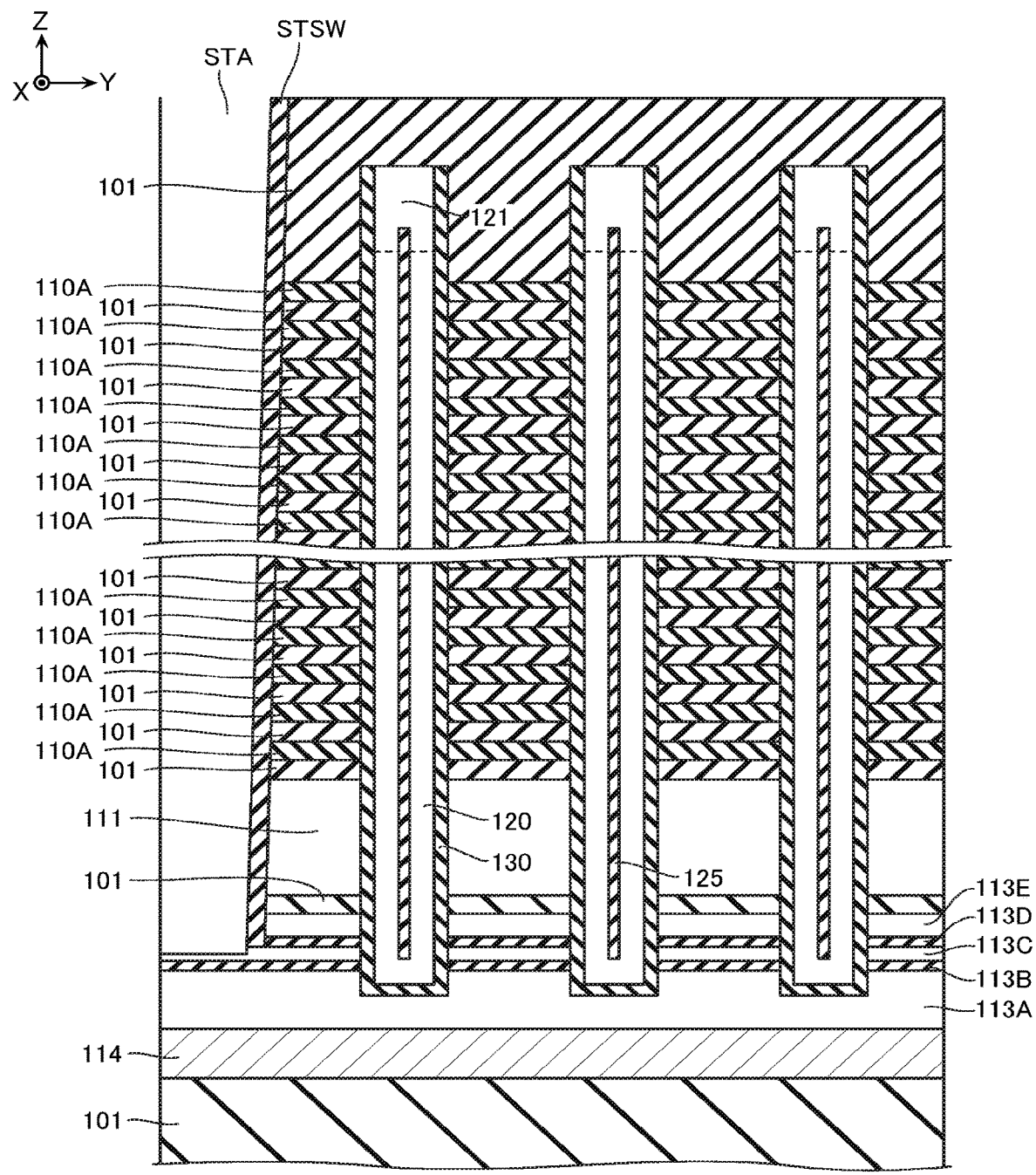
FIG. 15 is a schematic cross-sectional view for describing the manufacturing method.

Next, for example, as illustrated in FIG. 15, a protective film STSW, such as silicon nitride, is formed on the side surface in the Y-direction of the trench STA. In this step, for example, by a method such as CVD, insulating films, such as silicon nitride, are formed on the side surface in the Y-direction and the bottom surface of the trench STA. Additionally, by a method such as RIE, a part of the insulating films covering the bottom surface of the trench STA is removed.

Figure 16:
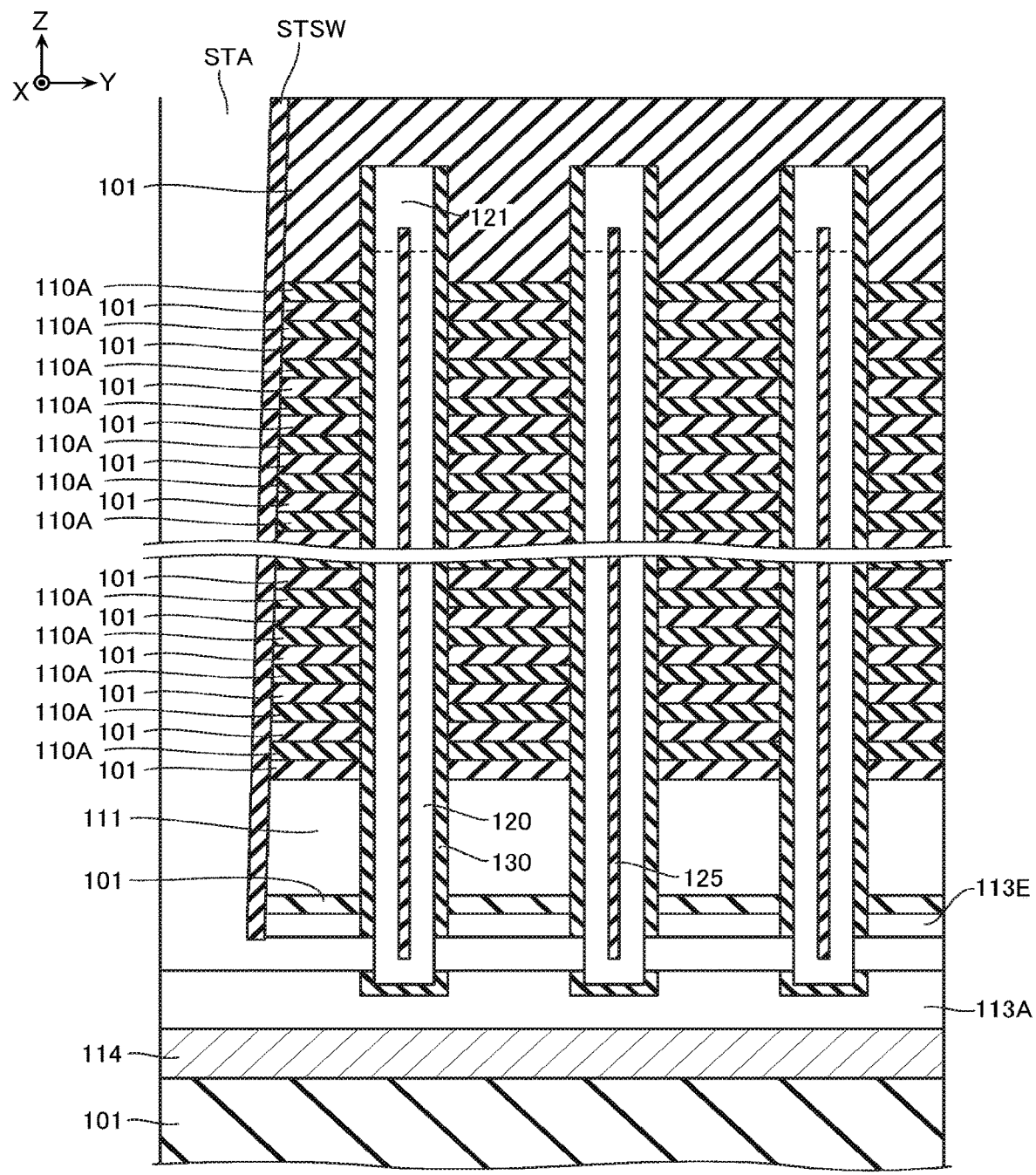
FIG. 16 is a schematic cross-sectional view for describing the manufacturing method.

Next, for example, as illustrated in FIG. 16, a part of the sacrifice layers 113B, 113C, 113D and the gate insulating films 130 are removed to expose a part of the semiconductor layers 120. This step is performed by, for example, a method such as wet etching.

In this process, first, the sacrifice layers 113B, 113C, and 113D are removed via the trench STA. In such a case, the closer to the trench STA the portions of the sacrifice layers 113B, 113C, and 113D are, the earlier they are removed, and the farther from the trench STA the portions of the sacrifice layers 113B, 113C, and 113D are, the later they are removed. Then, by proceeding the process of wet etching or the like, a part of the gate insulating film 130 is removed, for example, as illustrated in FIG. 17 and FIG. 18, and the side surface of the semiconductor layer 120 is exposed. Here, in a region comparatively far from the trench STA, the sacrifice layers 113B, 113C, and 113D are removed comparatively late. Accordingly, for example, as illustrated in FIG. 17, the area of the exposed portion on the outer peripheral surface of the semiconductor layer 120 becomes comparatively small. On the other hand, in the area comparatively close to the trench STA, the sacrifice layers 113B, 113C, and 113D are removed comparatively early. Accordingly, for example, as illustrated in FIG. 18, the area of the exposed portion on the outer peripheral surface of the semiconductor layer 120 becomes comparatively large.

Figure 19:
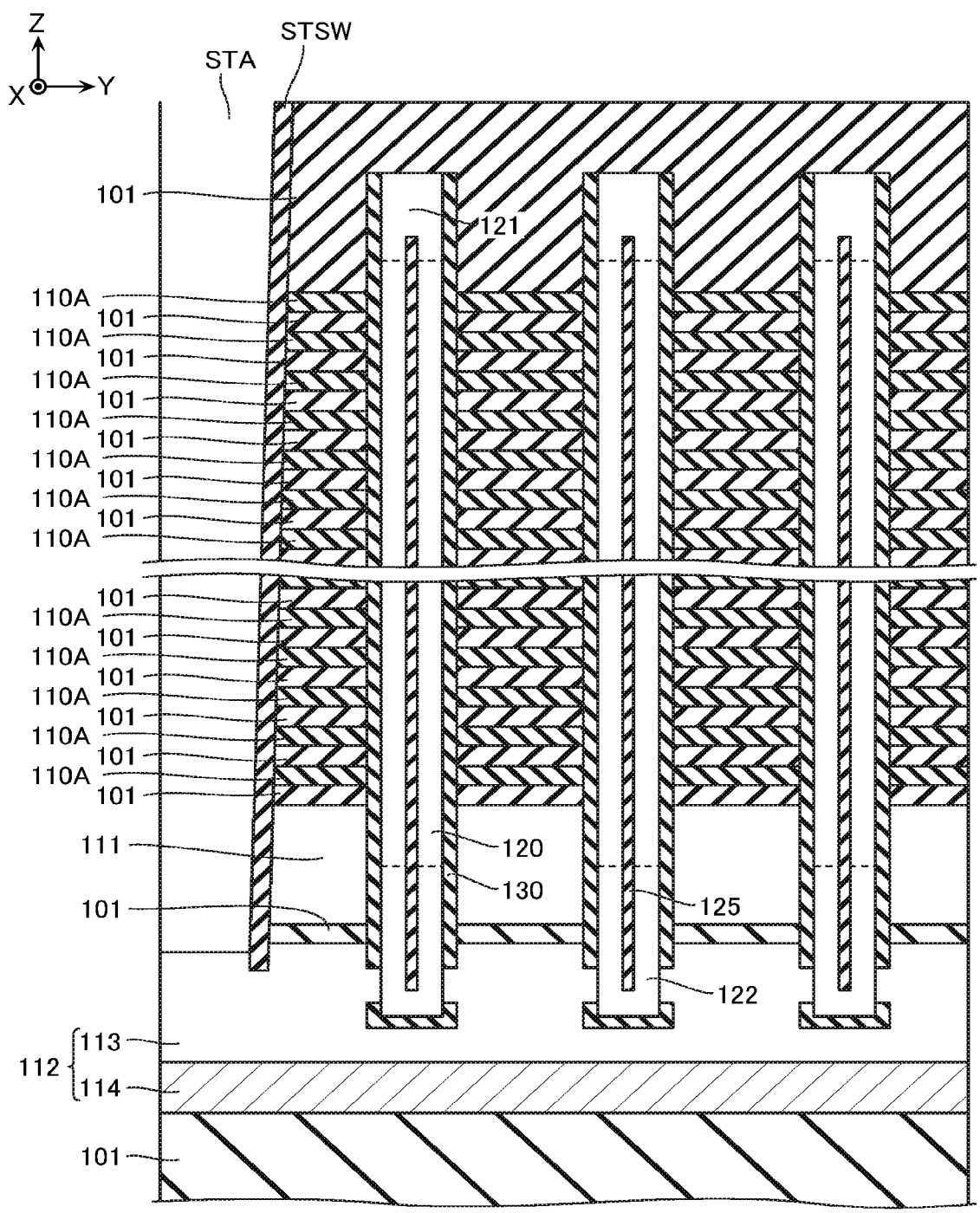
FIG. 19 is a schematic cross-sectional view for describing the manufacturing method.

Next, for example, as illustrated in FIG. 19, the semiconductor layer 113 is formed. This step is performed by, for example, a method, such as epitaxial growth onto the semiconductor layer 113A, the semiconductor layer 113E, and the semiconductor layer 120.

Figure 20:
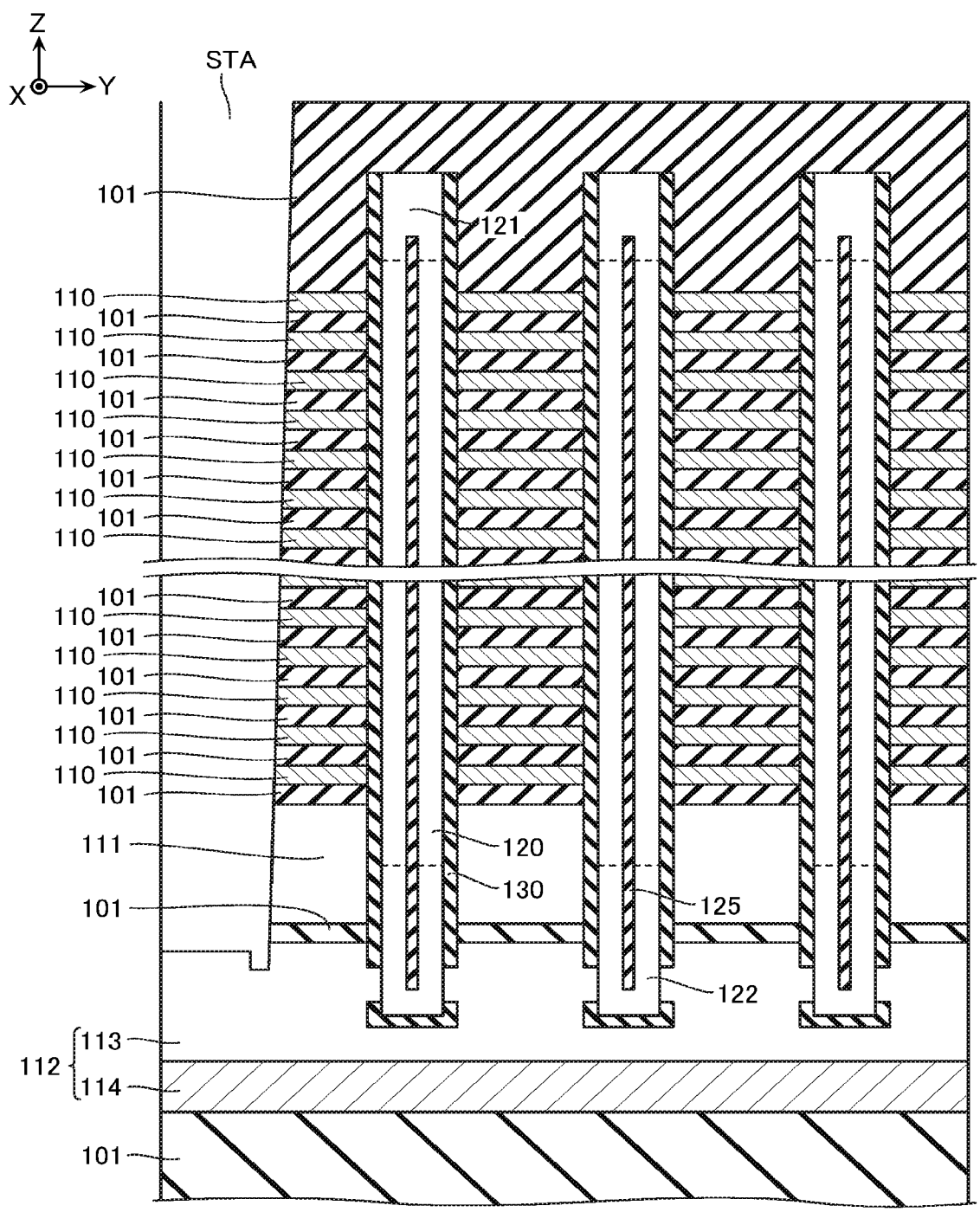
FIG. 20 is a schematic cross-sectional view for describing the manufacturing method.

Next, for example, as illustrated in FIG. 20, the conductive layer 110 is formed. In this step, for example, the protective film STSW and the sacrifice layer 110A are removed via the trench STA. The conductive layer 110 is formed at the position from which the sacrifice layer 110A is removed. The conductive layer 110 is formed by a method such as CVD.

Then, the inter-block insulating layer ST, the inter-string unit insulating layer SHE, the contacts Ch and Vy, the bit lines BL, and the like are formed and the semiconductor memory device according to the embodiment is manufactured.

[Read Operation]

Figure 21:
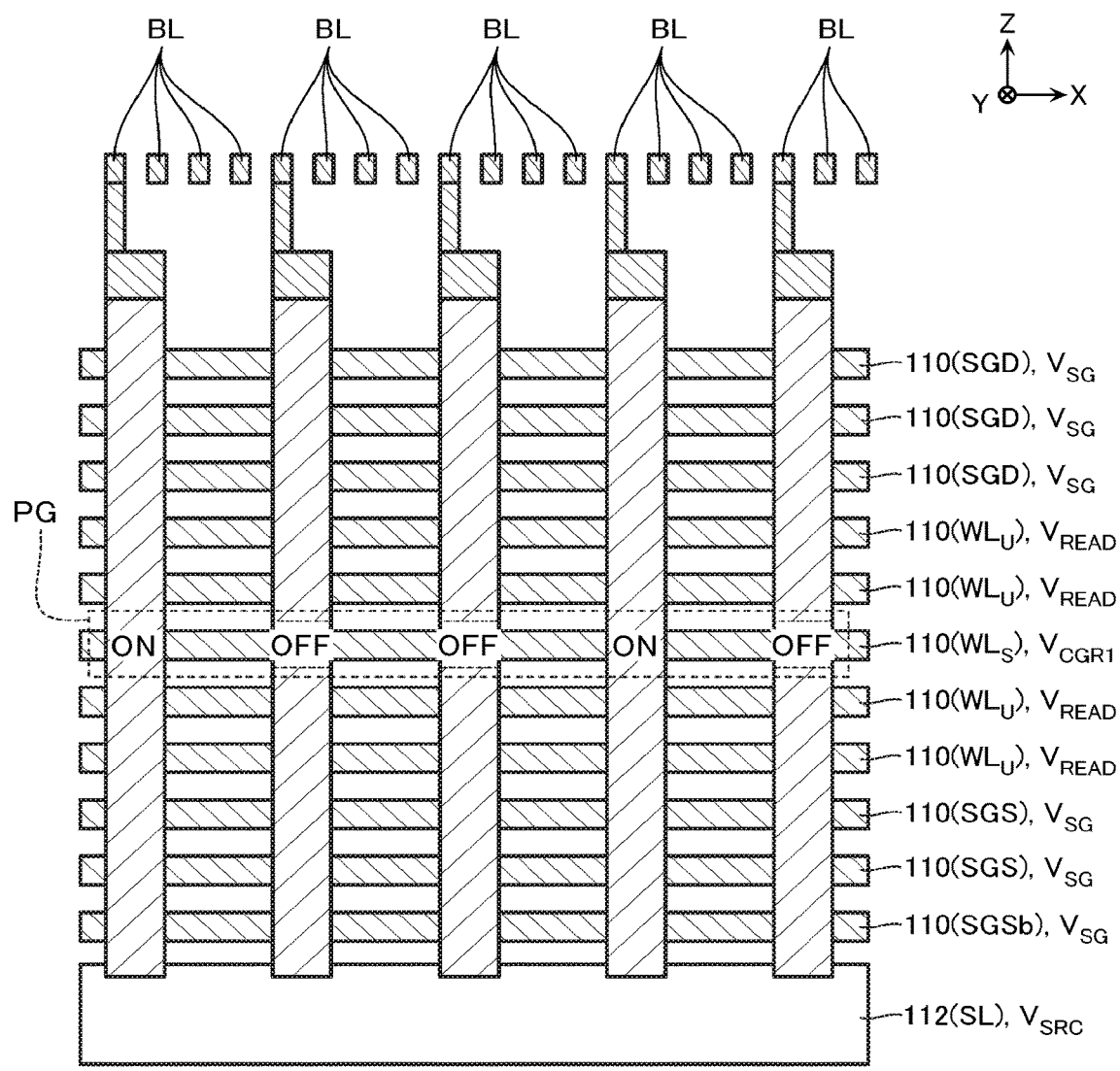
FIG. 21 is a schematic cross-sectional view for describing a read operation.
Figure 22:
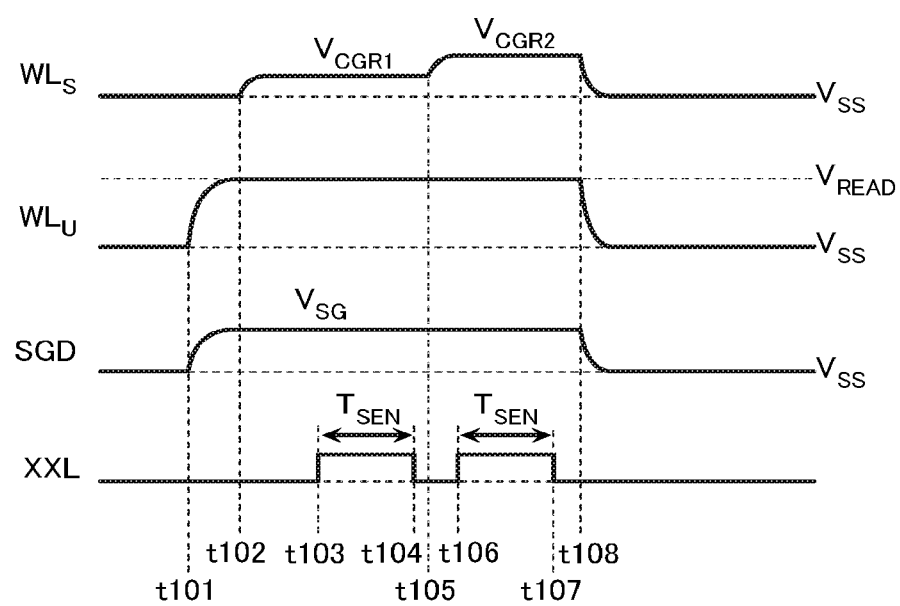
FIG. 22 is a timing chart for describing a read operation.

Next, a description will be briefly given of a read operation of the semiconductor memory device according to the embodiment with reference to FIG. 21 and FIG. 22. FIG. 21 is a schematic cross-sectional view for describing the read operation. FIG. 22 is a timing chart for describing the read operation. In FIG. 22, a description will be given of an example in which each of the memory cells MC stores a plurality of bits of data and a plurality of patterns of read voltages are used in the read operation.

Note that, in the following description, the word line WL as a target of operation may be referred to as a selected word line $WL_S$ and the other word lines WL may be referred to as unselected word lines $WL_U$. Also, the following will describe an example where the read operation is executed on the memory cells MC connected to the selected word line $WL_S$ (hereinafter may be referred to as a "selected memory cell MC") among the plurality of memory cells MC included in the string unit SU as a target of operation. In the following description, such a configuration that includes the plurality of selected memory cells MC may be referred to as a selected page PG.

At timing t101 in the read operation, for example, as illustrated in FIG. 22, a read pass voltage $V_{READ}$ is supplied to the unselected word lines $WL_U$ to cause all the memory cells MC connected to the unselected word lines $WL_U$ to be in the ON state. The read pass voltage $V_{READ}$, for example, has a magnitude for causing the memory cell MC to enter into the ON state regardless of the data stored in the memory cell MC.

At the timing t101 in the read operation, a voltage $V_{SG}$ is supplied to the select gate lines (SGD, SGS, SGSb). The voltage $V_{SG}$, for example, has a magnitude for causing the select transistors (STD, STS, STSb) to enter into the ON state.

At timing t102 in the read operation, a predetermined read voltage $V_{CGR1}$ is supplied to the selected word line $WL_S$. This causes a part of the selected memory cells MC to enter into the ON state and the rest of the selected memory cells MC to enter into the OFF state, for example, as illustrated in FIG. 21.

At the timing t102, for example, charging of the bit line BL and the sense node SEN is performed. For example, the latch circuit SDL in FIG. 3 is controlled to latch "H", and the states of the signal lines STB, XXL, BLC, BLS, HLL, BLX are controlled to be "L, L, H, H, H, H". This supplies the voltage to the bit line BL and the sense node SEN to start their charging. For example, the source line SL is supplied with the voltage $V_{SRC}$. The voltage $V_{SRC}$, for example, has a magnitude approximately the same as the ground voltage $V_{SS}$. The voltage $V_{SRC}$, for example, may be slightly larger than the ground voltage $V_{SS}$ and sufficiently smaller than the voltage of the bit line BL.

At timing t103 in the read operation, for example, as illustrated in FIG. 22, the sense amplifier module SAM (FIG. 1) starts a sense operation to detect the ON state/OFF state of the memory cells MC. For example, in the state where the bit line BL (FIG. 1) is supplied with a predetermined bit line voltage, the sense node SEN of the sense amplifier SA (FIG. 3) is electrically conducted with the bit line BL for a certain period of time. For example, the states of the signal lines STB, XXL, BLC, BLS, HLL, BLX are controlled to be "L, H, H, H, L, H". This electrically conducts the bit line BL with the sense node SEN. Electric charge of the sense node SEN connected to the selected memory cell MC in the ON state is discharged, and the sense transistor 41 connected to this enters into the OFF state. On the other hand, electric charge of the sense node SEN connected to the selected memory cell MC in the OFF state is maintained, and the sense transistor 41 connected to this enters into the ON state.

At timing t104 in the read operation, for example, the sense operation is terminated, and the data indicating the ON state/OFF state of the memory cells MC is obtained. For example, the states of the signal lines STB, XXL, BLC, BLS, HLL, BLX of the sense amplifier SA (FIG. 3) are controlled to be "H, L, H, H, L, H". This maintains electric charge of the wiring LBUS corresponding to the selected memory cell MC in the ON state and discharges electric charge of the wiring LBUS corresponding to the selected memory cell MC in the OFF state. Then, the data of the wiring LBUS is latched by any of the latch circuit SDL or the latch circuits DL0 to $DLn_L$.

Note that, in the following description, a time period of the bit line BL sense (a time period from a timing at which the state of the signal line XXL enter into "H" until a timing at which the state of the signal line XXL enter into "L") from the timing t103 to the timing t104 is referred to as a "sense time $T_{SEN}$" in some cases.

At timing t105 in the read operation, for example, the selected word line $WL_S$ is supplied with another read voltage $V_{CGR2}$. This causes a part of the selected memory cells MC to enter into the ON state and the rest of the selected memory cell MC to enter into the OFF state.

At timing t106 in the read operation, for example, as illustrated in FIG. 22, the sense amplifier module SAM (FIG. 1) starts the sense operation to detect the ON state/OFF state of the memory cells MC.

At timing t107 in the read operation, for example, the sense operation is terminated, and the data indicating the ON state/OFF state of the memory cells MC is obtained.

At timing t108 in the read operation, the ground voltage $V_{SS}$ is supplied to the selected word line $WL_S$, the unselected word lines $WL_U$, and the select gate lines (SGD, SGS, SGSb).

Note that FIG. 22 illustrates the example in which two patterns of read voltages $V_{CGR1}$ and $V_{CGR2}$ are supplied to the selected word line $WL_S$ and the sense operation is executed twice, however, such a method is merely an example, and the number of the read voltages supplied to the selected word line $WL_S$ and the number of the sense operations are adjustable as necessary.

[Contact Resistance Between Semiconductor Layer 120 and Semiconductor Layer 113]

As described with reference to FIG. 8 and FIG. 9, in the semiconductor memory device according to the embodiment, the closer to the center position $Y_{BLK}$ (FIG. 5) in the Y-direction of the memory block BLK the memory groups MG are positioned, the smaller the contacted areas between the semiconductor layers 120 and the semiconductor layer 113 in the memory groups MG are, and the farther from the center position $Y_{BLK}$ (FIG. 5) in the Y-direction of the memory block BLK the memory groups MG are positioned, the larger the contacted areas between the semiconductor layers 120 and the semiconductor layer 113 in the memory groups MG are. In such a configuration, the closer to the center position $Y_{BLK}$ (FIG. 5) in the Y-direction of the memory block BLK the memory groups MG are positioned, the larger contact resistances between the semiconductor layers 120 and the semiconductor layer 113 in the memory groups MG are, and the farther from the center position $Y_{BLK}$ (FIG. 5) in the Y-direction of the memory block BLK the memory groups MG are positioned, the smaller the contact resistances between the semiconductor layers 120 and the semiconductor layer 113 in the memory groups MG are.

Here, when the read operation is executed on such a configuration, in the sense operation described with reference to FIG. 22 and the like, electric charge of the sense node SEN corresponding to the memory group MG with a comparatively small contact resistance is comparatively easily to be discharged. On the other hand, electric charge of the sense node SEN corresponding to the memory group MG with a comparatively large contact resistance is comparatively less likely to be discharged. In such an aspect, for example, when the length of the sense time is adjusted to the former, electric charge of the latter fails to be appropriately discharged in some cases. When the length of the sense time is adjusted to the latter, electric charge of the former fails to be appropriately maintained in some cases.

[Adjustment of Control Parameter]

In order to reduce an influence of variation of such a contact resistance, a control parameter is adjusted in the embodiment. As such a control parameter, for example, the voltage of the bit line BL is included. For example, adjusting respective voltage values of the bit lines BL0 to BL3 to appropriate magnitudes ensures appropriately adjusting channel voltages in the respective selected memory cells MC to reduce the influence of variation of the above-described contact resistance.

In the embodiment, in order to adjust the voltage of the bit line BL, the variable resistor module VRM described with reference to FIG. 1 is used. For example, in the read operation, resistance values of the plurality of variable resistor circuits VR are set so as to reduce the variation of the contact resistances. For example, the resistance values of the plurality of variable resistor circuits VR may be adjusted such that the sum of the resistance values of the variable resistor circuits VR and the above-described contact resistances becomes close to a certain value. This respect is described below.

Figure 23:
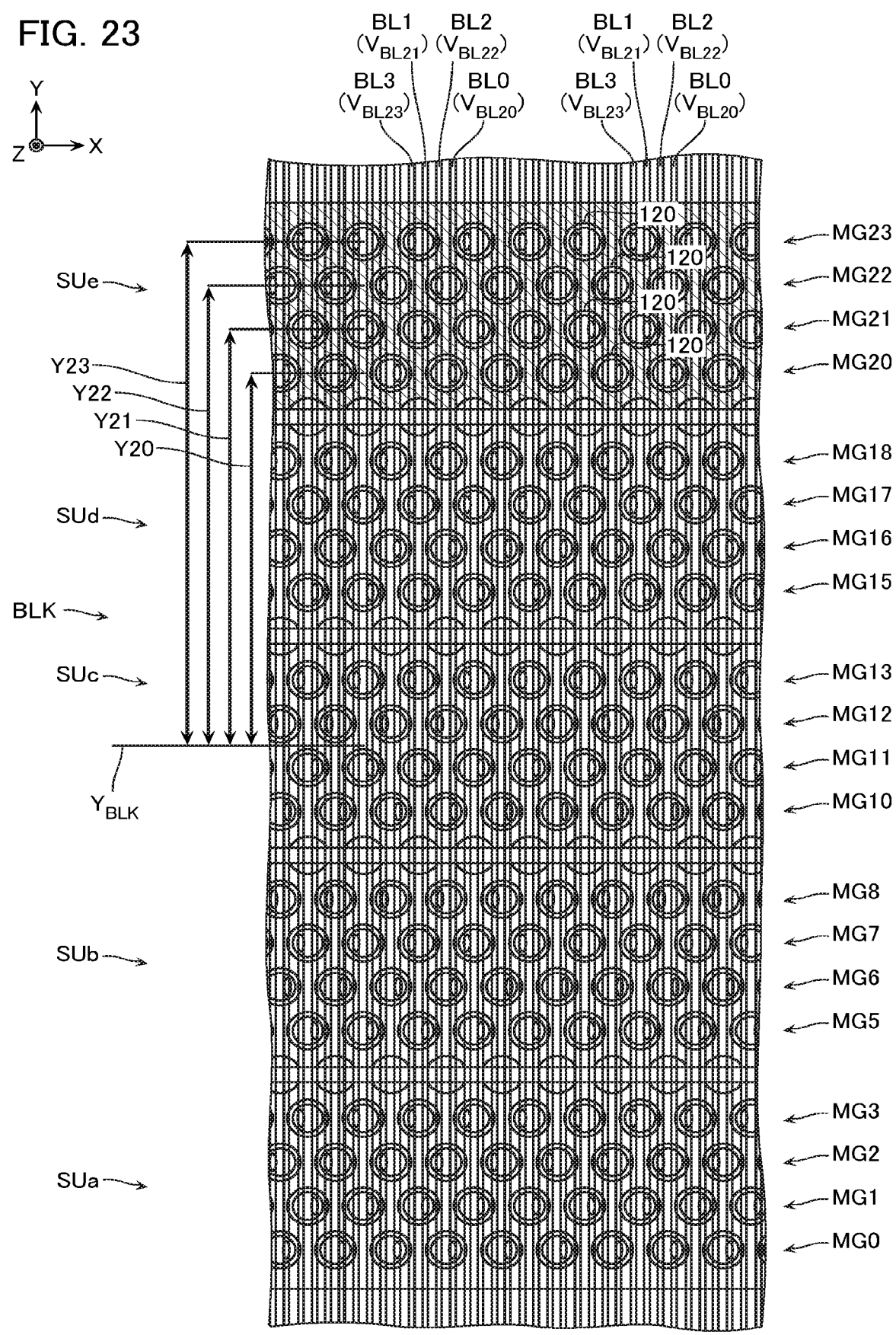
FIG. 23 is a schematic plan view for describing the read operation.

FIG. 23 is a schematic plan view for describing the case in which the read operation is executed on the selected page PG corresponding to the string unit SUe.

In FIG. 23, a distance in the Y-direction between the center position $Y_{BLK}$ in the Y-direction of the memory block BLK and the center position in the Y-direction of the semiconductor layer 120 belonging to the memory group MG23 is illustrated as a distance Y23. A distance in the Y-direction between the center position $Y_{BLK}$ in the Y-direction of the memory block BLK and the center position in the Y-direction of the semiconductor layer 120 belonging to the memory group MG22 is illustrated as a distance Y22. A distance in the Y-direction between the center position $Y_{RT}$ in the Y-direction of the memory block BLK and the center position in the Y-direction of the semiconductor layer 120 belonging to the memory group MG21 is illustrated as a distance Y21. A distance in the Y-direction between the center position $Y_{BLK}$ in the Y-direction of the memory block BLK and the center position in the Y-direction of the semiconductor layer 120 belonging to the memory group MG20 is illustrated as a distance Y20.

Note that the distance Y23 is larger than the distance Y22. The distance Y22 is larger than the distance Y21. The distance Y21 is larger than the distance Y20.

As described above, the closer to the center position $Y_{BLK}$ in the Y-direction of the memory block BLK the memory groups MG are positioned, the larger the contact resistances between the semiconductor layers 120 and the semiconductor layer 113 in the memory groups MG are, and the farther from the center position $Y_{BLK}$ in the Y-direction of the memory block BLK the memory groups MG are positioned, the smaller the contact resistances between the semiconductor layers 120 and the semiconductor layer 113 in the memory groups MG are. Accordingly, in the memory groups MG23 to MG20, the contact resistance corresponding to the memory group MG23 is the smallest and the contact resistance corresponding to the memory group MG20 is the largest.

As described above, in the embodiment, the resistance values of the variable resistor circuits VR (FIG. 1) are set so as to reduce the variation of the above-described contact resistances. For example, the resistance value of the variable resistor circuit VR corresponding to the bit line BL3 is assumed to be a resistance value R23. The resistance value of the variable resistor circuit VR corresponding to the bit line BL2 is assumed to be a resistance value R22. The resistance value of the variable resistor circuit VR corresponding to the bit line BL1 is assumed to be a resistance value R21. The resistance value of the variable resistor circuit VR corresponding to the bit line BL0 is assumed to be a resistance value R20. In such a case, the resistance value R23 is larger than the resistance value R22. The resistance value R22 is larger than the resistance value R21. The resistance value R21 is larger than the resistance value R20.

In such a state, the closer memory groups MG to the center position $Y_{BLK}$ in the Y-direction of the memory block BLK the bit lines BL are connected to, the larger the voltage values of the bit lines become. The farther memory groups MG from the center position $Y_{BLK}$ in the Y-direction of the memory block BLK the bit lines BL are connected to, the smaller the voltage values of the bit lines become. For example, in the illustrated example, the voltage value of the bit line BL3 is assumed to be a voltage value $V_{BL23}$. The voltage value of the bit line BL2 is assumed to be a voltage value $V_{BL22}$. The voltage value of the bit line BL1 is assumed to be a voltage value $V_{BL21}$. The voltage value of the bit line BL0 is assumed to be a voltage value $V_{BL20}$. In this case, the voltage value $V_{BL23}$ of the bit line BL3 is smaller than the voltage value $V_{BL22}$ of the bit line BL2. The voltage value $V_{BL22}$ of the bit line BL2 is smaller than the voltage value $V_{BL21}$ of the bit line BL1. The voltage value $V_{BL21}$ of the bit line BL1 is smaller than the voltage value $V_{BL20}$ of the bit line BL0.

Figure 24:
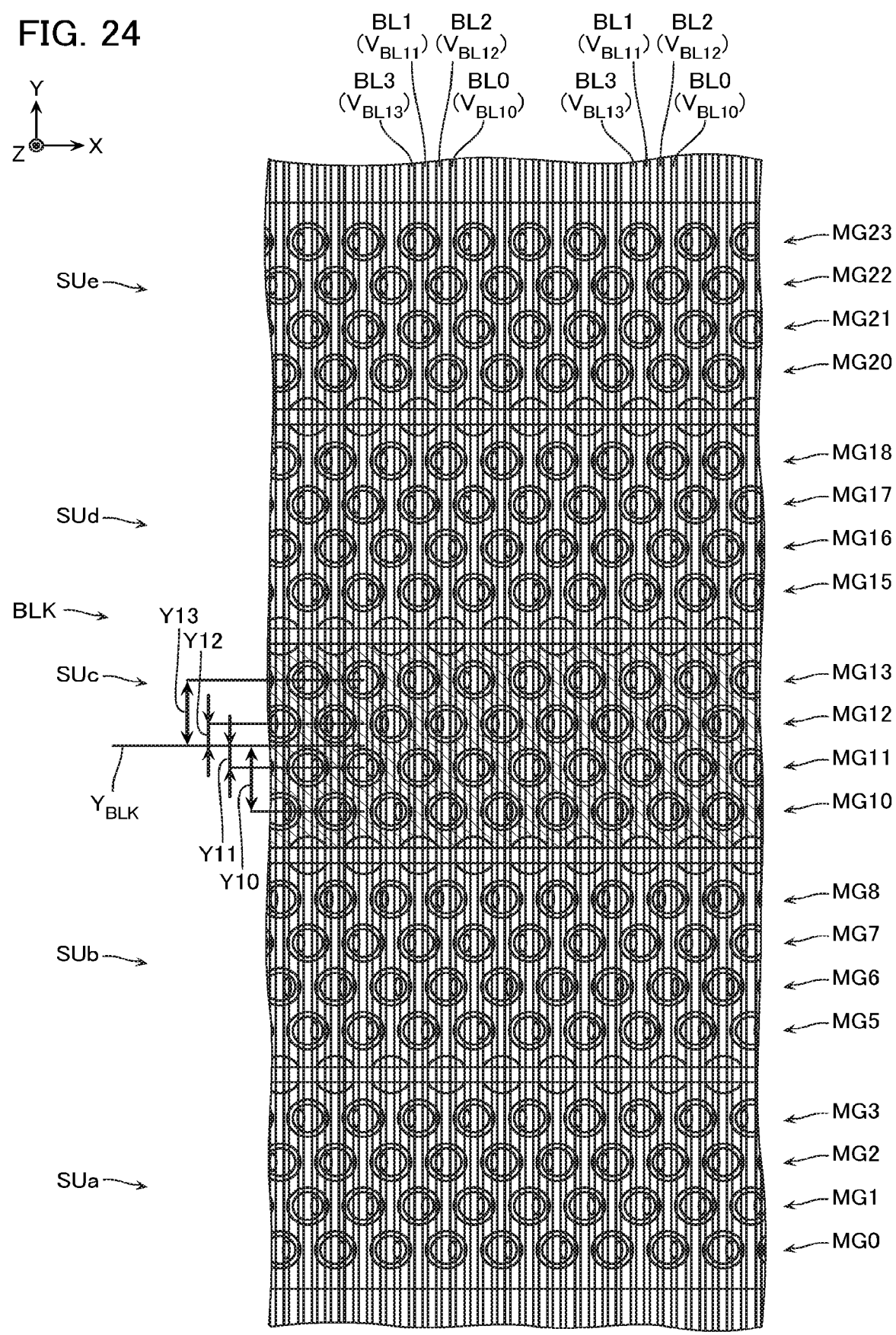
FIG. 24 is a schematic plan view for describing the read operation.

FIG. 24 is a schematic plan view for describing a case where the read operation is executed on the selected page PG corresponding to the string unit SUc.

In FIG. 24, a distance in the Y-direction between the center position $Y_{BLK}$ in the Y-direction of the memory block BLK and the center position in the Y-direction of the semiconductor layer 120 belonging to the memory group MG13 is illustrated as a distance Y13. A distance in the Y-direction between the center position $Y_{BLK}$ in the Y-direction of the memory block BLK and the center position in the Y-direction of the semiconductor layer 120 belonging to the memory group MG12 is illustrated as a distance Y12. A distance in the Y-direction between the center position $Y_{BLK}$ in the Y-direction of the memory block BLK and the center position in the Y-direction of the semiconductor layer 120 belonging to the memory group MG11 is illustrated as a distance Y11. A distance in the Y-direction between the center position $Y_{BLK}$ in the Y-direction of the memory block BLK and the center position in the Y-direction of the semiconductor layer 120 belonging to the memory group MG10 is illustrated as a distance Y10.

Note that the distance Y13 is approximately the same as the distance Y10. The distance Y12 is approximately the same as the distance Y11. The distance Y10 and the distance Y13 are larger than the distance Y11 and the distance Y12. Note that the distances Y10 to Y13 are smaller than the distances Y20 to Y23 (FIG. 23).

In the memory groups MG13 to MG10, the contact resistances corresponding to the memory groups MG13 and MG10 are smaller than the contact resistances corresponding to the memory groups MG12 and MG11. Note that the contact resistances corresponding to the memory groups MG13 to MG10 are larger than the contact resistances corresponding to the memory groups MG23 to MG20.

For example, the resistance value of the variable resistor circuit VR corresponding to the bit line BL3 is assumed to be a resistance value R13. The resistance value of the variable resistor circuit VR corresponding to the bit line BL2 is assumed to be a resistance value R12. The resistance value of the variable resistor circuit VR corresponding to the bit line BL1 is assumed to be a resistance value R11. The resistance value of the variable resistor circuit VR corresponding to the bit line BL0 is assumed to be a resistance value R10. In this case, the resistance value R13 is approximately the same as the resistance value R10. The resistance value R12 is approximately the same as the resistance value R11. The resistance value R10 and the resistance value R13 are larger than the resistance value R11 and the resistance value R12. Note that the resistance value R10 to R13 are smaller than the resistance value R20 to R23.

For example, in the illustrated example, the voltage value of the bit line BL3 is assumed to be a voltage value $V_{BL13}$. The voltage value of the bit line BL2 is assumed to be a voltage value $V_{BL12}$. The voltage value of the bit line BL1 is assumed to be a voltage value $V_{BL11}$. The voltage value of the bit line BL0 is assumed to be a voltage value $V_{BL10}$. In this case, the voltage value $V_{BL13}$ is approximately the same as the voltage value $V_{BL10}$. The voltage value $V_{BL12}$ is approximately the same as the voltage value $V_{BL11}$. The voltage value $V_{BL10}$ and the voltage value $V_{BL13}$ are smaller than the voltage value $V_{BL11}$ and the voltage value $V_{BL12}$. Note that the voltage values $V_{BL10}$ to $V_{BL13}$ are larger than the voltage values $V_{BL20}$ to $V_{BL23}$.

Note that, in the following description, when the read operation is executed on the selected page PG corresponding to the string unit SUa, the resistance value of the variable resistor circuit VR corresponding to the bit line BL3 is assumed to be a resistance value R3. The resistance value of the variable resistor circuit VR corresponding to the bit line BL2 is assumed to be a resistance value R2. The resistance value of the variable resistor circuit VR corresponding to the bit line BL1 is assumed to be a resistance value R1. The resistance value of the variable resistor circuit VR corresponding to the bit line BL0 is assumed to be a resistance value R0.

When the read operation is executed on the selected page PG corresponding to the string unit SUb, the resistance value of the variable resistor circuit VR corresponding to the bit line BL3 is assumed to be a resistance value R8. The resistance value of the variable resistor circuit VR corresponding to the bit line BL2 is assumed to be a resistance value R7. The resistance value of the variable resistor circuit VR corresponding to the bit line BL1 is assumed to be a resistance value R6. The resistance value of the variable resistor circuit VR corresponding to the bit line BL0 is assumed to be a resistance value R5.

When the read operation is executed on the selected page PG corresponding to the string unit SUd, the resistance value of the variable resistor circuit VR corresponding to the bit line BL3 is assumed to be a resistance value R18. The resistance value of the variable resistor circuit VR corresponding to the bit line BL2 is assumed to be a resistance value R17. The resistance value of the variable resistor circuit VR corresponding to the bit line BL1 is assumed to be a resistance value R16. The resistance value of the variable resistor circuit VR corresponding to the bit line BL0 is assumed to be a resistance value R15.

[Exemplary Configuration of Variable Resistor Module VRM]

Next, with reference to FIG. 25 to FIG. 29, an exemplary configuration of the variable resistor module VRM according to the embodiment will be described. The following exemplarily describes variable resistor modules VRM1 to VRM5 as exemplary configurations of the variable resistor module VRM.

[Variable Resistor Module VRM1]

Figure 25:
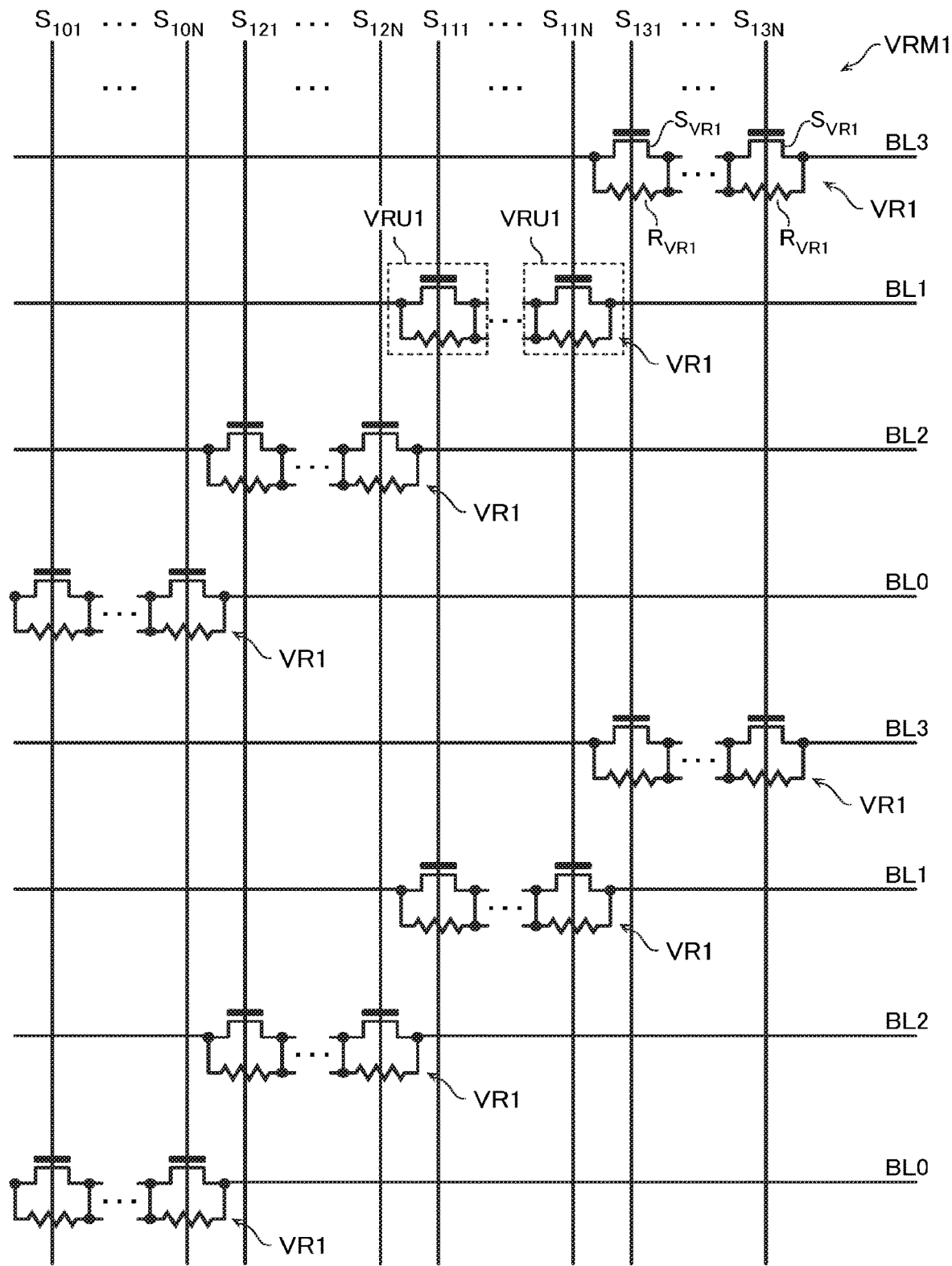
FIG. 25 is a schematic circuit diagram illustrating a configuration of a variable resistor module VRM1.

FIG. 25 is a schematic circuit diagram illustrating a configuration of a variable resistor module VRM1. In the example in FIG. 25, a plurality of variable resistor circuits VR1 included in the variable resistor module VRM1 are disposed in current paths between the bit lines BL and the sense amplifier module SAM (FIG. 1).

The variable resistor module VRM1 includes the plurality of variable resistor circuits VR1. The plurality of variable resistor circuits VR1 include a plurality of respective variable resistor units VRU1 connected in series between the bit line BL and sense amplifier module SAM (FIG. 1). The plurality of variable resistor units VRU1 include respective transistors $S_{VR1}$ and resistor elements $R_{VR1}$. The transistor $S_{VR1}$ has a drain electrode electrically connected to the bit line BL. The transistor $S_{VR1}$ has a source electrode electrically connected to the sense amplifier module SAM (FIG. 1). The resistor element $R_{VR1}$ is electrically connected between the source electrode and the drain electrode of the transistor $S_{VR1}$. Note that the plurality of resistor elements $R_{VR1}$ included in each of the variable resistor circuits VR1 may each have a different resistance value.

The variable resistor module VRM1 includes a plurality of signal lines $S_{101}$ to $S_{10N}$, $S_{111}$ to $S_{11N}$, $S_{121}$ to $S_{12N}$, and $S_{131}$ to $S_{13N}$.

The signal lines $S_{101}$ to $S_{10N}$ are connected to the plurality of variable resistor circuits VR1 corresponding to the plurality of bit lines BL0 in common. The gate electrodes of the plurality of transistors $S_{VR1}$ included in such variable resistor circuits VR1 are each connected to any of the plurality of signal lines $S_{101}$ to $S_{10N}$. In the read operation, for example, respective voltages of the signal lines $S_{101}$ to $S_{10N}$ are set to the "H" state or the "L" state corresponding to respective bits of binary data corresponding to the resistance values R0, R5, R10, R15, and R20. This sets the resistance values of the plurality of variable resistor circuits VR1 corresponding to the plurality of bit lines BL0.

The signal lines $S_{111}$ to $S_{11N}$ are connected to the plurality of variable resistor circuits VR1 corresponding to the plurality of bit lines BL1 in common. The gate electrodes of the plurality of transistors $S_{VR1}$ included in such variable resistor circuits VR1 are each connected to any of the plurality of signal lines $S_{111}$ to $S_{11N}$. In the read operation, for example, respective voltages of the signal lines $S_{111}$ to $S_{11N}$ are set to the "H" state or the "L" state corresponding to respective bits of binary data corresponding to the resistance values R1, R6, R11, R16, and R21. This sets the resistance values of the plurality of variable resistor circuits VR1 corresponding to the plurality of bit lines BL1.

The signal lines $S_{121}$ to $S_{12N}$ are connected to the plurality of variable resistor circuits VR1 corresponding to the plurality of bit lines BL2 in common. The gate electrodes of the plurality of transistors $S_{VR1}$ included in such variable resistor circuits VR1 are each connected to any of the plurality of signal lines $S_{121}$ to $S_{12N}$. In the read operation, for example, respective voltages of the signal lines $S_{121}$ to $S_{12N}$ are set to the "H" state or the "L" state corresponding to respective bits of binary data corresponding to the resistance values R2, R7, R12, R17, and R22. This sets the resistance values of the plurality of variable resistor circuits VR1 corresponding to the plurality of bit lines BL2.

The signal lines $S_{131}$ to $S_{13N}$ are connected to the plurality of variable resistor circuits VR1 corresponding to the plurality of bit lines BL3 in common. The gate electrodes of the plurality of transistors $S_{VR1}$ included in such variable resistor circuits VR1 are each connected to any of the plurality of signal lines $S_{131}$ to $S_{13N}$. In the read operation, for example, respective voltages of the signal lines $S_{131}$ to $S_{13N}$ are set to the "H" state or the "L" state corresponding to respective bits of binary data corresponding to the resistance values R3, R8, R13, R18, and R23. This sets the resistance values of the plurality of variable resistor circuits VR1 corresponding to the plurality of bit lines BL3.

[Variable Resistor Module VRM2]

Figure 26:
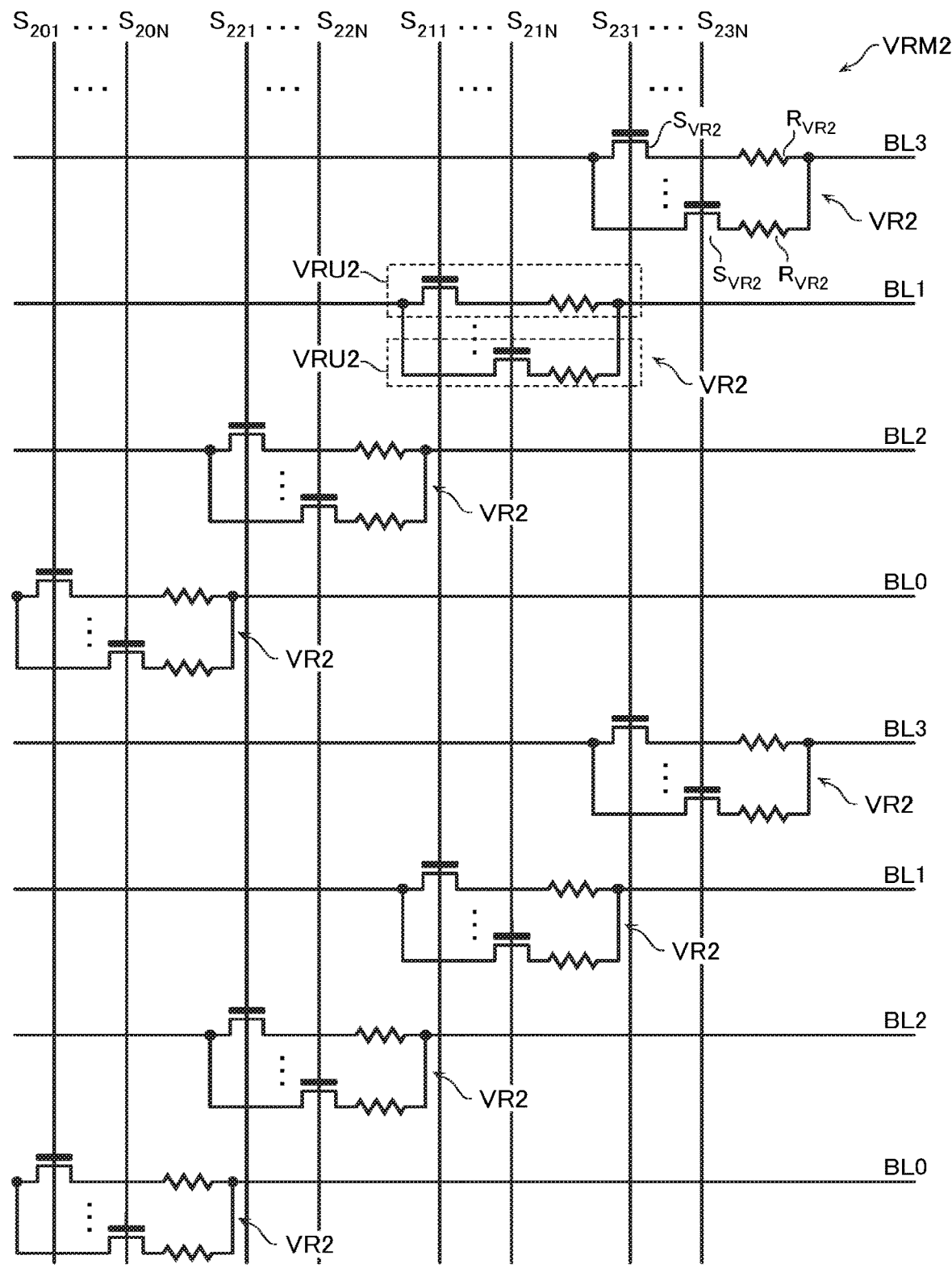
FIG. 26 is a schematic circuit diagram illustrating a configuration of a variable resistor module VRM2.

FIG. 26 is a schematic circuit diagram illustrating a configuration of the variable resistor module VRM2. In the example in FIG. 26, a plurality of variable resistor circuits VR2 included in the variable resistor module VRM2 is disposed in current paths between the bit lines BL and the sense amplifier module SAM (FIG. 1).

The variable resistor module VRM2 includes the plurality of variable resistor circuits VR2. The plurality of variable resistor circuits VR2 include a plurality of respective variable resistor units VRU2 connected in parallel between the bit lines BL and the sense amplifier module SAM (FIG. 1). The plurality of variable resistor units VRU2 include respective transistors $S_{VR2}$ and resistor elements $R_{VR2}$. The transistor $S_{VR2}$ has a drain electrode electrically connected to the bit line BL via the resistor element $R_{VR2}$. The transistor $S_{VR2}$ has a source electrode electrically connected to the sense amplifier module SAM (FIG. 1). Note that the plurality of resistor elements $R_{VR2}$ included in each of the variable resistor circuits VR2 may each have a different resistance value.

The variable resistor module VRM2 includes a plurality of signal lines $S_{201}$ to $S_{20N}$, $S_{211}$ to $S_{21N}$, $S_{221}$ to $S_{22N}$, and $S_{231}$ to $S_{23N}$.

The signal lines $S_{201}$ to $S_{20N}$ are connected to the plurality of variable resistor circuits VR2 corresponding to the plurality of bit lines BL0 in common. The gate electrodes of the plurality of transistors $S_{VR2}$ included in such variable resistor circuits VR2 are each connected to any of the plurality of signal lines $S_{201}$ to $S_{20N}$. In the read operation, for example, respective voltages of the signal lines $S_{201}$ to $S_{20N}$ are set to the "H" state or the "L" state corresponding to respective bits of binary data corresponding to the resistance values R0, R5, R10, R15, and R20. This sets the resistance values of the plurality of variable resistor circuits VR2 corresponding to the plurality of bit lines BL0.

The signal lines $S_{211}$ to $S_{21N}$ are connected to the plurality of variable resistor circuits VR2 corresponding to the plurality of bit lines BL1 in common. The gate electrodes of the plurality of transistors $S_{VR2}$ included in such variable resistor circuits VR2 are each connected to any of the plurality of signal lines $S_{211}$ to $S_{21N}$. In the read operation, for example, respective voltages of the signal lines $S_{211}$ to $S_{21N}$ are set to the "H" state or the "L" state corresponding to respective bits of binary data corresponding to the resistance values R1, R6, R11, R16, and R21. This sets the resistance values of the plurality of variable resistor circuits VR2 corresponding to the plurality of bit lines BL1.

The signal lines $S_{221}$ to $S_{22N}$ are connected to the plurality of variable resistor circuits VR2 corresponding to the plurality of bit lines BL2 in common. The gate electrodes of the plurality of transistors $S_{VR2}$ included in such variable resistor circuits VR2 are each connected to any of the plurality of signal lines $S_{221}$ to $S_{22N}$. In the read operation, for example, respective voltages of the signal lines $S_{221}$ to $S_{22N}$ are set to the "H" state or the "L" state corresponding to respective bits of binary data corresponding to the resistance values R2, R7, R12, R17, and R22. This sets the resistance values of the plurality of variable resistor circuits VR2 corresponding to the plurality of bit lines BL2.

The signal lines $S_{231}$ to $S_{23N}$ are connected to the plurality of variable resistor circuits VR2 corresponding to the plurality of bit lines BL3 in common. The gate electrodes of the plurality of transistors $S_{VR2}$ included in such variable resistor circuits VR2 are each connected to any of the plurality of signal lines $S_{231}$ to $S_{23N}$. In the read operation, for example, respective voltages of the signal lines $S_{231}$ to $S_{23N}$ are set to the "H" state or the "L" state corresponding to respective bits of binary data corresponding to the resistance values R3, R8, R13, R18, and R23. This sets the resistance values of the plurality of variable resistor circuits VR2 corresponding to the plurality of bit lines BL3.

[Variable Resistor Module VRM3]

Figure 27:
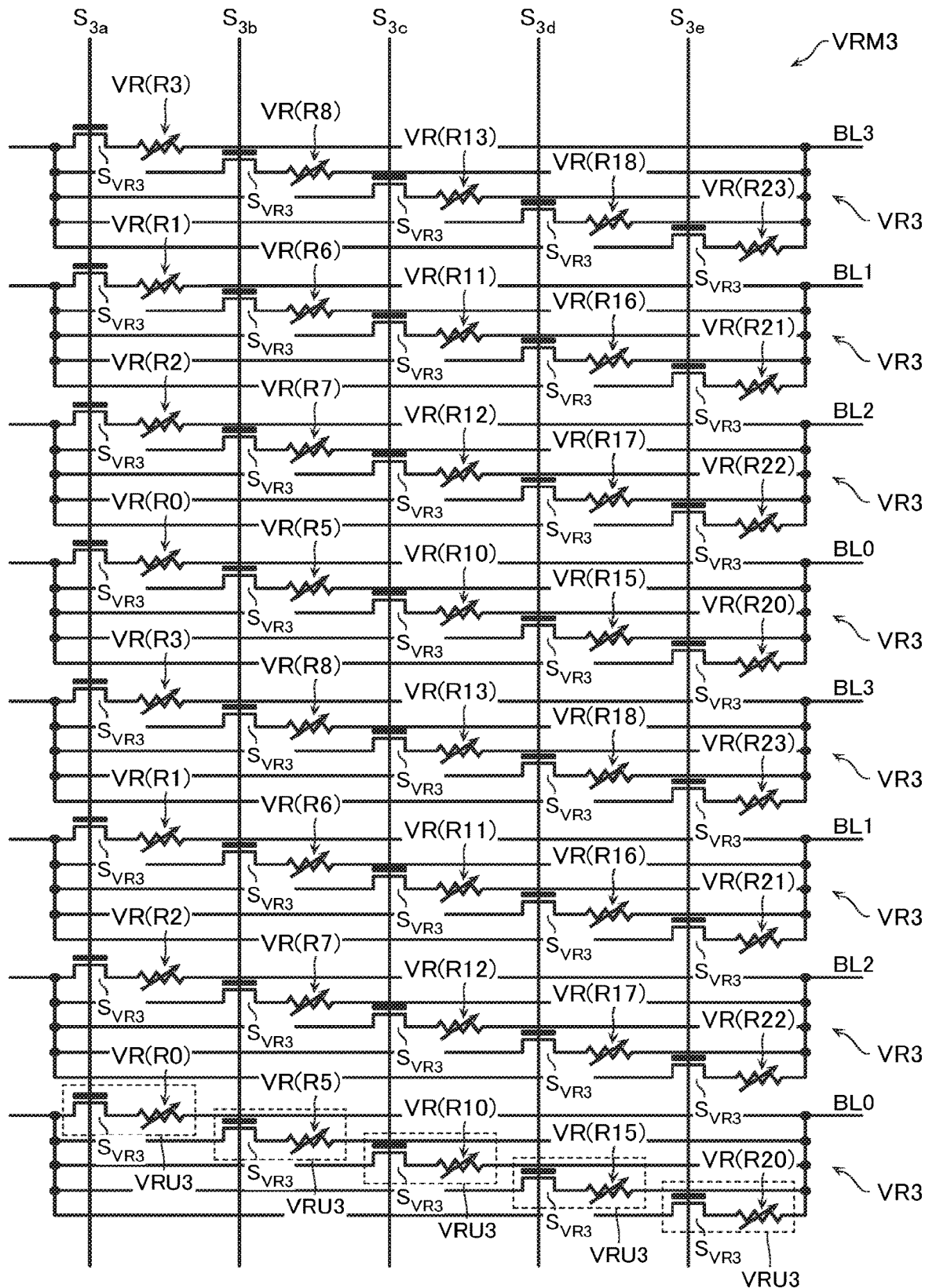
FIG. 27 is a schematic circuit diagram illustrating a configuration of a variable resistor module VRM3.

FIG. 27 is a schematic circuit diagram illustrating a configuration of the variable resistor module VRM3. In the example in FIG. 27, a plurality of variable resistor circuits VR3 included in the variable resistor module VRM3 is disposed in current paths between the bit lines BL and the sense amplifier module SAM (FIG. 1).

The variable resistor module VRM3 includes the plurality of variable resistor circuits VR3. The plurality of variable resistor circuits VR3 each include five variable resistor units VRU3 connected in parallel between the bit line BL and the sense amplifier module SAM (FIG. 1). The five variable resistor units VRU3 each include a transistor $S_{VR3}$ and the variable resistor circuit VR. The transistor $S_{VR3}$ has a drain electrode electrically connected to the bit line BL via the variable resistor circuit VR. The transistor $S_{VR3}$ has a source electrode electrically connected to the sense amplifier module SAM (FIG. 1). The variable resistor circuit VR may be the variable resistor circuit VR1 described with reference to FIG. 25, may be the variable resistor circuit VR2 described with reference to FIG. 26, or may be a variable resistor circuit having another configuration.

The resistance values of the five variable resistor circuits VR of the variable resistor circuit VR3 corresponding to the bit line BL0 are controlled to the respective resistance values R0, R5, R10, R15, and R20.

The resistance values of the five variable resistor circuits VR of the variable resistor circuit VR3 corresponding to the bit line BL1 are controlled to the respective resistance values R1, R6, R11, R16, and R21.

The resistance values of the five variable resistor circuits VR of the variable resistor circuit VR3 corresponding to the bit line BL2 are controlled to the respective resistance values R2, R7, R12, R17, and R22.

The resistance values of the five variable resistor circuits VR of the variable resistor circuit VR3 corresponding to the bit line BL3 are controlled to the respective resistance values R3, R8, R13, R18, and R23.

The variable resistor module VRM3 includes a plurality of signal lines $S_{3a}$, $S_{3b}$, $S_{3c}$, $S_{3d}$, and $S_{3e}$.

The signal lines $S_{3a}$, $S_{3b}$, $S_{3c}$, $S_{3d}$, and $S_{3e}$ are connected to the plurality of variable resistor circuits VR3 in common. The plurality of transistors $S_{VR3}$ included in the variable resistor circuit VR3 have gate electrodes each connected to any of the plurality of signal lines $S_{3a}$, $S_{3b}$, $S_{3c}$, $S_{3d}$, and $S_{3e}$.

In the read operation of the string unit SUa, for example, the voltage of the signal line $S_{3a}$ is set to the "H" state and the voltages of the rest of the signal lines $S_{3b}$, $S_{3c}$, $S_{3d}$, and $S_{3e}$ are set to the "L" state. This causes the resistance values of the plurality of variable resistor circuits VR3 corresponding to the plurality of bit lines BL0 to be the resistance value R0. The resistance values of the plurality of variable resistor circuits VR3 corresponding to the plurality of bit lines BL1 are controlled to be the resistance value R1. The resistance values of the plurality of variable resistor circuits VR3 corresponding to the plurality of bit lines BL2 are controlled to be the resistance value R2. The resistance values of the plurality of variable resistor circuits VR3 corresponding to the plurality of bit lines BL3 are controlled to be the resistance value R3.

In the read operation of the string unit SUb, for example, the voltage of the signal line $S_{3b}$ is set to the "H" state and the voltages of the rest of the signal lines $S_{3a}$, $S_{3c}$, $S_{3d}$, and $S_{3e}$ are set to the "L" state. This causes the resistance values of the plurality of variable resistor circuits VR3 corresponding to the plurality of bit lines BL0 to be the resistance value R5. The resistance values of the plurality of variable resistor circuits VR3 corresponding to the plurality of bit lines BL1 are controlled to be the resistance value R6. The resistance values of the plurality of variable resistor circuits VR3 corresponding to the plurality of bit lines BL2 are controlled to be the resistance value R7. The resistance values of the plurality of variable resistor circuits VR3 corresponding to the plurality of bit lines BL3 are controlled to be the resistance value R8.

Similarly, in the read operation of the string unit SUc, the voltage of the signal line $S_{3c}$ is set to the "H" state. This causes the resistance values of the plurality of variable resistor circuits VR3 corresponding to the bit lines BL0 to BL3 to be the resistance values R10 to R13. In the read operation of the string unit SUd, the voltage of the signal line $S_{3d}$ is set to the "H" state. This causes the resistance values of the plurality of variable resistor circuits VR3 corresponding to the bit lines BL0 to BL3 to be the resistance values R15 to R18. In the read operation of the string unit SUe, the voltage of the signal line $S_{3e}$ is set to the "H" state. This causes the resistance values of the plurality of variable resistor circuits VR3 corresponding to the bit lines BL0 to BL3 to be the resistance values R20 to R23.

[Variable Resistor Module VRM4]

Figure 28:
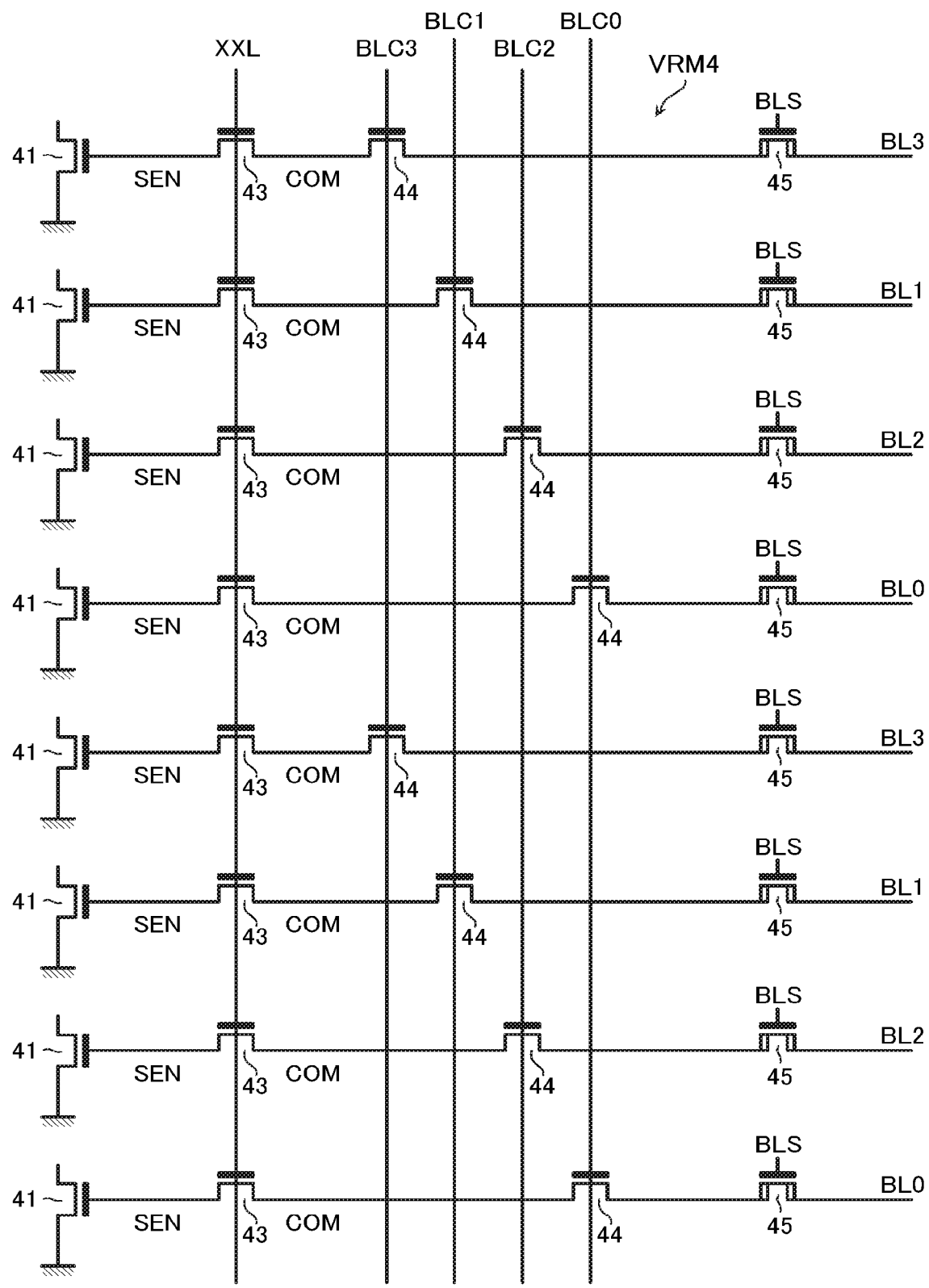
FIG. 28 is a schematic circuit diagram illustrating a configuration of a variable resistor module VRM4.

FIG. 28 is a schematic circuit diagram illustrating a configuration of a variable resistor module VRM4. In the example in FIG. 28, the plurality of variable resistor circuits VR included in the variable resistor module VRM4 is disposed in the sense amplifier module SAM (FIG. 1). That is, in the example in FIG. 28, the clamp transistor 44 described with reference to FIG. 3 is used as the variable resistor circuit VR.

In the example in FIG. 28, as the above-described signal line BLC, four signal lines BLC0 to BLC3 are employed.

The signal line BLC0 is connected to the gate electrodes of a plurality of the clamp transistors 44 corresponding to the plurality of bit lines BL0 in common. In the read operation, for example, the voltage value of the signal line BLC0 is set to magnitudes corresponding to the resistance values R0, R5, R10, R15, and R20. This sets the resistance values of the plurality of clamp transistors 44 corresponding to the plurality of bit lines BL0.

The signal line BLC1 is connected to the gate electrodes of a plurality of the clamp transistors 44 corresponding to the plurality of bit lines BL1 in common. In the read operation, for example, the voltage value of the signal line BLC1 is set to magnitudes corresponding to the resistance values R1, R6, R11, R16, and R21. This sets the resistance values of the plurality of clamp transistors 44 corresponding to the plurality of bit lines BL1.

The signal line BLC2 is connected to the gate electrodes of a plurality of the clamp transistors 44 corresponding to the plurality of bit lines BL2 in common. In the read operation, for example, the voltage value of the signal line BLC2 is set to magnitudes corresponding to the resistance values R2, R7, R12, R17, and R22. This sets the resistance values of the plurality of clamp transistors 44 corresponding to the plurality of bit lines BL2.

The signal line BLC3 is connected to the gate electrodes of a plurality of the clamp transistors 44 corresponding to the plurality of bit lines BL3 in common. In the read operation, for example, the voltage value of the signal line BLC3 is set to magnitudes corresponding to the resistance values R3, R8, R13, R18, and R23. This sets the resistance values of the plurality of clamp transistors 44 corresponding to the plurality of bit lines BL3.

[Variable Resistor Module VRM5]

Figure 29:
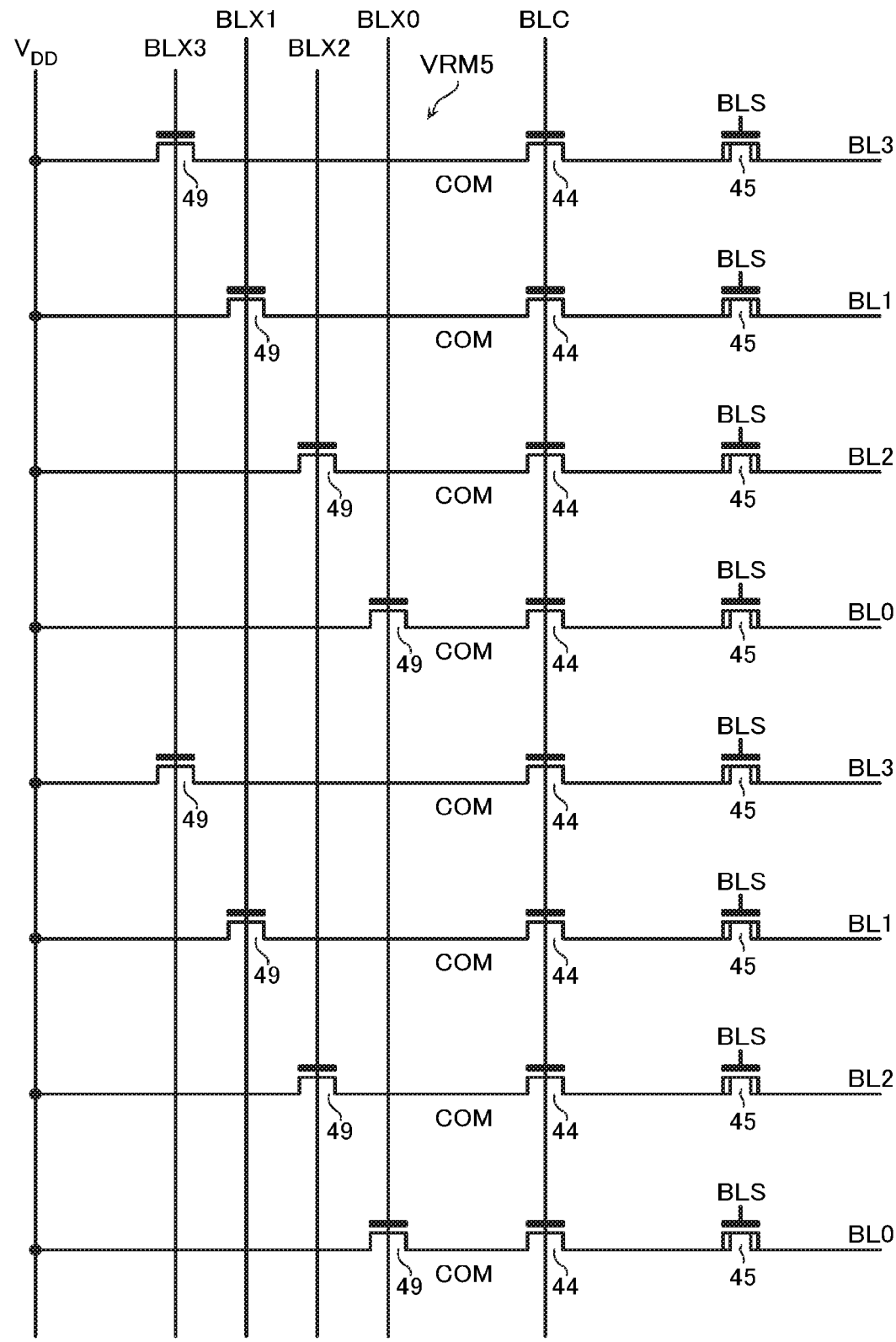
FIG. 29 is a schematic circuit diagram illustrating a configuration of a variable resistor module VRM5.

FIG. 29 is a schematic circuit diagram illustrating a configuration of a variable resistor module VRM5. In the example in FIG. 29, the plurality of variable resistor circuits VR included in the variable resistor module VRM5 is disposed in the sense amplifier module SAM (FIG. 1). That is, in the example in FIG. 29, the charge transistor 49 described with reference to FIG. 3 is used as the variable resistor circuit VR.

In the example in FIG. 29, as the above-described signal line BLX, four signal lines BLX0 to BLX3 are employed.

The signal line BLX0 is connected to the gate electrodes of a plurality of the charge transistors 49 corresponding to the plurality of bit lines BL0 in common. In the read operation, for example, the voltage value of the signal line BLX0 is set to magnitudes corresponding to the resistance values R0, R5, R10, R15, and R20. This sets the resistance values of the plurality of charge transistors 49 corresponding to the plurality of bit lines BL0.

The signal line BLX1 is connected to the gate electrodes of a plurality of the charge transistors 49 corresponding to the plurality of bit lines BL1 in common. In the read operation, for example, the voltage value of the signal line BLX1 is set to magnitudes corresponding to the resistance values R1, R6, R11, R16, and R21. This sets the resistance values of the plurality of charge transistors 49 corresponding to the plurality of bit lines BL1.

The signal line BLX2 is connected to the gate electrodes of a plurality of the charge transistors 49 corresponding to the plurality of bit lines BL2 in common. In the read operation, for example, the voltage value of the signal line BLX2 is set to magnitudes corresponding to the resistance values R2, R7, R12, R17, and R22. This sets the resistance values of the plurality of charge transistors 49 corresponding to the plurality of bit lines BL2.

The signal line BLX3 is connected to the gate electrodes of a plurality of the charge transistors 49 corresponding to the plurality of bit lines BL3 in common. In the read operation, for example, the voltage value of the signal line BLX3 is set to magnitudes corresponding to the resistance values R3, R8, R13, R18, and R23. This sets the resistance values of the plurality of charge transistors 49 corresponding to the plurality of bit lines BL3.

Note that, when the variable resistor module VRM5 is employed, for example, four signal lines corresponding to the bit lines BL0, BL1, BL2, and BL3 may be employed as the signal lines HLL (FIG. 3). This allows controlling not only the voltage of the bit line BL but also the charging voltage of the sense node SEN into four patterns.

Second Embodiment

Figure 30:
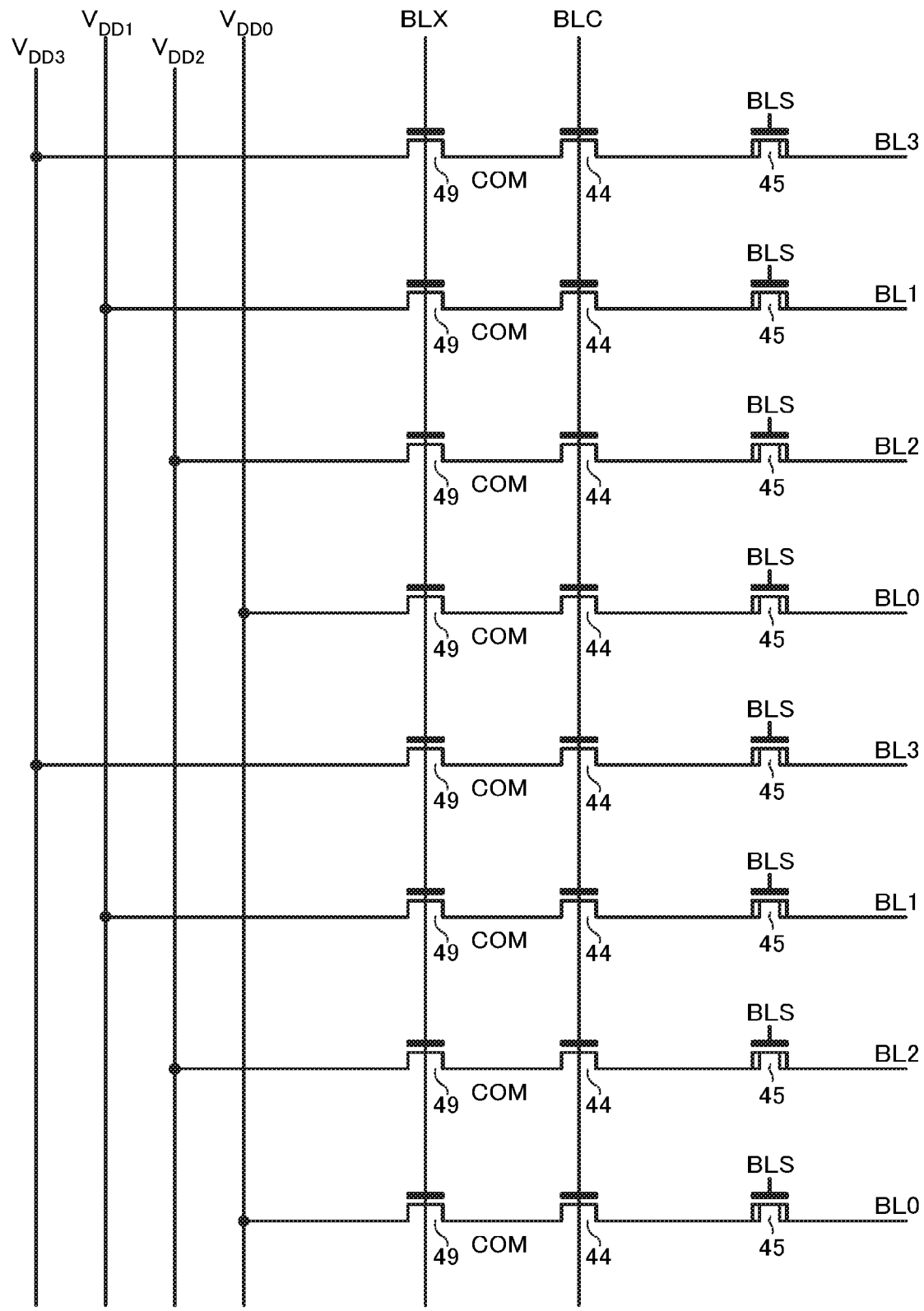
FIG. 30 is a schematic circuit diagram illustrating a configuration of a part of a semiconductor memory device according to a second embodiment.

Next, with reference to FIG. 30, a semiconductor memory device according to a second embodiment will be described. FIG. 30 is a schematic circuit diagram illustrating a configuration of a part of the semiconductor memory device according to the second embodiment.

In the semiconductor memory device according to the first embodiment, the variable resistor module VRM (FIG. 1) is used for adjusting the voltage of the bit line BL. However, such a method is merely an example, and the specific method is appropriately adjustable. For example, the voltage of the bit line BL can be adjusted without using the variable resistor module VRM.

For example, the semiconductor memory device according to the second embodiment is basically configured similarly to the semiconductor memory device according to the first embodiment. However, the semiconductor memory device according to the second embodiment does not include the variable resistor module VRM. In the semiconductor memory device according to the second embodiment, as illustrated in FIG. 30, four voltage supply lines are employed as voltage supply lines that supply the voltage $V_{DD}$ to the sense amplifier SA. The semiconductor memory device according to the second embodiment are configured to be able to supply four patterns of voltages $V_{DD0}$, $V_{DD1}$, $V_{DD2}$, and $V_{DD3}$ different from one another to the four voltage supply lines. The voltage supply line to which the voltage $V_{DD0}$ is supplied is electrically connected to the plurality of bit lines BL0 in common. The voltage supply line to which the voltage $V_{DD1}$ is supplied is electrically connected to the plurality of bit lines BL1 in common. The voltage supply line to which the voltage $V_{DD2}$ is supplied is electrically connected to the plurality of bit lines BL2 in common. The voltage supply line to which the voltage $V_{DD3}$ is supplied is electrically connected to the plurality of bit lines BL3 in common.

In the read operation of the string units SUa and SUb, for example, the voltage $V_{DD0}$ is smaller than the voltage $V_{DD1}$, the voltage $V_{DD1}$ is smaller than the voltage $V_{DD2}$, and the voltage $V_{DD2}$ is smaller than the voltage $V_{DD3}$. In the read operation of the string unit SUc, for example, the voltage $V_{DD0}$ is smaller than the voltage $V_{DD1}$ and the voltage $V_{DD2}$ is larger than the voltage $V_{DD3}$. In the read operation of the string unit SUc, for example, the voltage $V_{DD1}$ may be approximately the same as the voltage $V_{DD2}$. In the read operation of the string units SUd and SUe, for example, the voltage $V_{DD0}$ is larger than the voltage $V_{DD1}$, the voltage $V_{DD1}$ is larger than the voltage $V_{DD2}$, and the voltage $V_{DD2}$ is larger than the voltage $V_{DD3}$.

Note that the voltage $V_{DD3}$ corresponding to the read operation of the string unit SUa is smaller than the voltage $V_{DD0}$ corresponding to the read operation of the string unit SUb. The voltage $V_{DD3}$ corresponding to the read operation of the string unit SUb is smaller than the voltage $V_{DD0}$ corresponding to the read operation of the string unit SUc. The voltage $V_{DD3}$ corresponding to the read operation of the string unit SUc is larger than the voltage $V_{DD0}$ corresponding to the read operation of the string unit SUd. The voltage $V_{DD3}$ corresponding to the read operation of the string unit SUd is larger than the voltage $V_{DD0}$ corresponding to the read operation of the string unit SUe.

Third Embodiment

Figure 31:
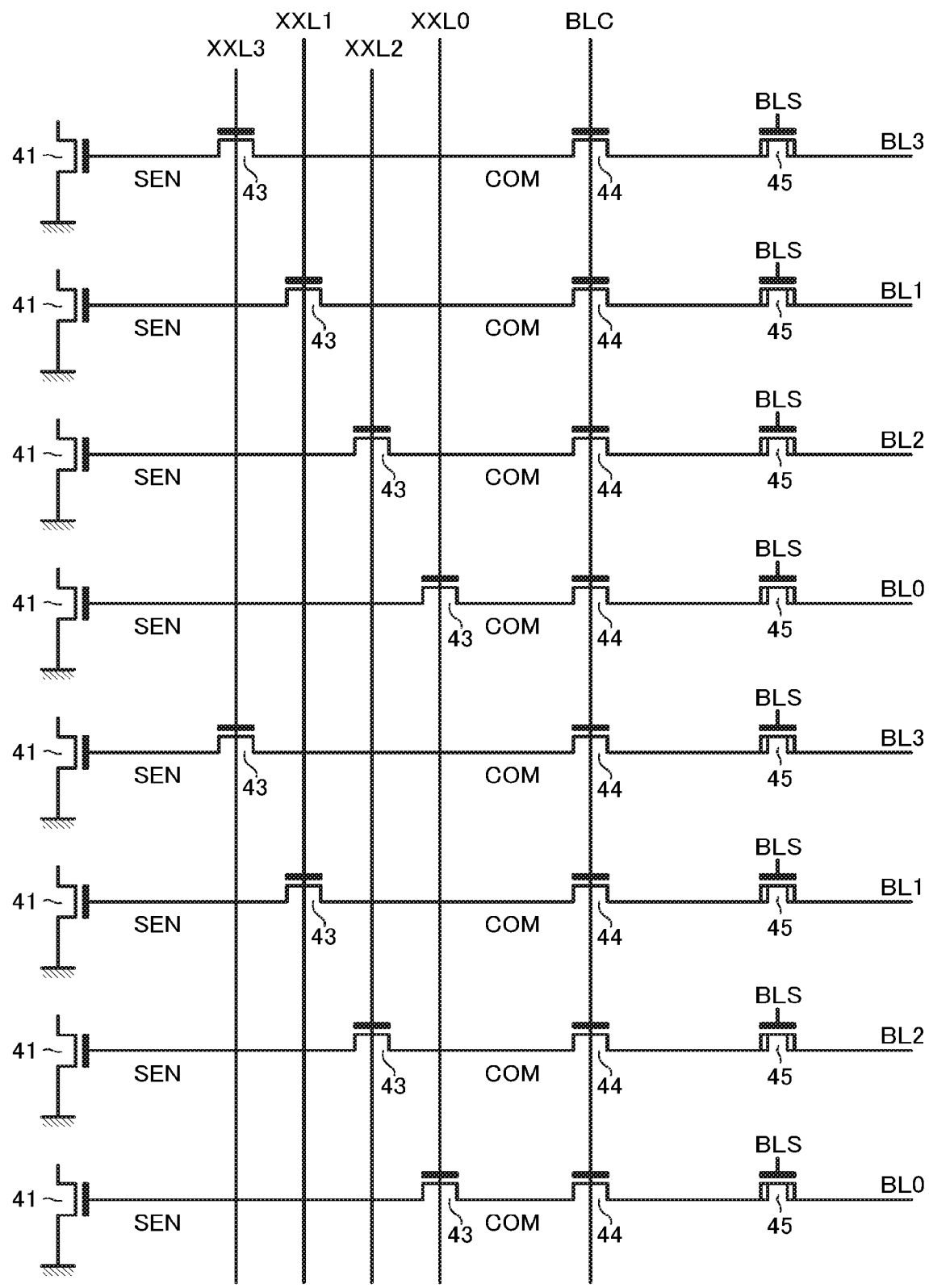
FIG. 31 is a schematic circuit diagram illustrating a configuration of a part of a semiconductor memory device according to a third embodiment.
Figure 32:
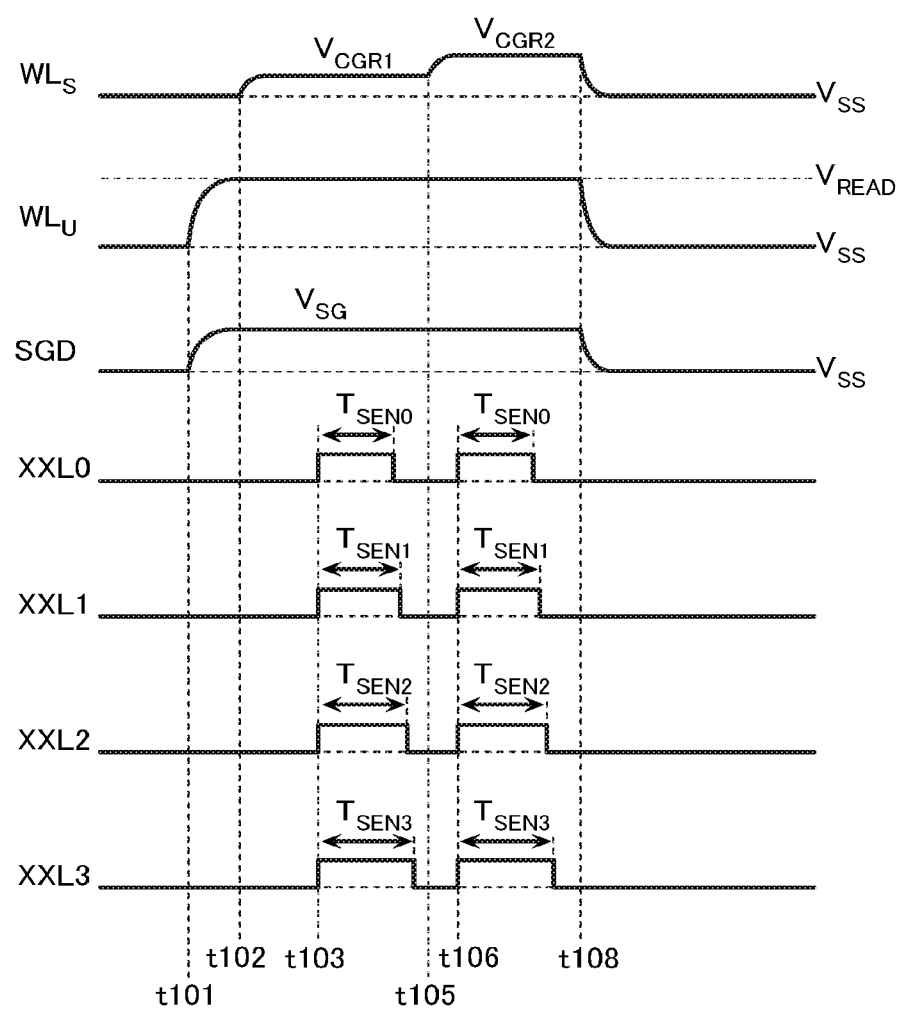
FIG. 32 is a timing chart for describing a read operation according to the third embodiment.

Next, with reference to FIG. 31 and FIG. 32, a semiconductor memory device according to a third embodiment will be described. FIG. 31 is a schematic circuit diagram illustrating a configuration of a part of the semiconductor memory device according to the third embodiment. FIG. 32 is a timing chart for describing a read operation according to the third embodiment.

In the semiconductor memory devices according to the first embodiment and the second embodiment, the control parameter is adjusted in order to reduce the influence of variation of the above-described contact resistance. As such a control parameter, the voltage of the bit line BL is adjusted. However, such a method is merely an example, and the specific method is appropriately adjustable. For example, it is also possible to adjust the control parameter other than the voltage of the bit line BL, and the variation of the above-described contact resistance is reduced by doing this. As such a control parameter, for example, the sense time $T_{SEN}$ (FIG. 22) is included.

For example, the semiconductor memory device according to the third embodiment is basically configured similarly to the semiconductor memory device according to the first embodiment. However, the semiconductor memory device according to the third embodiment does not include the variable resistor module VRM. In the semiconductor memory device according to the third embodiment, as illustrated in FIG. 31, as the above-described signal line XXL, four signal lines XXL0 to XXL3 are employed.

The signal line XXL0 is connected to the gate electrodes of the plurality of discharge transistors 43 corresponding to the plurality of bit lines BL0 in common. The signal line XXL1 is connected to the gate electrodes of the plurality of discharge transistors 43 corresponding to the plurality of bit lines BL1 in common. The signal line XXL2 is connected to the gate electrodes of the plurality of discharge transistors 43 corresponding to the plurality of bit lines BL2 in common. The signal line XXL3 is connected to the gate electrodes of the plurality of discharge transistors 43 corresponding to the plurality of bit lines BL3 in common.

As illustrated in FIG. 32, in the third embodiment, a sense time $T_{SEN0}$ corresponding to the plurality of bit lines BL0, a sense time $T_{SEN1}$ corresponding to the plurality of bit lines BL1, a sense time $T_{SEN2}$ corresponding to the plurality of bit lines BL2, and a sense time $T_{SEN3}$ corresponding to the plurality of bit lines BL3 are different.

In the read operation of the string units SUa and SUb, for example, the sense time $T_{SEN0}$ is shorter than the sense time $T_{SEN1}$, the sense time $T_{SEN1}$ is shorter than the sense time $T_{SEN2}$, and the sense time $T_{SEN2}$ is shorter than the sense time $T_{SEN3}$. In the read operation of the string unit SUc, for example, the sense time $T_{SEN0}$ is shorter than the sense time $T_{SEN1}$ and the sense time $T_{SEN2}$ is longer than the sense time $T_{SEN3}$. In the read operation of the string unit SUc, for example, the sense time $T_{SEN1}$ and the sense time $T_{SEN2}$ may be approximately the same. In the read operation of the string units SUd and SUe, for example, the sense time $T_{SEN0}$ is longer than the sense time $T_{SEN1}$, the sense time $T_{SEN1}$ is longer than the sense time $T_{SEN2}$, and the sense time $T_{SEN2}$ is longer than the sense time $T_{SEN3}$.

Note that the sense time $T_{SEN3}$ corresponding to the read operation of the string unit SUa is shorter than the sense time $T_{SEN0}$ corresponding to the read operation of the string unit SUb. The sense time $T_{SEN3}$ corresponding to the read operation of the string unit SUb is shorter than the sense time $T_{SEN0}$ corresponding to the read operation in the string unit SUc. The sense time $T_{SEN3}$ corresponding to the read operation of the string unit SUc is longer than the sense time $T_{SEN0}$ corresponding to the read operation of the string unit SUd. The sense time $T_{SEN3}$ corresponding to the read operation of the string unit SUd is longer than the sense time $T_{SEN0}$ corresponding to the read operation of the string unit SUe.

Fourth Embodiment

Figure 33:
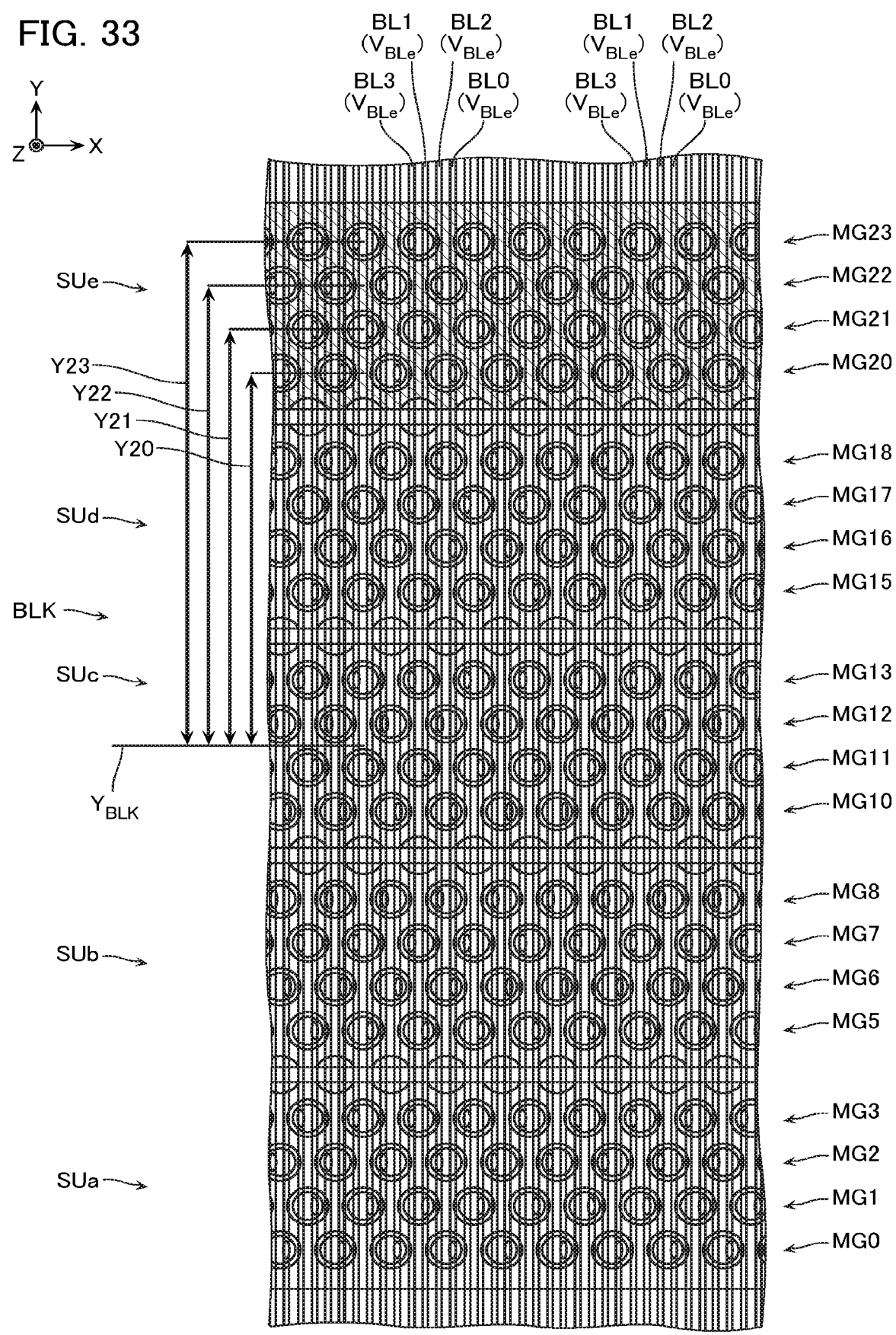
FIG. 33 is a schematic plan view for describing a read operation according to a fourth embodiment.
Figure 34:
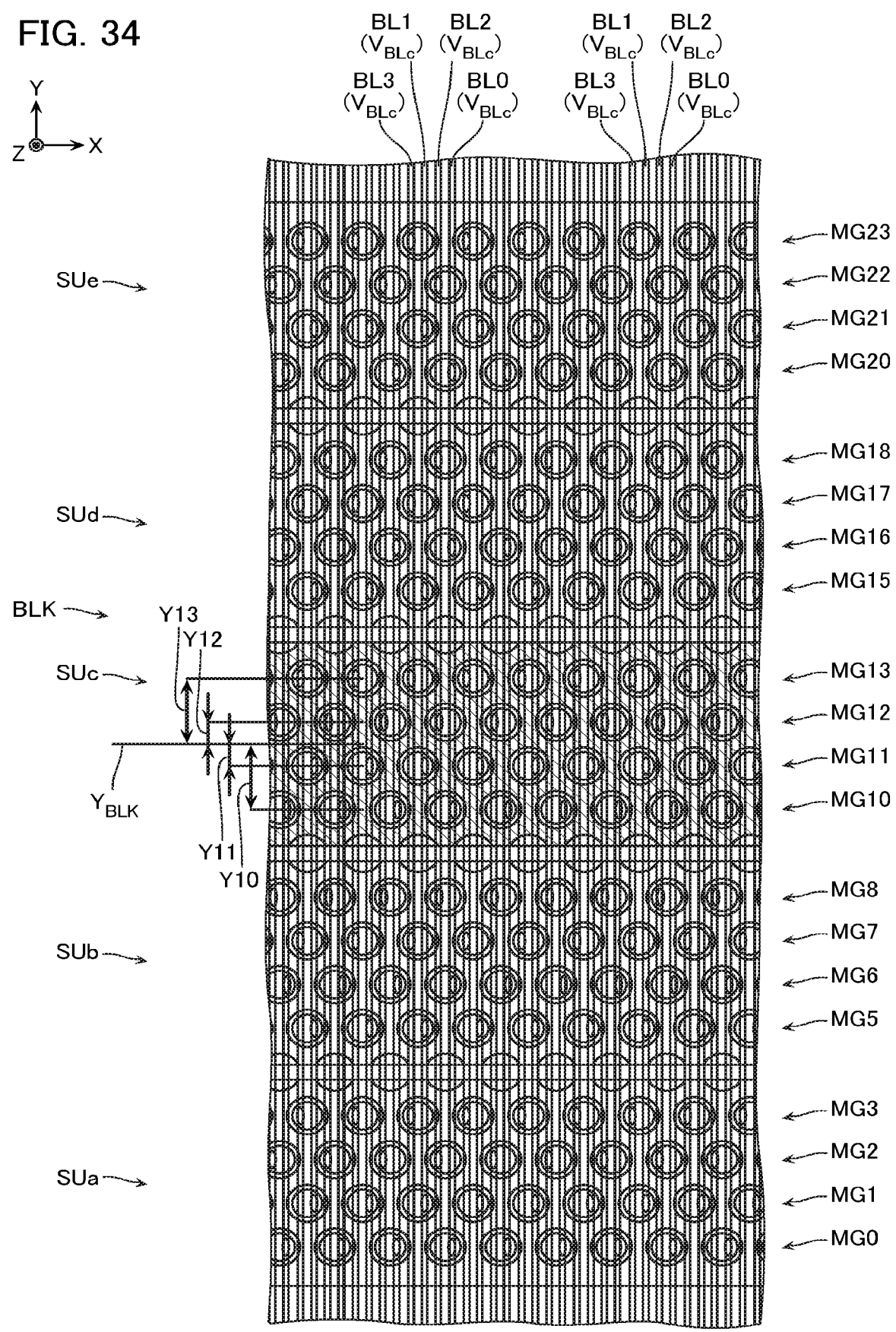
FIG. 34 is a schematic plan view for describing the read operation according to the fourth embodiment.

Next, with reference to FIG. 33 and FIG. 34, the semiconductor memory device according to a fourth embodiment will be described. FIG. 33 and FIG. 34 are schematic plan views for describing a read operation according to the fourth embodiment.

In the semiconductor memory devices according to the first embodiment to the third embodiment, 20 patterns of control parameters corresponding to 20 memory groups MG0 to MG3, MG5 to MG8, MG10 to MG13, MG15 to MG18, and MG20 to MG23 are used. However, such a method is merely an example, and the same control parameter may control two or more memory groups MG. The memory groups MG controlled by the same control parameter are appropriately selectable. It is described below that the example in which a common control parameter is used for four memory groups MG corresponding to the same string unit SU.

For example, the semiconductor memory device according to the fourth embodiment is basically configured similarly to the semiconductor memory device according to the first embodiment. However, the semiconductor memory device according to the fourth embodiment may include the variable resistor module VRM or may be without the variable resistor module VRM.

FIG. 33 is a schematic plan view for describing a case where the read operation is executed on the selected page PG corresponding to the string unit SUe. In the example in FIG. 33, in the read operation on the selected page PG, the voltages of all the bit lines BL are assumed to be $V_{BLe}$. The same sense time is set for all the bit lines BL.

FIG. 34 is a schematic plan view for describing a case where the read operation is executed on the selected page PG corresponding to the string unit SUc. In the example in FIG. 34, in the read operation on the selected page PG, the voltages of all the bit lines BL are assumed to be $V_{BLe}$. The same sense time is set for all the bit lines BL. Here, the voltage $V_{BLe}$ is smaller than the voltage $V_{BLe}$.

Similarly, for example, the voltage of the bit line BL when the read operation is executed on the string unit SUa may be smaller than the voltage of the bit line BL when the read operation is executed on the string unit SUb. The voltage of the bit line BL when the read operation is executed on the string unit SUb may be smaller than the voltage $V_{BLc}$ of the bit line BL when the read operation is executed on the string unit SUc. The voltage $V_{BLc}$ of the bit line BL when the read operation is executed on the string unit SUc may be larger than the voltage of the bit line BL when the read operation is executed on the string unit SUd. The voltage of the bit line BL when the read operation is executed on the string unit SUd may be larger than the voltage $V_{BLe}$ of the bit line BL when the read operation is executed on the string unit SUe.

As described above, in order to reduce the influence of variation of the above-described contact resistance, the control parameter other than the voltage of the bit line BL can also be adjusted.

For example, the sense time when the read operation is executed on the string unit SUa may be shorter than the sense time when the read operation is executed on the string unit SUb. The sense time when the read operation is executed on the string unit SUb may be shorter than the sense time when the read operation is executed on the string unit SUc. The sense time when the read operation is executed on the string unit SUc may be longer than the sense time when the read operation is executed on the string unit SUd. The sense time when the read operation is executed on the string unit SUd may be longer than the sense time when the read operation is executed on the string unit SUe.

Fifth Embodiment

Figure 35:
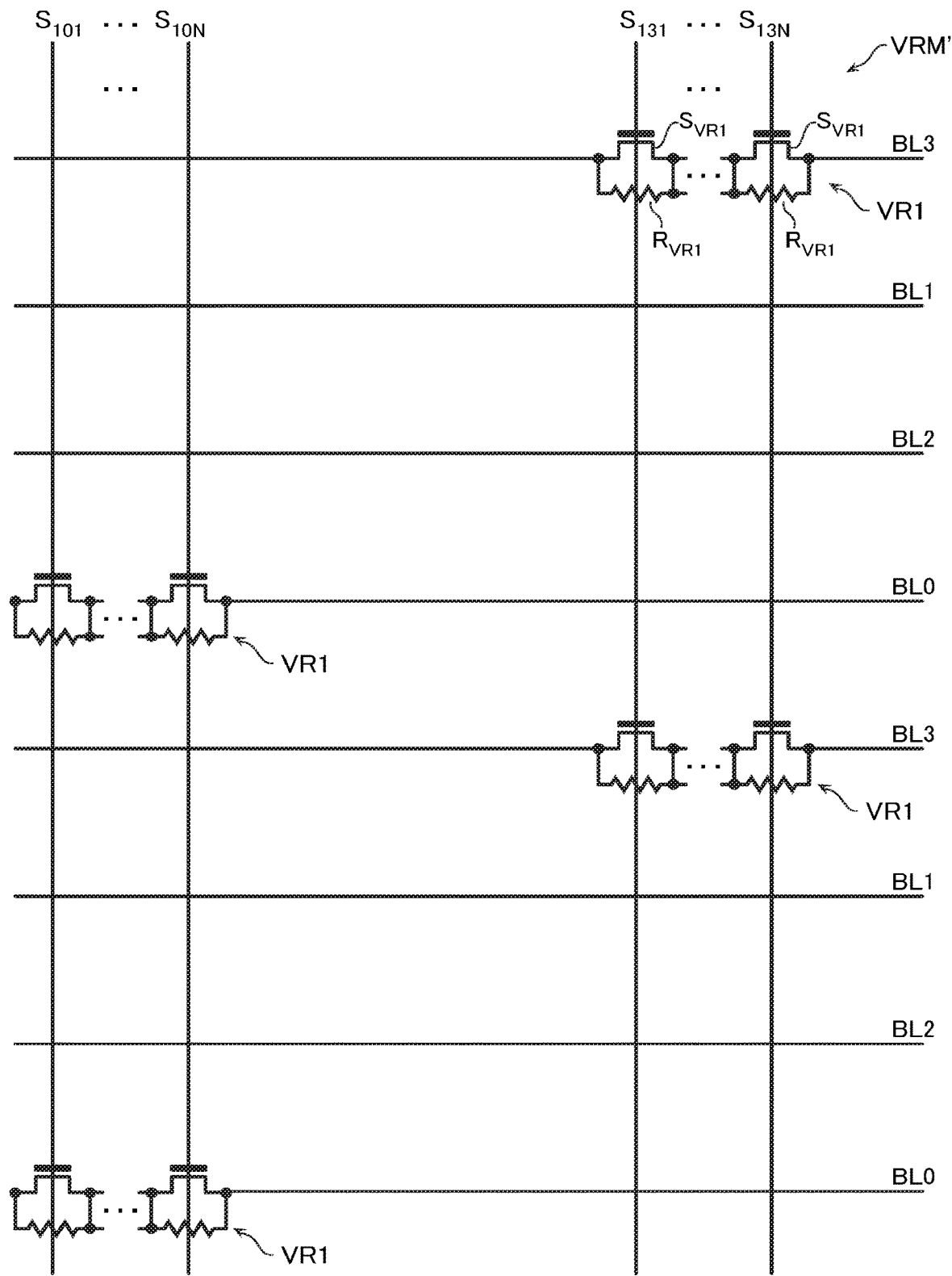
FIG. 35 is a schematic circuit diagram illustrating a configuration of a part of a semiconductor memory device according to a fifth embodiment.
Figure 36:
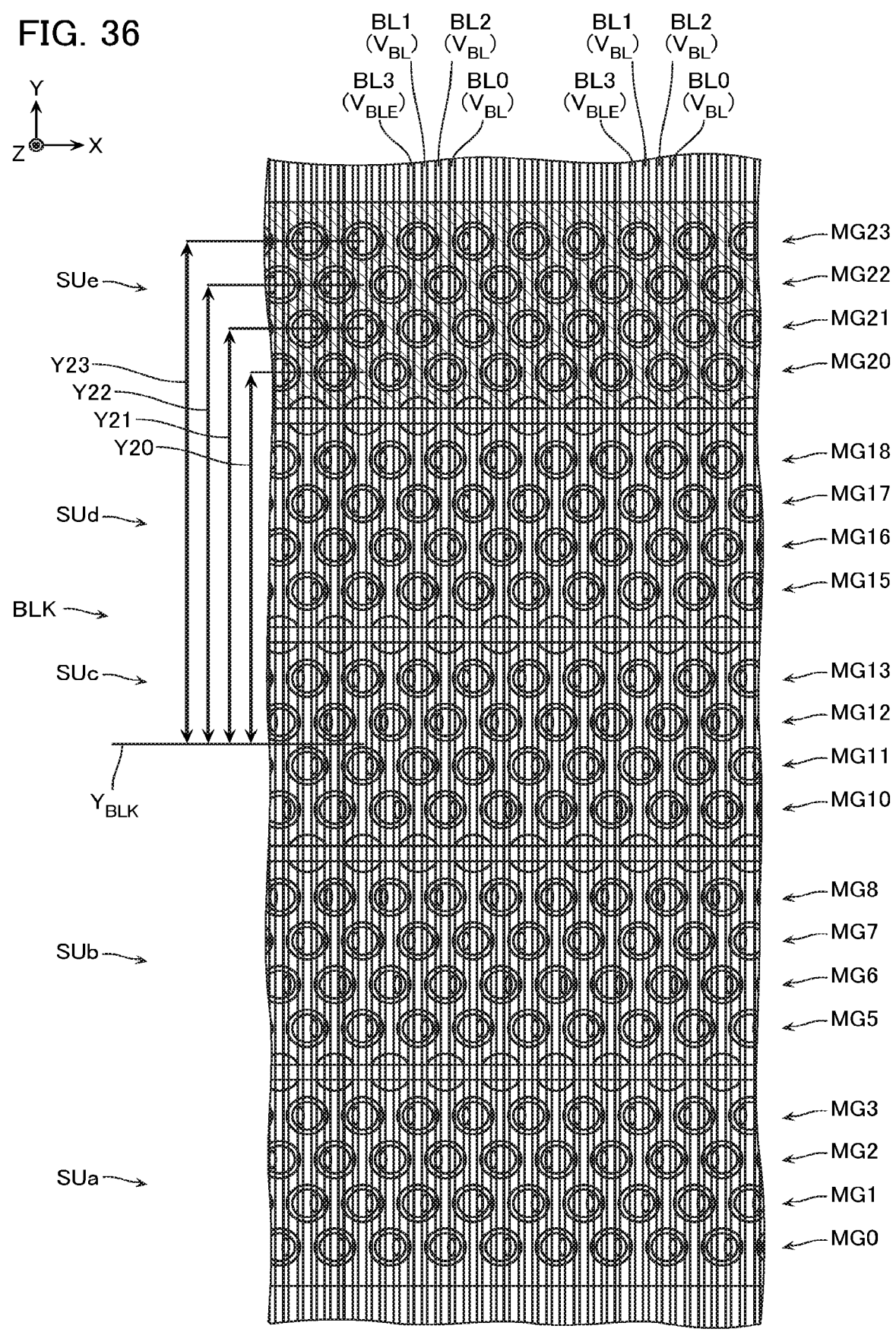
FIG. 36 is a schematic plan view for describing a read operation according to the fifth embodiment.
Figure 37:
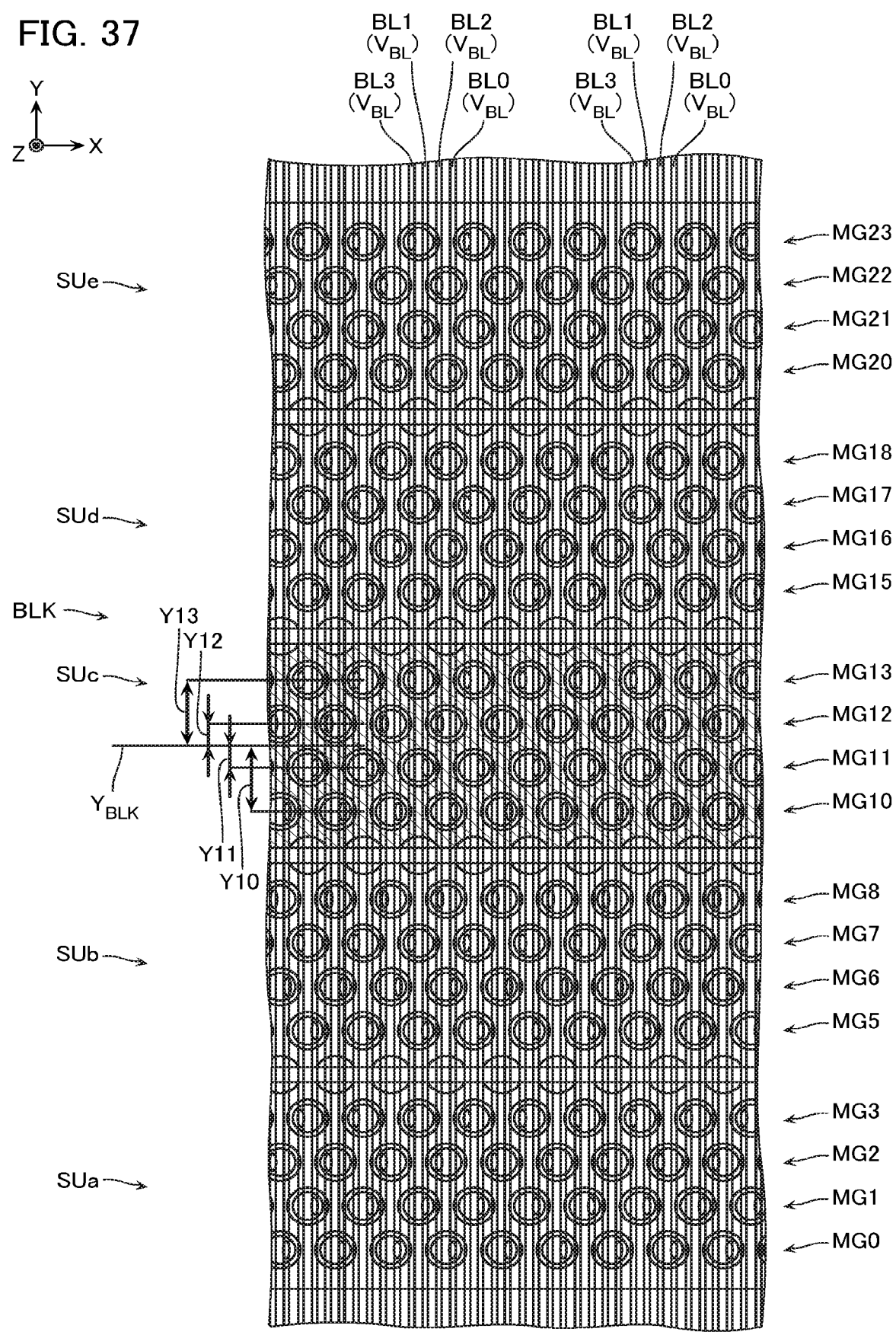
FIG. 37 is a schematic plan view for describing the read operation according to the fifth embodiment.

Next, with reference to FIG. 35 to FIG. 37, a semiconductor memory device according to a fifth embodiment will be described. FIG. 35 is a schematic circuit diagram illustrating a configuration of a part of the semiconductor memory device according to the fifth embodiment. FIG. 36 and FIG. 37 are schematic plan views for describing a read operation according to the fifth embodiment.

As described above, the memory groups MG controlled by the same control parameter are appropriately selectable. Here, in the semiconductor memory device manufactured in the method exemplarily illustrated in FIG. 16 to FIG. 18, the differences between the contact resistances in the memory groups MG0, MG23 and the contact resistances in the other memory groups MG1 to MG3, MG5 to MG8, MG10 to MG13, MG15 to MG18, and MG20 to MG22 become comparatively large in some cases. In such a case, for example, it is possible to differentiate the control parameter corresponding to the memory groups MG0, MG23 from the control parameter corresponding to the other memory groups MG.

For example, the semiconductor memory device according to the fifth embodiment is basically configured similarly to the semiconductor memory device according to the first embodiment. However, the semiconductor memory device according to the fifth embodiment includes a variable resistor module VRM' instead of the variable resistor module VRM.

The variable resistor module VRM' according to the embodiment is basically configured similarly to the variable resistor module VRM according to the first embodiment. However, in the variable resistor module VRM according to the first embodiment, the respective variable resistor circuits VR are disposed between the bit line BL0 and the sense amplifier SA, between the bit line BL1 and the sense amplifier SA, between the bit line BL2 and the sense amplifier SA, and between the bit line BL3 and the sense amplifier SA. On the other hand, while in the variable resistor module VRM' according to the fifth embodiment, the variable resistor circuits VR are disposed between the bit line BL0 and the sense amplifier SA and between the bit line BL3 and the sense amplifier SA, the variable resistor circuit VR is not disposed between the bit line BL1 and the sense amplifier SA or between the bit line BL2 and the sense amplifier SA.

FIG. 36 is a schematic plan view for describing a case where the read operation is executed on the selected page PG corresponding to the string unit SUe. In the example in FIG. 36, in the read operation on the selected page PG, the voltages of the bit lines BL0 to BL2 are assumed to be a voltage $V_{BL}$. The voltage of the bit line BL3 is assumed to be a voltage $V_{BLE}$. The same sense time is set for all the bit lines BL. Here, the voltage $V_{BLE}$ is smaller than the voltage $V_{BL}$.

FIG. 37 is a schematic plan view for describing a case where the read operation is executed on the selected page PG corresponding to the string unit SUc. In the example in FIG. 37, in the read operation on the selected page PG, the voltage of all the bit lines BL is assumed to be $V_{BL}$. The same sense time is set for all the bit lines BL.

While the illustration is omitted, when the read operation is executed on the selected page PG corresponding to the string unit SUa, the voltage of the bit line BL0 is assumed to be the voltage $V_{BLE}$ and the voltages of the bit lines BL1 to BL3 are assumed to be the voltage $V_{DL}$. When the read operation is executed on the selected page PG corresponding to the string units SUb and SUd, the voltages of all the bit lines BL are assumed to be $V_{BL}$.

Note that the variable resistor module VRM' illustrated in FIG. 35 includes the variable resistor circuit VR1 similarly to the variable resistor module VRM1 (FIG. 25). However, such a configuration is merely an example, and the specific aspect is appropriately adjustable. For example, the variable resistor module VRM' may include the variable resistor circuit VR2 similarly to the variable resistor module VRM2 (FIG. 26). The variable resistor module VRM' may include the variable resistor circuit VR3 similarly to the variable resistor module VRM3 (FIG. 27). The variable resistor module VRM' may use the clamp transistor 44 as the variable resistor circuit VR similarly to the variable resistor module VRM4 (FIG. 28). The variable resistor module VRM' may use the charge transistor 49 as the variable resistor circuit VR similarly to the variable resistor module VRM5 (FIG. 29).

The fifth embodiment illustrates the example in which the voltage of the bit line BL is controlled using the variable resistor module VRM'. However, in the fifth embodiment, for example, similarly to the semiconductor memory device according to the second embodiment, the voltage of the bit line BL may be controlled without using the variable resistor module VRM.

The fifth embodiment also illustrates the example in which the voltage of the bit line BL is adjusted for reducing the influence of variation of the above-described contact resistance. However, in the fifth embodiment, it is possible to adjust the control parameter other than the voltage of the bit line BL in order to reduce the influence of variation of the above-described contact resistance.

Other Embodiments

The semiconductor memory devices according to the first embodiment to the fifth embodiment have been described above. However, the semiconductor memory devices according to these embodiments are merely examples, and the specific configurations, operations, and the like are appropriately adjustable.

For example, in the semiconductor memory devices according to the first embodiment to the fifth embodiment, the memory block BLK includes the five string units SUa to SUe. However, such a configuration is merely an example, and the number of the string units SU included in the memory block BLK is appropriately adjustable.

In the semiconductor memory devices according to the first embodiment to the fifth embodiment, each of the string units SU includes the four memory groups MG. However, such a configuration is merely an example, and the number of the memory groups MG included in the string unit SU is appropriately adjustable.

In the semiconductor memory devices according to the first embodiment to the fifth embodiment, the voltage of the bit line BL and the sense time $T_{SEN}$ are exemplarily illustrated as the control parameters. However, such an aspect is merely an example, and another control parameter can be adjusted. As such a control parameter, for example, it is possible to adjust an electrostatic capacity (hereinafter referred to as an "electrostatic capacity of the bit line BL and the like") of the bit line BL or a wiring electrically connected to the bit line BL. The wiring electrically connected to the bit line BL are considered to be, for example, a wiring disposed in a current path between the bit line BL and the sense node SEN or a wiring disposed in a current path between the bit line BL and the voltage supply line to which the voltage $V_{DD}$ is supplied.

Figure 38:
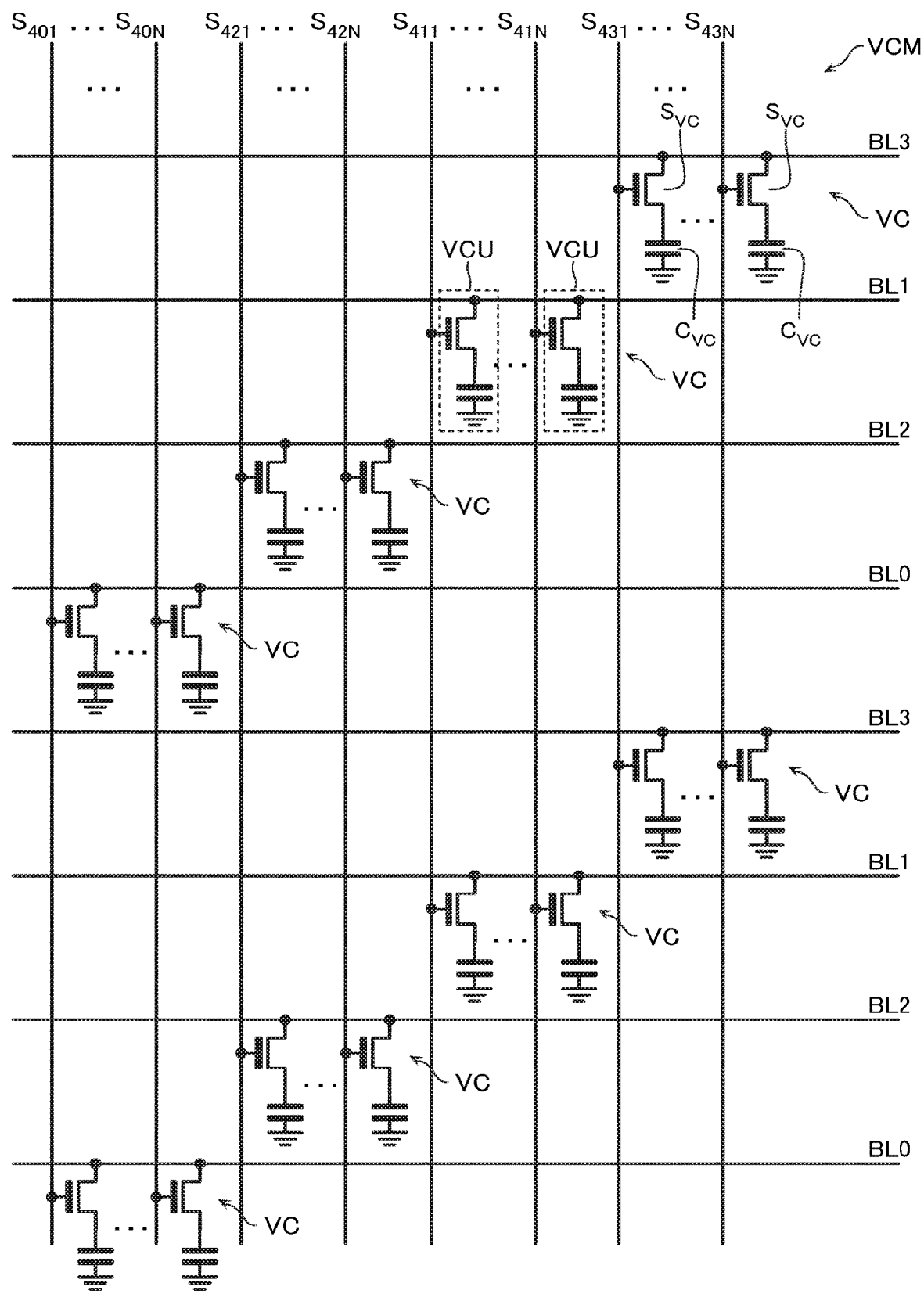
FIG. 38 is a schematic circuit diagram illustrating a configuration of a part of a semiconductor memory device according to another embodiment.

When the electrostatic capacity of the bit line BL and the like is adjusted, for example, it is possible to use the variable capacitor module VCM as exemplarily illustrated in FIG. 38.

FIG. 38 is a schematic circuit diagram illustrating a configuration of a part of the semiconductor memory device according to another embodiment. The variable capacitor module VCM exemplarily illustrated in FIG. 38 includes a plurality of variable capacitor circuits VC. The plurality of variable capacitor circuits VC include the plurality of respective variable capacitor units VCU electrically connected to the bit lines BL. The plurality of variable capacitor units VCU include respective transistors $S_{VC}$ and capacitance elements $C_{VC}$. The transistor $S_{VC}$ has a drain electrode electrically connected to the bit line BL and the sense amplifier module SAM (FIG. 1). The transistor $S_{VC}$ has a source electrode electrically connected to one electrode of the capacitance element $C_{VC}$. The capacitance element $C_{VC}$ has the other electrode grounded. Note that a plurality of the capacitance elements $C_{VC}$ included in each of the variable capacitor circuits VC may each have a different capacitance value.

The variable capacitor module VCM exemplarily illustrated in FIG. 38 includes a plurality of signal lines $S_{401}$ to $S_{40N}$, $S_{411}$ to $S_{41N}$, $S_{421}$ to $S_{42N}$, and $S_{431}$ to $S_{43N}$.

The signal lines $S_{401}$ to $S_{40N}$ are connected to the plurality of variable capacitor circuits VC corresponding to the plurality of bit lines BL0 in common. The gate electrodes of the plurality of transistors $S_{VC}$ included in such a variable capacitor circuit VC are each connected to any of the plurality of signal lines $S_{401}$ to $S_{40N}$.

The signal lines $S_{411}$ to $S_{41N}$ are connected to the plurality of variable capacitor circuits VC corresponding to the plurality of bit lines BL1 in common. The gate electrodes of the plurality of transistors $S_{VC}$ included in such a variable capacitor circuit VC are each connected to any of the plurality of signal lines $S_{411}$ to $S_{41N}$.

The signal lines $S_{421}$ to $S_{42N}$ are connected to the plurality of variable capacitor circuits VC corresponding to the plurality of bit lines BL2 in common. The gate electrodes of the plurality of transistors $S_{VC}$ included in such a variable capacitor circuit VC are each connected to any of the plurality of signal lines $S_{421}$ to $S_{42N}$.

The signal lines $S_{431}$ to $S_{43N}$ are connected to the plurality of variable capacitor circuits VC corresponding to the plurality of bit lines BL3 in common. The gate electrodes of the plurality of transistors $S_{VC}$ included in such a variable capacitor circuit VC are each connected to any of the plurality of signal lines $S_{431}$ to $S_{43N}$.

Note that the configuration illustrated in FIG. 38 is merely an example, and the specific configuration of the variable capacitor module VCM is appropriately adjustable.

In the above description, the example in which only one of the voltage of the bit line BL, the sense time $T_{SEN}$, and the electrostatic capacity of the bit line BL and the like is controlled as the control parameter has been described. However, such a method is merely an example, and the specific method is appropriately adjustable. For example, two or more control parameters are also controllable. The circuits exemplarily illustrated in the above-described description can be appropriately combined and used.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of conductive layers that are arranged in a first direction and include a first conductive layer;
a first semiconductor layer that extends in the first direction and is opposed to the plurality of conductive layers;
a first electric charge accumulating portion disposed between the first conductive layer and the first semiconductor layer;
a second semiconductor layer that extends in the first direction and is opposed to the plurality of conductive layers;
a second electric charge accumulating portion disposed between the first conductive layer and the second semiconductor layer;
a first bit line that extends in a second direction intersecting with the first direction and is electrically connected to the first semiconductor layer; and
a second bit line that extends in the second direction and is electrically connected to the second semiconductor layer, wherein
a distance from a center position in the second direction of the first conductive layer to the first semiconductor layer is assumed to be a first distance, and
a distance from the center position in the second direction of the first conductive layer to the second semiconductor layer is assumed to be a second distance,
the second distance is smaller than the first distance, and
when a read operation is executed on a first memory cell including the first electric charge accumulating portion and a second memory cell including the second electric charge accumulating portion,
a voltage of the first bit line is assumed to be a first voltage, and
a voltage of the second bit line is assumed to be a second voltage,
the second voltage is larger than the first voltage.

2. The semiconductor memory device according to claim 1, further comprising:
a third semiconductor layer that extends in the first direction and is opposed to the plurality of conductive layers;
a third electric charge accumulating portion disposed between the first conductive layer and the third semiconductor layer; and
a third bit line that extends in the second direction and is electrically connected to the third semiconductor layer, wherein
a distance from the center position in the second direction of the first conductive layer to the third semiconductor layer is assumed to be a third distance,
the third distance is smaller than the second distance, and
a voltage of the third bit line when the read operation is executed on the first memory cell, the second memory cell, and a third memory cell including the third electric charge accumulating portion is assumed to be a third voltage,
the third voltage is larger than the first voltage.

3. The semiconductor memory device according to claim 2, wherein
the third voltage is larger than the second voltage.

4. The semiconductor memory device according to claim 1, further comprising
a variable resistor circuit or a variable capacitor circuit electrically connected to each of the first bit line and the second bit line.

5. The semiconductor memory device according to claim 1 further comprising:
a first stacked film that includes the first electric charge accumulating portion and extends in the first direction along an outer peripheral surface of the first semiconductor layer;
a second stacked film that includes the second electric charge accumulating portion and extends in the first direction along an outer peripheral surface of the second semiconductor layer; and
a second conductive layer connected to the first semiconductor layer and the second semiconductor layer, wherein
the first stacked film includes a first part and a second part respectively positioned on one side and on the other side in the first direction of a connecting portion between the second conductive layer and the first semiconductor layer,
the second stacked film includes a third part and a fourth part respectively positioned on one side and on the other side in the first direction of a connecting portion between the second conductive layer and the second semiconductor layer, and
a distance in the first direction between the first part and the second part is larger than a distance in the first direction between the third part and the fourth part.

6. A semiconductor memory device comprising:
a plurality of conductive layers that are arranged in a first direction and include a first conductive layer;
a first semiconductor layer that extends in the first direction and is opposed to the plurality of conductive layers;
a first electric charge accumulating portion disposed between the first conductive layer and the first semiconductor layer;
a second semiconductor layer that extends in the first direction and is opposed to the plurality of conductive layers;
a second electric charge accumulating portion disposed between the first conductive layer and the second semiconductor layer; and
a first bit line that extends in a second direction intersecting with the first direction and is electrically connected to the first semiconductor layer and the second semiconductor layer, wherein
a distance from a center position in the second direction of the first conductive layer to the first semiconductor layer is assumed to be a first distance, and
a distance from the center position in the second direction of the first conductive layer to the second semiconductor layer is assumed to be a second distance,
the second distance is smaller than the first distance, and
a voltage of the first bit line when a read operation is executed on a first memory cell including the first electric charge accumulating portion is assumed to be a first voltage, and
a voltage of the first bit line when the read operation is executed on a second memory cell including the second electric charge accumulating portion is assumed to be a second voltage,
the second voltage is larger than the first voltage.

7. The semiconductor memory device according to claim 6, further comprising:
a third semiconductor layer that extends in the first direction and is opposed to the plurality of conductive layers; and a third electric charge accumulating portion disposed between the first conductive layer and the third semiconductor layer, wherein
the first bit line is electrically connected to the third semiconductor layer,
a distance from the center position in the second direction of the first conductive layer to the third semiconductor layer is assumed to be a third distance,
the third distance is smaller than the second distance, and
a voltage of the first bit line when the read operation is executed on a third memory cell including the third electric charge accumulating portion is assumed to be a third voltage,
the third voltage is larger than the first voltage.

8. The semiconductor memory device according to claim 7, wherein
the third voltage is larger than the second voltage.

9. The semiconductor memory device according to claim 7, wherein
the third voltage is equal to the second voltage.

10. The semiconductor memory device according to claim 6, further comprising:
a fourth semiconductor layer that extends in the first direction and is opposed to the plurality of conductive layers;
a fourth electric charge accumulating portion disposed between the first conductive layer and the fourth semiconductor layer; and
a second bit line that extends in the second direction and is electrically connected to the fourth semiconductor layer, wherein
a distance from the center position in the second direction of the first conductive layer to the fourth semiconductor layer is assumed to be a fourth distance,
the fourth distance is smaller than the first distance and is larger than the second distance, and
a voltage of the second bit line when the read operation is executed on the first memory cell and a fourth memory cell including the fourth electric charge accumulating portion is assumed to be a fourth voltage,
the fourth voltage is larger than the first voltage.

11. The semiconductor memory device according to claim 10, wherein
the fourth voltage is smaller than the second voltage.

12. The semiconductor memory device according to claim 6, further comprising
a variable resistor circuit or a variable capacitor circuit electrically connected to the first bit line.

13. The semiconductor memory device according to claim 6, further comprising:
a first stacked film that includes the first electric charge accumulating portion and extends in the first direction along an outer peripheral surface of the first semiconductor layer;
a second stacked film that includes the second electric charge accumulating portion and extends in the first direction along an outer peripheral surface of the second semiconductor layer; and
a second conductive layer connected to the first semiconductor layer and the second semiconductor layer, wherein
the first stacked film includes a first part and a second part respectively positioned on one side and the other side in the first direction of a connecting portion between the second conductive layer and the first semiconductor layer,
the second stacked film includes a third part and a fourth part respectively positioned on one side and the other side in the first direction of a connecting portion between the second conductive layer and the second semiconductor layer, and
a distance in the first direction between the first part and the second part is larger than a distance in the first direction between the third part and the fourth part.

14. A semiconductor memory device comprising:
a plurality of conductive layers that are arranged in a first direction and include a first conductive layer;
a first semiconductor layer that extends in the first direction and is opposed to the plurality of conductive layers;
a first electric charge accumulating portion disposed between the first conductive layer and the first semiconductor layer;
a second semiconductor layer that extends in the first direction and is opposed to the plurality of conductive layers;
a second electric charge accumulating portion disposed between the first conductive layer and the second semiconductor layer; and
a first bit line that extends in a second direction intersecting with the first direction and is electrically connected to the first semiconductor layer, wherein
a distance from a center position in the second direction of the first conductive layer to the first semiconductor layer is assumed to be a first distance, and
a distance from the center position in the second direction of the first conductive layer to the second semiconductor layer is assumed to be a second distance,
the second distance is smaller than the first distance, and
a sense time of a bit line sense when a read operation is executed on a first memory cell including the first electric charge accumulating portion is assumed to be a first sense time, and
a sense time of the bit line sense when the read operation is executed on a second memory cell including the second electric charge accumulating portion is assumed to be a second sense time,
the second sense time is longer than the first sense time.

15. The semiconductor memory device according to claim 14, further comprising
a second bit line that extends in the second direction, wherein
the second semiconductor layer is electrically connected to the first bit line or the second bit line.

16. The semiconductor memory device according to claim 14, further comprising:
a third semiconductor layer that extends in the first direction and is opposed to the plurality of conductive layers; and
a third electric charge accumulating portion disposed between the first conductive layer and the third semiconductor layer, wherein
a distance from the center position in the second direction of the first conductive layer to the third semiconductor layer is assumed to be a third distance,
the third distance is smaller than the second distance, and
a sense time of the bit line sense when the read operation is executed on a third memory cell including the third electric charge accumulating portion is assumed to be a third sense time,
the third sense time is longer than the first sense time.

17. The semiconductor memory device according to claim 16, wherein
the third sense time is longer than the second sense time.

18. The semiconductor memory device according to claim 16, wherein
the third sense time is equal to the second sense time.

19. The semiconductor memory device according to claim 14, further comprising
a variable resistor circuit or a variable capacitor circuit electrically connected to the first bit line.

20. The semiconductor memory device according to claim 14, further comprising:
a first stacked film that includes the first electric charge accumulating portion and extends in the first direction along an outer peripheral surface of the first semiconductor layer;
a second stacked film that includes the second electric charge accumulating portion and extends in the first direction along an outer peripheral surface of the second semiconductor layer; and
a second conductive layer connected to the first semiconductor layer and the second semiconductor layer, wherein
the first stacked film includes a first part and a second part respectively positioned on one side and the other side in the first direction of a connecting portion between the second conductive layer and the first semiconductor layer,
the second stacked film includes a third part and a fourth part respectively positioned on one side and the other side in the first direction of a connecting portion between the second conductive layer and the second semiconductor layer, and
a distance in the first direction between the first part and the second part is larger than a distance in the first direction between the third part and the fourth part.

* * * * *